(12) United States Patent
Kawamoto et al.

(10) Patent No.: US 7,737,792 B2
(45) Date of Patent: Jun. 15, 2010

(54) PHASE LOCKED LOOP CIRCUIT AND SEMICONDUCTOR INTEGRATED CIRCUIT DEVICE USING THE SAME

(75) Inventors: Takashi Kawamoto, Kokubunji (JP); Masaru Kokubo, Foster, CA (US)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/362,486

(22) Filed: Jan. 29, 2009

(65) Prior Publication Data

US 2009/0153204 A1 Jun. 18, 2009

Related U.S. Application Data

(62) Division of application No. 11/488,866, filed on Jul. 19, 2006, now Pat. No. 7,504,894.

(30) Foreign Application Priority Data

Aug. 8, 2005 (JP) ............................. 2005-229387

(51) Int. Cl.
   *H03L 7/08* (2006.01)
(52) U.S. Cl. ............................. 331/10; 331/11; 331/14; 331/16; 331/44; 327/156
(58) Field of Classification Search .................. 331/10, 331/11, 14, 16, 44; 327/156
   See application file for complete search history.

(56) References Cited

U.S. PATENT DOCUMENTS 6,870,411 B2 3/2005 Shibahara et al.
7,064,621 B2 6/2006 Nakanishi
7,148,764 B2 12/2006 Kasahara et al.
7,155,188 B2 12/2006 Noboru et al.

FOREIGN PATENT DOCUMENTS

| JP | 6-152401 | 5/1994 |
|---|---|---|
| JP | 11-289250 | 10/1999 |
| JP | 2000-49597 | 2/2000 |
| JP | 2003-78410 | 3/2003 |

*Primary Examiner*—Robert Pascal
*Assistant Examiner*—Levi Gannon
(74) *Attorney, Agent, or Firm*—Miles & Stockbridge P.C.

(57) ABSTRACT

To provide a phase locked loop circuit that is capable of performing an automatic adjustment that satisfies a desired characteristic not depending on a process variation and an environmental variation. The phase locked loop circuit has a phase frequency comparator, a charge pump, a loop filter, a frequency divider, a selector, and a voltage controlled oscillator. The frequency divider inputs an output signal and a reference signal, divides the output signal, and outputs a feedback signal, and also outputs a select signal, a trimming signal, and a limit signal from the output signal. The voltage controlled oscillator inputs the control voltage, the base voltage, the trimming signal, and the limit signal, changes the output signal frequency according to the control voltage so as to limit the upper limit frequency of the output signal. Also, the voltage controlled oscillator is capable of changing the frequency sensitivity of the output signal that is outputted with respect to the control voltage according to the trimming signal, and the upper limit frequency of the output signal according to the limit signal.

5 Claims, 44 Drawing Sheets

PHASE LOCKED LOOP CIRCUIT AND SEMICONDUCTOR INTEGRATED CIRCUIT DEVICE USING THE SAME

CROSS-REFERENCE TO RELATED APPLICATION

This application is a divisional of application Ser. No. 11/488,866 filed Jul. 19, 2006 now U.S. Pat. No. 7,504,894. The present application also claims priority from Japanese application JP 2005-229387 filed on Aug. 8, 2005, the content of which is hereby incorporated by reference into this application.

CLAIM OF PRIORITY

The present application claims priority from Japanese application JP 2005-229387 filed on Aug. 8, 2005, the content of which is hereby incorporated by reference into this application.

FIELD OF THE INVENTION

The present invention relates to a phase locked loop circuit and a semiconductor integrated circuit device using the same, and more particularly to a semiconductor integrated circuit device that is used for a recording and reproduction device or an interface device.

BACKGROUND OF THE INVENTION

In general, a semiconductor integrated circuit device has a phase locked loop circuit (PLL) installed therein for the purpose of generating a processing clock of a logic circuit, or generating a transmit signal clock. The phase locked loop circuit (PLL) that is installed in the semiconductor integrated circuit device includes an analog circuit (in particular, a voltage controlled oscillator (VCO)), and a calibration technique that automatically adjusts so that the PLL satisfies a desired characteristic has been known. For example, Japanese Patent Laid-Open No. 2000-49597, Japanese Patent Laid-Open No. H06-152401, and Japanese Patent Laid-Open No. 2003-78410 disclose the calibration technique of the PLL.

SUMMARY OF THE INVENTION

The PLL has been required to provide the calibration function semiconductor integrated circuit device that is capable of conducting an adjustment before shipping of products so as to satisfy a desired characteristic.

Also, the phase locked loop circuit (PLL) that is installed in the recording and reproduction device is installed in a drive and generates a clock that determines an access speed in an access to the recording medium such as HDD/CD/DVD/BD (Blu-ray Disk), and generates a clock that determines a transmission speed in a transmission between the semiconductor integrated circuit device and a host PC. Further, the phase locked loop circuit that generates the clock is used in an interface device for connecting a recording medium such as an optical disk device or a hard disk device to a computer such as a personal computer.

The semiconductor integrated circuit board of this type has been required to provide the calibration function that is capable of conducting the adjustment before shipping products so that the phase locked loop circuit in the recording or reproduction device or the interface device satisfies the desired characteristic.

In particular, in an analog digital mixed signal processing LSI (hereinafter referred to as "analog digital mixed LSI"), the highest operating frequency of a digital circuit is lower than that of an analog circuit, and the phase locked loop circuit is required to limit the highest operating frequency of the analog circuit.

Incidentally, it is general that the general-purpose analog digital mixed LSI must withstand a variation in the process and an environmental variation in order that the general-purpose analog digital mixed LSI is manufactured in a mass production process. In particular, a PLL is installed in the analog digital mixed LSI for the purposes of generating the processing clock of the logic circuit and generating the transmit signal clock. The analog circuit (in particular, VCO) has the characteristic greatly changed according to the variation in the process. In particular, in the case where the variation in the process such as a minute process is large, or in the case where there is assumed a use environment under which a change in temperature is large such as a case in which the general-purpose analog digital mixed LSI is used as a vehicle component, the VCO may not satisfy the desired characteristic in the same design. Under the circumstances, there is applied the calibration technique that automatically conducts the adjustment so as to satisfy the desired characteristic before shipping the products.

In the conventional calibration technique, there are a closed loop calibration system that conducts trimming other than a ring VOC as disclosed in Japanese Patent Laid-Open No. 2000-49597 and Japanese Patent Laid-Open No. H6-152401, and an open loop calibration system that conducts trimming within the ring VCO as disclosed in Japanese Patent Laid-Open No. 2003-78410.

First, Japanese Patent Laid-Open No. 2000-49597 adds a calibration circuit that optimizes a current that flows in a control oscillator to the phase locked loop circuit, and sets the oscillating frequency of the control oscillator within a lock range by conducting calibration by the calibration circuit.

Also, the phase locked loop circuit disclosed in Japanese Patent Laid-Open No. H6-152401 has a gain adjuster that adjusts a current that is supplied to the current control oscillator from a voltage-to-current converter, which adjusts the gain of the VCO so as to compensate a manufacturing variation.

Also, in the example of Japanese Patent Laid-Open No. 2003-78410, there is provided an automatic trimming PLL that automatically adjusts the capacity of a delay circuit within a ring VCO. The automatic trimming PLL includes a phase frequency comparator, a charge pump, a low pass filter, a loop filter, a selector that selects a reference voltage (VREF) and the loop filter according to a select signal (S), and a VCO that inputs a control voltage (Vc) and a trimming signal (T), adjusts a frequency characteristic according to a trimming signal, and outputs an oscillating frequency corresponding to the control voltage (Vc). The automatic trimming PLL also includes a frequency divider (DIV) that divides an output frequency of the VCO, outputs a frequency division signal as a feedback signal (Fb), and outputs the select signal and the trimming signal according to a frequency division result. When a power is supplied to the VCO, the selector selects the reference voltage, and the PLL loop becomes an open loop. In this state, the frequency divider counts the output signals of the VCO, and updates the trimming signal according to the count result. When the VCO can satisfy a desired characteristic, the selector 7 selects the loop filter as S=0, and the PLL loop is set to a closed loop to effect a frequency lock.

However, in the conventional calibration technique, in the case where the oscillating frequency becomes high in the speed, when the speed of the oscillating frequency is higher than the highest operating speed of the frequency divider, the PLL may not be locked because the frequency divider cannot operate properly.

In particular, the speed of the oscillating frequency becomes higher than the highest operating speed due to a variation in the manufacture process and the environmental variation with the result that there may occur a situation that the PLL is not locked.

Also, in a semiconductor integrated circuit, a 1/f noise that is attributable to the fine manufacture process becomes large. In particular, in the ring oscillator VCO, the 1/f noise becomes a predominant factor. For that reason, there is required the VCO that reduces the deterioration of a noise characteristic which is caused by the 1/f noise.

Further, there is a case in which attention must be paid to a demand for a reduction in the noise and a shortening of a lockup time in setting the frequency characteristic of the PLL.

The present invention has been made under the above circumstances, and therefore an object of the present invention is to provide a PLL that always outputs a desired frequency characteristic even if there is an influence of a variation in the manufacture process or an environmental variation.

Another object of the present invention is to provide a PLL that is capable of always outputting a desired frequency characteristic and setting a characteristic that takes a reduction in the noises and a lockup time into account.

Still another object of the present invention is to provide an interface device that always outputs a desired frequency characteristic even if there is an influence of a variation in the manufacture process or an environmental variation, and is low in the noise.

Yet still another object of the present invention is to provide a recording and reproduction device that always outputs a desired frequency characteristic even if there is an influence of a variation in the manufacture process or an environmental variation, and is low in the noise.

A representative outline of the present invention described in the present application will be briefly described below.

The phase locked loop circuit according to the present invention includes a phase frequency comparator, a charge pump, a loop filter, a selector, a voltage controlled oscillator, a frequency divider, and an adjustment unit. A reference signal and a feedback signal that is outputted from the frequency divider are compared with each other by the phase frequency comparator and outputted as a phase difference signal. The phase difference signal is inputted as a control voltage to the voltage controlled oscillator through the charge pump, the loop filter, and the selector so that the frequency and the phase of an output signal of the voltage controlled oscillator are controlled to given values. The voltage controlled oscillator is capable of enabling a frequency sensitivity of the output signal and an upper limit frequency of the output signal with respect to the control voltage to be set to arbitrary values. The adjustment unit is capable of adjusting the frequency sensitivity and the upper limit frequency of the output signal of the voltage controlled oscillator according to an adjustment signal.

According to the present invention, there can be provided an inexpensive phase locked loop circuit which automatically adjusts the frequency sensitivity and the upper limit frequency of the VCO, and which satisfies a desired characteristic with respect to signals which are in a wide frequency range from a low frequency to a high frequency even if there occurs a remarkable process variation in a fine process or a variation in the characteristic due to the environmental variation since the VCO can set its upper limit frequency to a value that is lower than the highest operating frequency of the logic circuit.

These and other objects and advantages of this invention will become more fully apparent from the following detailed description taken with the accompanying drawings.

DETAILED DESCRIPTION OF THE PREFERRED EMBODIMENTS

Now, a description will be given in more detail of preferred embodiments of the present invention with reference to the accompanying drawings.

First Embodiment

First, a description will be given of an automatic adjustment phase locked loop circuit (PLL) according to a first embodiment of the present invention with reference to FIGS. 1 to 14.

Figure 1:
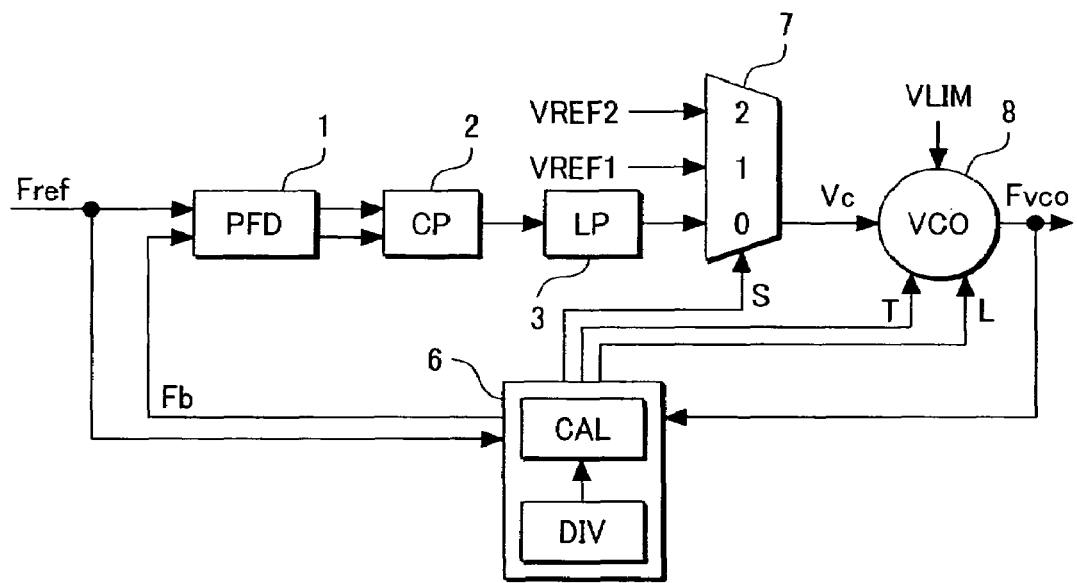
FIG. 1 is a block diagram for explaining an automatic adjustment phase locked loop circuit according to a first embodiment of the present invention.

FIG. 1 is a block diagram for explaining the entire structure of a PLL according to the first embodiment.

The PLL of this embodiment includes a phase frequency comparator 1, a frequency divider 6, a selector 7, and a voltage controlled oscillator (VCO) 8. The phase frequency comparator 1 inputs a reference signal (Fref) and a feedback signal (Fb) to output a phase comparison signal. Reference numeral 2 denotes a charge pump that inputs the phase comparison signal to output a pulse signal, and reference numeral 3 is a loop filter that converts the pulse signal to a DC signal.

The frequency divider 6 includes a frequency division unit (DIV) and a calibration unit (or an adjustment unit, CAL). The frequency division unit (DIV) of the frequency divider 6 has a function of inputting an output signal (Fvco) of the voltage controlled oscillator (VCO) 8 and a reference signal (Fref), dividing the output signal (Fvco), and outputting a feedback signal (Fb). The calibration unit (CAL) has a function of outputting an adjustment signal for calibration, that is, a select signal (S), a trimming signal (T), and a limit signal (L) from the reference signal (Fref) and the feedback signal (Fb).

The frequency division unit (DIV) and the calibration unit (CAL) can be made up of a computer and a program that operates on the computer and executes given arithmetic processing, respectively. Information necessary for the arithmetic processing and an arithmetic result are held in a memory (not shown).

In the description of this embodiment, the frequency division unit (DIV) and the calibration unit (CAL) are integrated into one frequency divider 6. It is needless to say that the frequency divider 6 may be made up of only the frequency division unit (DIV), and the calibration unit (CAL) may be made up of another member, independently, as in another embodiment that will be described later.

The selector 7 selects any one of a DC signal that is outputted from the loop filter 3, a first reference voltage (VREF1), and a second reference voltage (VREF2) according to the select signal (S), and outputs a selected signal as the control voltage (Vc).

The voltage controlled oscillator (VCO) 8 includes a voltage-to-current converter circuit having a limit function, and can automatically trim an upper limit frequency. In other words, the voltage controlled oscillator 8 inputs the control voltage (Vc), a base voltage (VLIM) as well as the trimming signal (T) and the limit signal (L) which are supplied from the frequency divider 6, changes the frequency of the output signal (Fvco) according to the control voltage, and limits the upper limit frequency of the output signal. The voltage controlled oscillator (VCO) 8 is capable of changing the sensitivity of the frequency characteristic of the output signal that is outputted to the control voltage according to the trimming signal, and the upper limit frequency of the output signal (Fvco) according to the limit signal, respectively.

Figure 2:
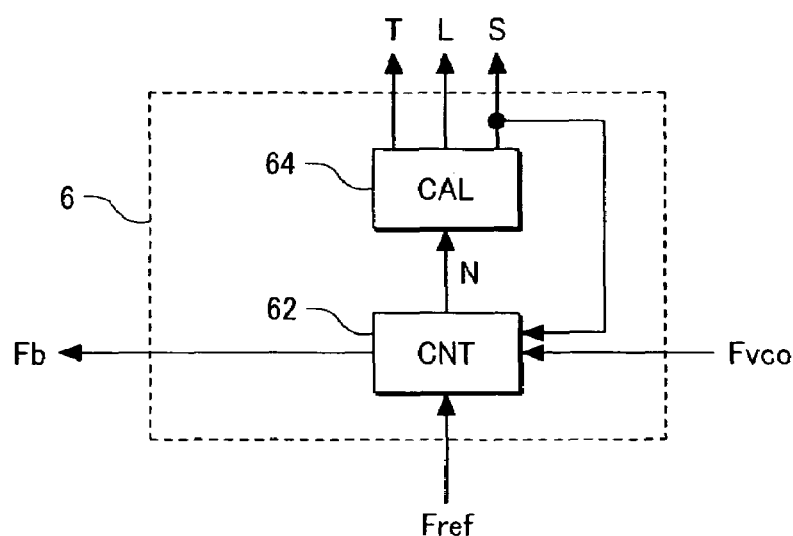
FIG. 2 is a block diagram for explaining a first structural example of a frequency divider that is used in the automatic adjustment phase locked loop circuit shown in FIG. 1.

FIG. 2 shows a first structural example of the frequency divider 6 in the PLL of the present invention. The frequency divider 6 includes a counter 62 corresponding to the frequency division unit (DIV) shown in FIG. 1, and a calibration circuit 64 corresponding to the calibration unit (CAL). The counter 62 inputs the output signal of the VCO 8, the reference signal, and the select signal to output a feedback signal and the count result (N). The calibration circuit 64 inputs the count result, and outputs the select signal, the trimming signal, and the limit signal from the count result.

The counter 62 generates a count interval according to the reference signal, and counts the output signals of the VCO 8 within the generated count interval. The counter 62 outputs the count result to the calibration circuit 64. Also, when the select signal S is S=0, the counter 62 outputs the feedback signal, and does not count the output signals. On the other hand, when the select signal S is S=1, 2, the counter 62 does not output the feedback signal, and counts the output signals.

Figure 3:
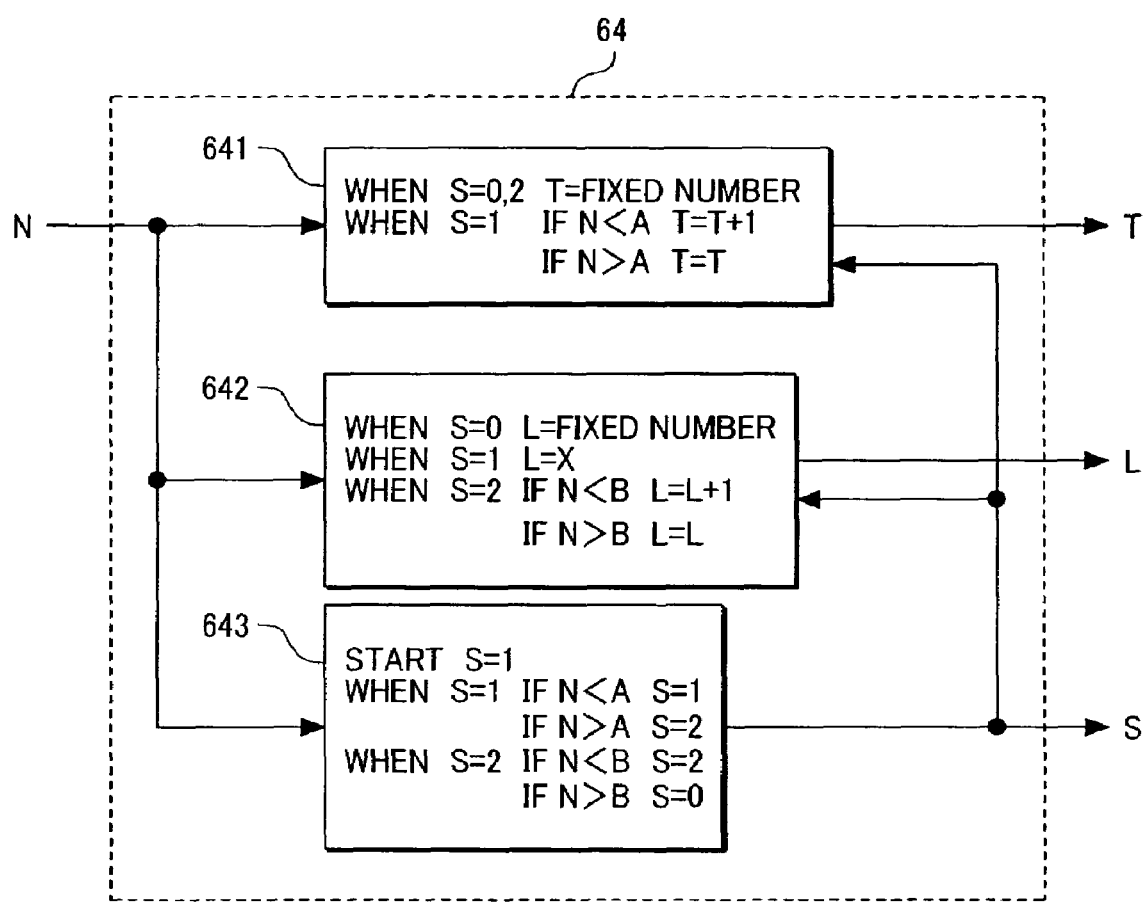
FIG. 3 is a block diagram for explaining a structural example of a calibration circuit that is used in the frequency divider shown in FIG. 2.

FIG. 3 shows a structural example of the calibration circuit 64 shown in FIG. 2. The calibration circuit 64 includes state machines 641, 642, and 643. The state machine 641 determines the trimming signal according to the count result and the select signal. The state machine 642 determines the limit signal according to the count result and the select signal. The state machine 643 determines the select signal according to the count result.

The PLL of this embodiment takes two operating states consisting of a calibration period during which the frequency characteristic of the voltage controlled oscillator (VCO) 8 is adjusted by the calibration circuit 64 of the frequency divider 6, and a PLL convergence period during which the converging operation of the normal PLL is conducted after the VCO 8 has been adjusted.

First, the calibration period will be described. In the calibration period, the determination is repeated until the output signal of the VCO 8 satisfies a given frequency, and the trimming signal and the limit signal are updated. The operation will be described in more detail.

When the calibration starts, the select signal S becomes 1, the frequency divider 6 does not output the feedback signal, and the selector 7 selects the first reference voltage so that the PLL loop becomes an open loop. Also, the selector 7 resets the trimming signal and the limit signal so that the trimming signal T becomes 0, and the limit signal L becomes X, respectively. In this situation, the frequency divider 6 starts to determine the frequency of the output signal.

When the frequency divider 6 determines that the frequency of the output signal is lower than the given frequency, the frequency divider 6 updates the trimming signal, and again determines the frequency of the output signal as T=0. The frequency divider 6 updates the trimming signal until the frequency of the output signal becomes equal to or higher than the given frequency.

After the frequency divider 6 updates the trimming signal, and sets the output signal to the given frequency or higher, the frequency divider 6 updates the select signal as S=2.

In this situation, the selector 7 selects the second reference voltage. Further, the frequency divider 6 sets, as a trimming signal, a value at the time where the frequency of the output signal becomes equal to or higher than the given frequency through the above operation. Also, the frequency divider 6 resets the limit signal L to 0, and comes to a state in which the feedback signal is not outputted. In this state, the frequency divider 6 starts to determine the frequency of the output signal.

When the frequency divider 6 determines that the frequency of the output signal is lower than the given frequency, the frequency divider 6 updates the limit signal, and again determines the frequency of the output signal as L=1. The frequency divider 6 updates the limit signal until the frequency of the output signal becomes equal to or higher than the given frequency.

After the frequency divider 6 updates the limit signal, and sets the output signal to the given frequency or higher, the frequency divider 6 resets the select signal as S=0.

In this situation, the selector 7 selects the loop filter, and the frequency divider 6 sets, as the trimming signal and the limit signal, values at the time where the frequency of the output signal becomes equal to or higher than the given frequency through the above operation. Then, the selector 7 outputs the feedback signal, and sets the PLL loop to the closed loop. In this state, the PLL is shifted to the convergence period.

Subsequently, a description will be given a specific structural example and the VCO 8 that realizes the above operation, and its operation.

Figure 4:
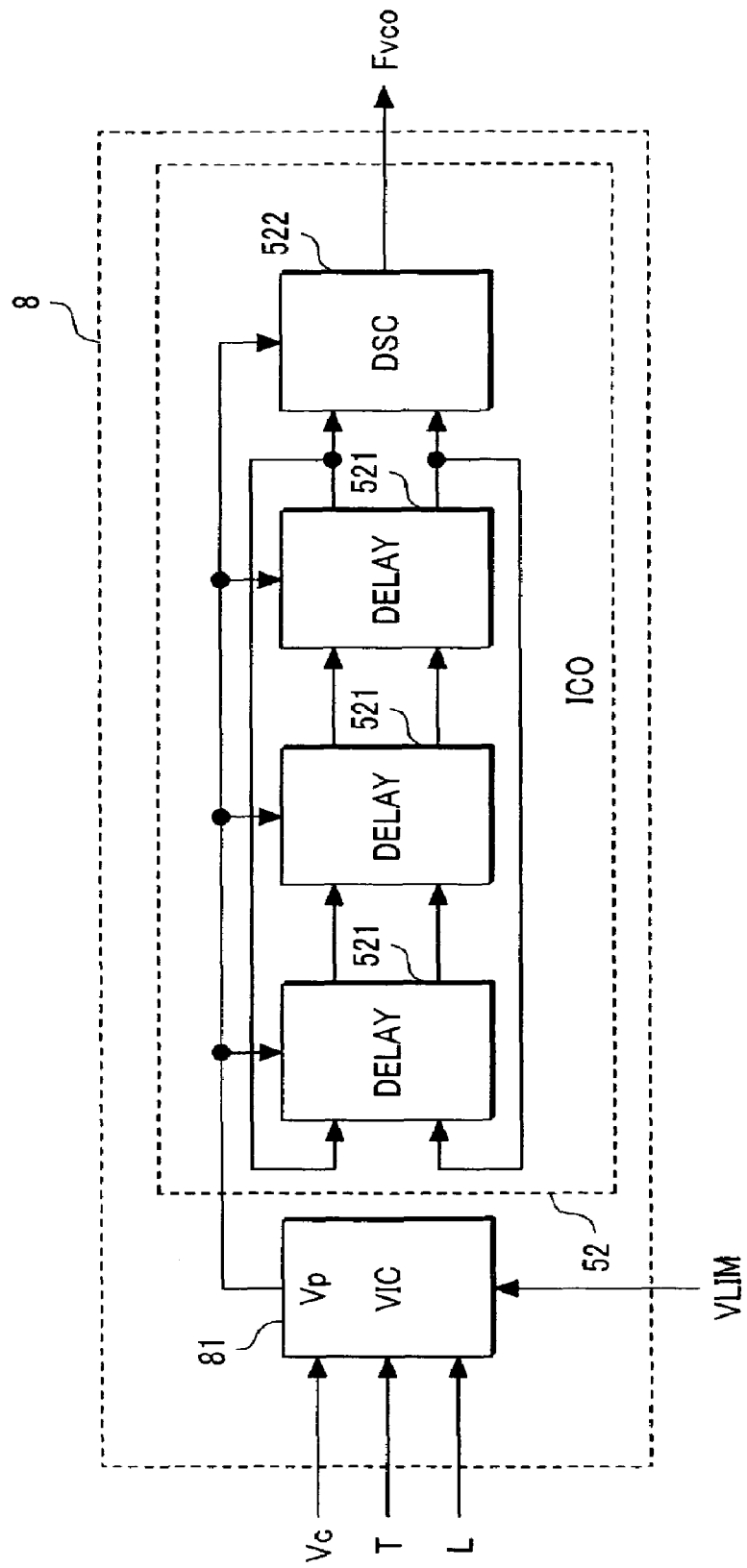
FIG. 4 is a block diagram for explaining a first structural example of a voltage controlled oscillator that is used in the automatic adjustment phase locked loop circuit shown in FIG. 1.

First, FIG. 4 shows a first structural example of the VCO 8. The VCO 8 includes a voltage-to-current converter circuit 81 that inputs the control voltage, the trimming signal, the limit signal, and the reference signal, and outputs the control signal, and a current controlled oscillator (ICO) 52 that adjusts a delay amount according to the control signal and controls the frequency of the output signal. The ICO 52 is made up of a ring oscillator having plural delay circuits 521 connected in the form of a ring. Each of the delay circuits 521 is capable of adjusting the delay amount according to the control signal. The ICO 52 has a differential single converter 522 connected to the output of the ring oscillator. The differential signal converter 522 converts a differential signal to a single signal.

Figure 5:
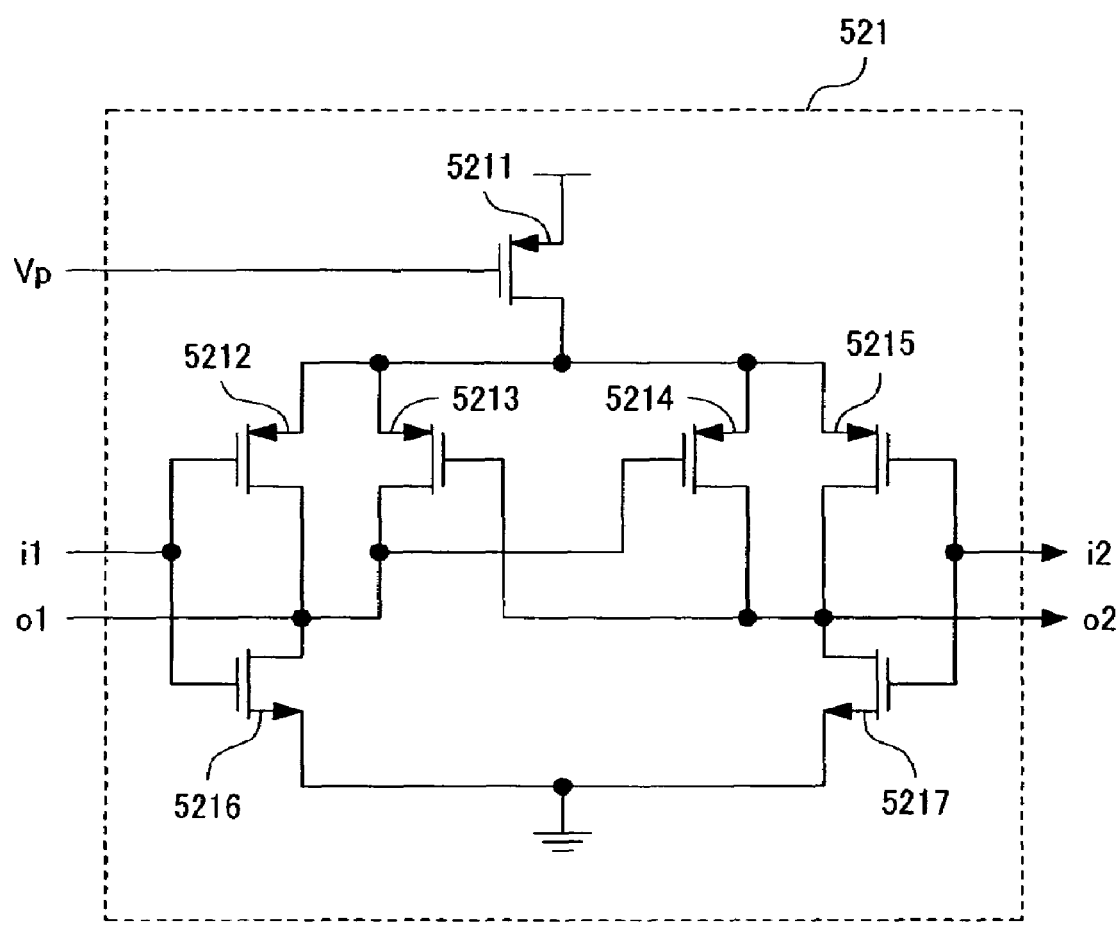
FIG. 5 is a block diagram showing a structural example of a delay circuit shown in FIG. 4.

FIG. 5 shows a structural example of each of the delay circuits 521 in the VCO 8. The delay circuit 521 includes PMOS transistors 5211 to 5215, and NMOS transistors 5216 to 5217. The PMOS transistor 5211 that receives the control signal from the gate and serves as a current source outputs its drain current that is a driving current to the PMOS transistors 5212 to 5215. The PMOS transistors 5212 and 5215 are paired with the NMOS transistors 5216 and 5217, respectively, to form a differential inverter. Also, the PMOS transistors 5213 and 5214 constitute a latch circuit, and are connected to an output node of the differential inverter.

Figure 6:
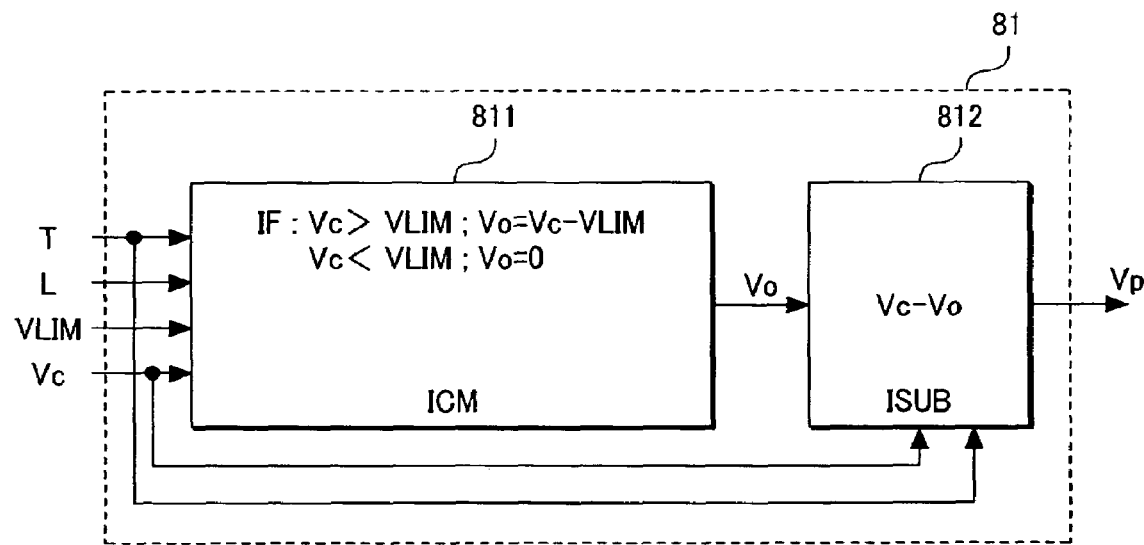
FIG. 6 is a block diagram for explaining a first structural example of a voltage-to-current converter circuit that is used in the voltage controlled oscillator shown in FIG. 4.

FIG. 6 shows a structural example of the voltage-to-current converter circuit 81 of the VCO 8. The voltage-to-current converter circuit 81 includes a current comparator 811 that inputs the control voltage, the trimming signal T, the limit signal L, and the base voltage VLIM to output a determination voltage Vo, and a current subtracter 812 that inputs the determination voltage Vo, the control voltage, and the trimming signal L to output a control signal Vp.

Subsequently, the operation of the voltage-to-current converter circuit 81 will be described.

In the basic operation of the current comparator 811, the current comparator 811 compares the control voltage with the base voltage, and outputs Vo=Vc−VLIM when Vc>VLIM, and Vo=0 when Vc<VLIM.

Figure 7:
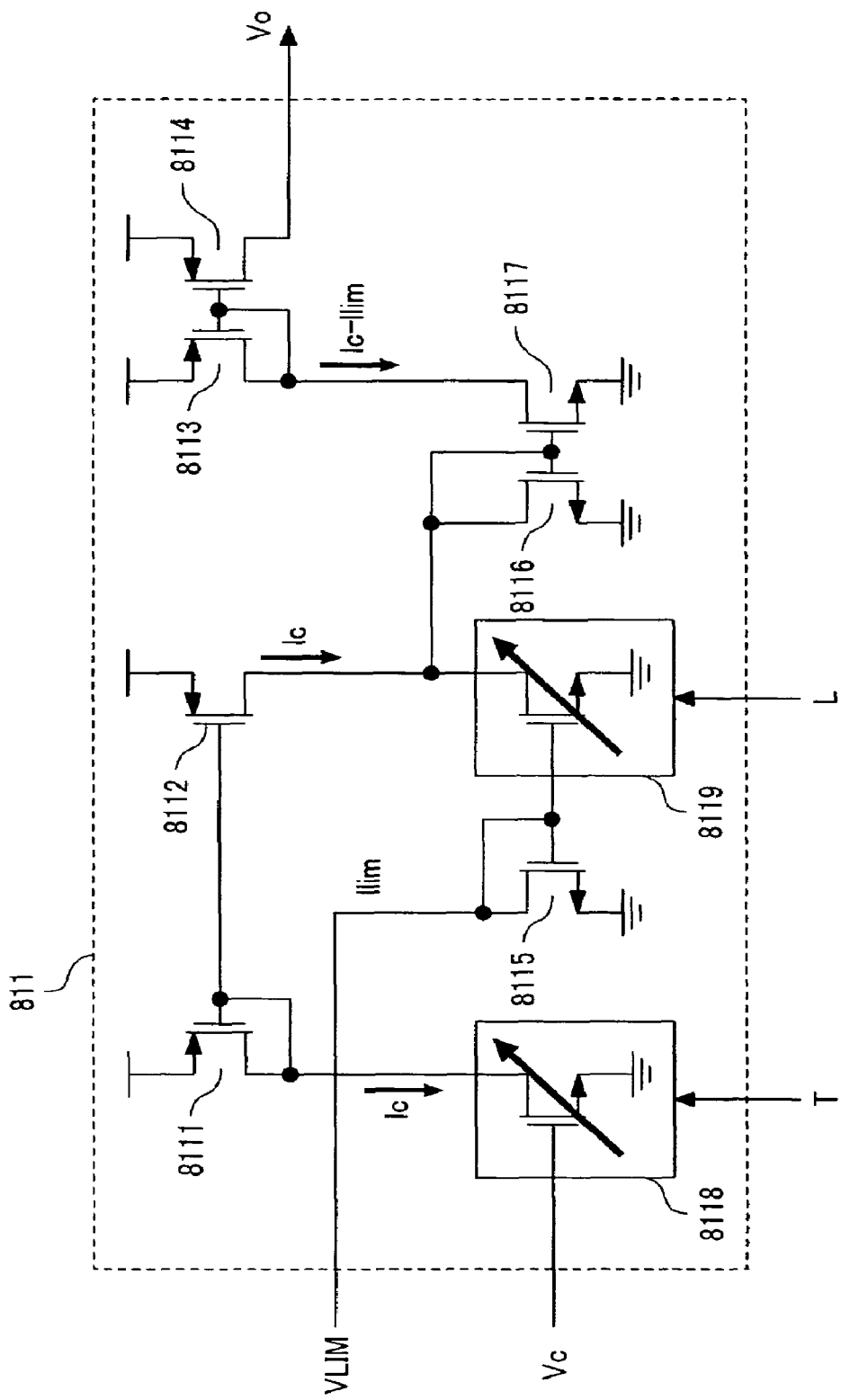
FIG. 7 is a circuit diagram for explaining a first structural example of a current comparator that is used in the voltage-to-current converter circuit shown in FIG. 6.

FIG. 7 shows a first structural example of the current comparator 811 in the voltage-to-current converter circuit 81. The current comparator 811 includes PMOS transistors 8111 to 8114, NMOS transistors 8115 to 8117, and trimming NMOS transistors 8118 to 8119.

The control voltage Vc is inputted to the gate of the trimming NMOS transistor 8118.

Figure 8:
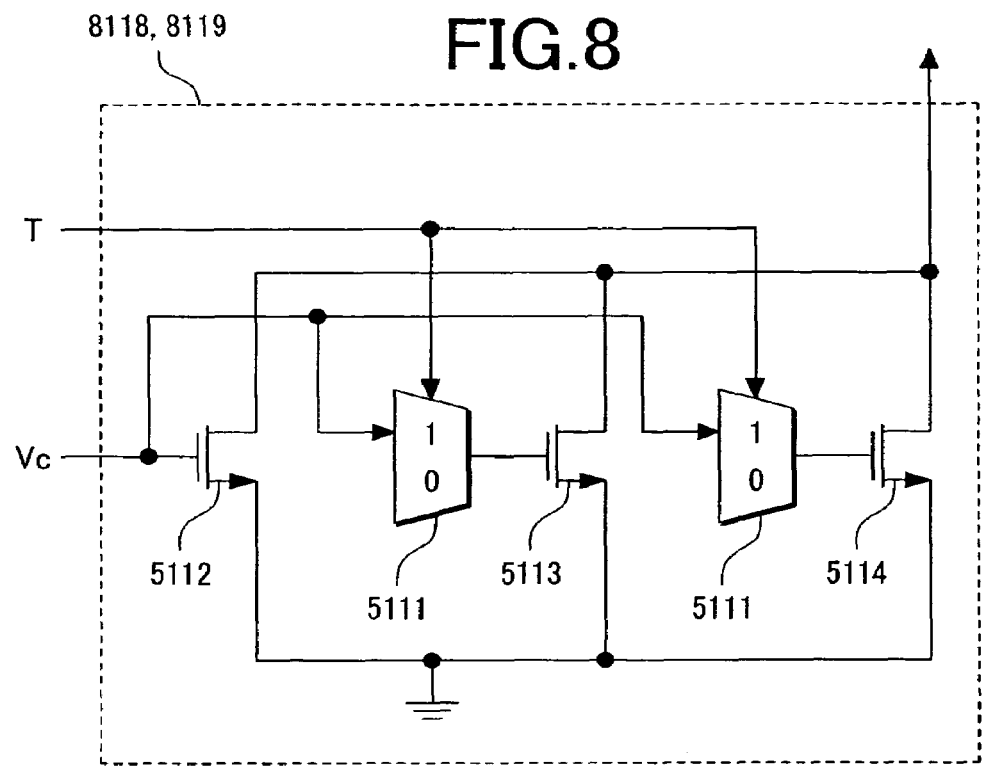
FIG. 8 is a circuit diagram for explaining a structural example of a trimming NMOS transistor that is used in the first current comparator shown in FIG. 7.

FIG. 8 shows a structural example of the trimming NMOS transistor 8118 (8119). The trimming NMOS transistor 8118 includes NMOS transistors 5112 to 5114, and a selector 5111. The trimming NMOS transistor 8118 converts the inputted control voltage Vc to a current Ic and outputs the converted current Ic. The trimming NMOS transistor 8118 is capable of changing the conversion value according to the magnitude of the trimming signal T.

Figure 9:
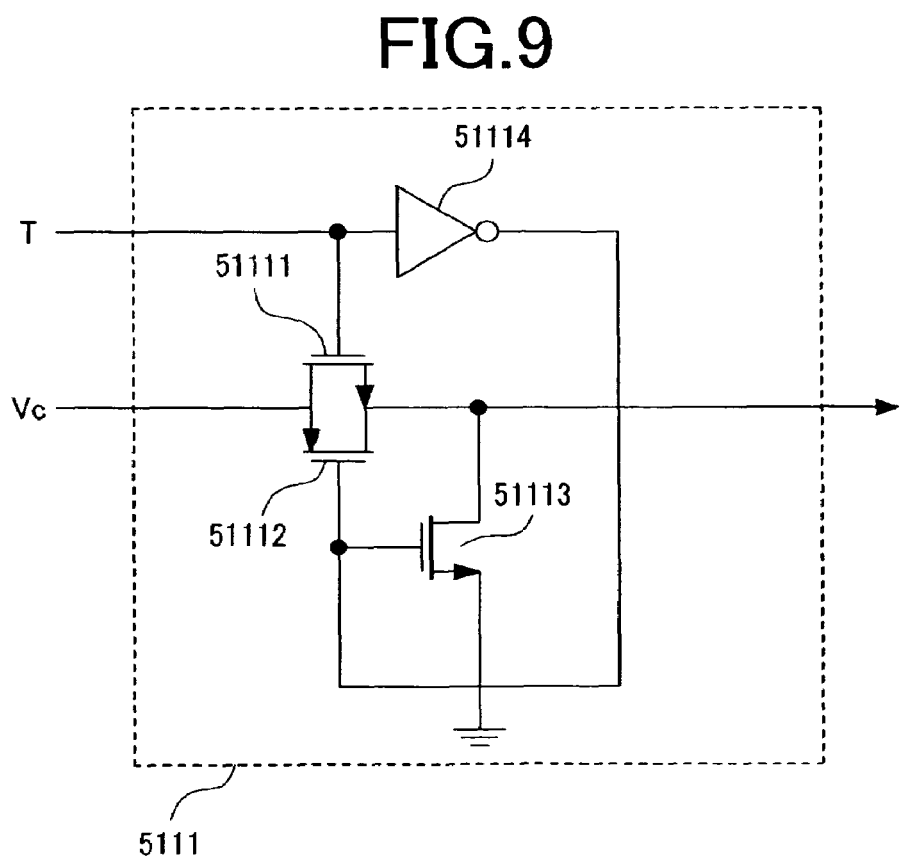
FIG. 9 is a circuit diagram for explaining a structural example of a selector that is used in the trimming NMOS transistor shown in FIG. 8.

FIG. 9 shows a structural example of a circuit of the selector that is used in the trimming NMOS shown in FIG. 8. The selector 5111 includes an inverter 51114, NMOS transistor 51111, 51113, and a PMOS transistor 51112. The selector 5111 is made up of a switch and outputs Vc when the trimming signal T is high, and selects ground when the trimming signal T is low.

In the first structural example of the current comparator 811 shown in FIG. 7, the control voltage Vc is inputted to the trimming NMOS transistor 8118 to generate a current Ic. The trimming signal T enables the amplitude of the Ic to be adjusted. The PMOS transistors 8111 and 8112 constitute a current mirror, and transmit the Ic to the drain current of the PMOS transistor 8112. The base voltage VLIM is inputted to the drain of the NMOS transistor 8115 as a current Ilim. The NMOS transistor 8115 and the trimming NMOS transistor 8119 constitute a current mirror, and increases the drain current of the NMOS transistor 8115 a mirror ratio times to produce the drain current of the trimming NMOS transistor 8119.

In this example, the limiter signal L changes the mirror ratio to change the drain current of the trimming NMOS transistor 8119. The subtraction of the current is conducted at a node between the drain of the PMOS transistor 8112 and the drain of the trimming NMOS transistor 8119.

When the drain current of the PMOS transistor 8112 is smaller than the drain current of the trimming NMOS transistor 8119, all of the drain current of the PMOS transistor 8112 flows in the drain of the trimming NMOS transistor 8119 but does not flow in the NMOS transistor 8116. Consequently, the NMOS transistor 8116 turns off, and the NMOS transistor 8117 and the PMOS transistors 8113, 8114 also turn off.

On the other hand, when the drain current of the PMOS transistor 8112 is larger than the drain current of the trimming NMOS transistor 8119, the drain current of the PMOS transistor 8112 flows in the drain of the trimming NMOS transistor 8119. A differential current (Ic−ILIM) between the currents Ic and ILIM flows in the NMOS transistor 8116. The NMOS transistors 8116 and 8117 constitute a current mirror at a mirror ratio of 1:1, and the differential current flows in the drain of the NMOS transistor 8117. Likewise, the PMOS transistors 8113 and 8114 constitute a current mirror at the mirror ratio of 1:1, and the drain current of the NMOS transistor 8117 becomes the drain current of the PMOS transistor 8114, and is outputted as the determination voltage Vo.

Figure 10:
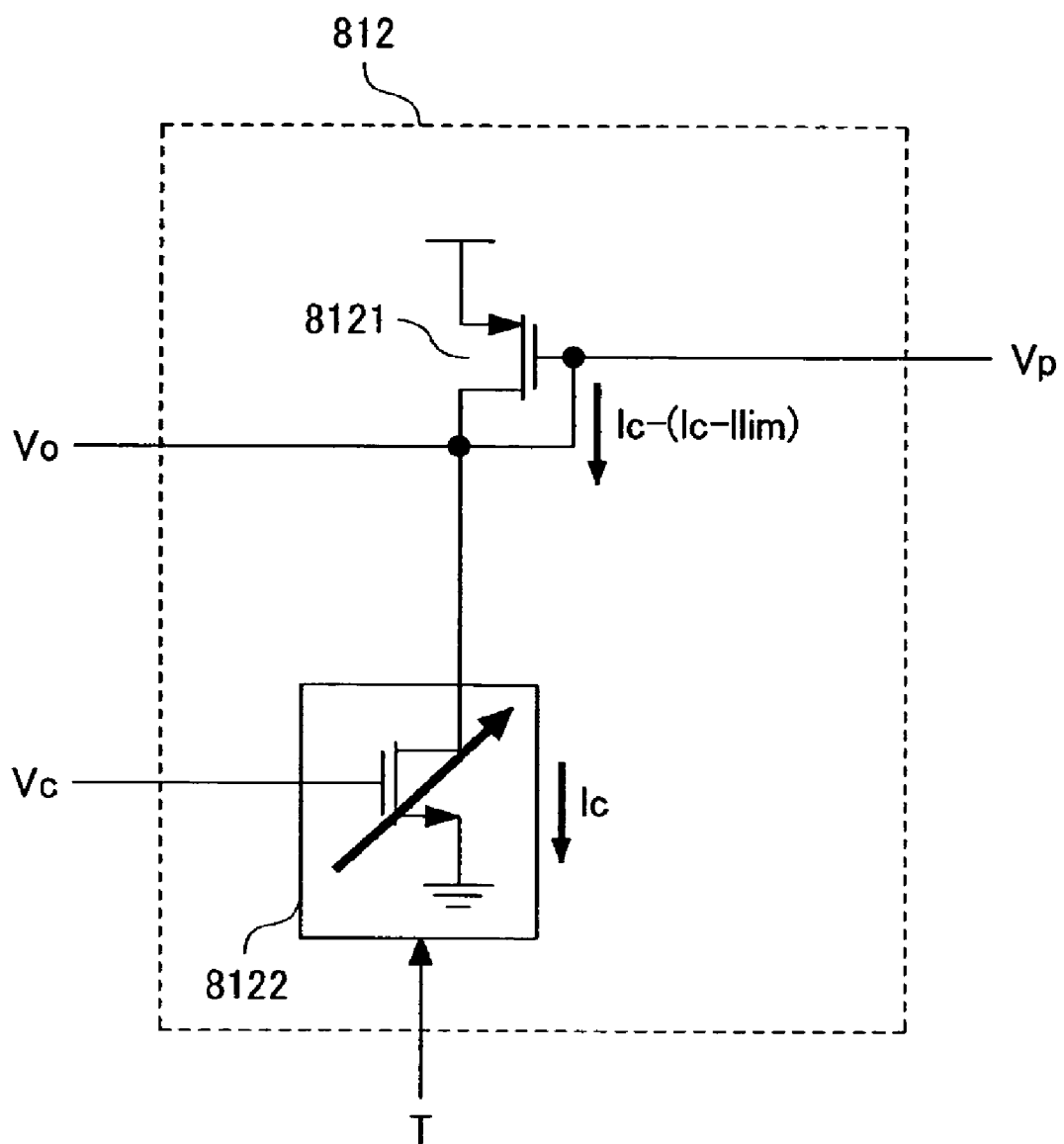
FIG. 10 is a circuit diagram for explaining a first structural example of a current subtracter that is used in the voltage-to-current converter circuit shown in FIG. 6.

FIG. 10 shows a structural example of the current subtracter 812 that is used in the first structural example of the voltage-to-current converter circuit 81 shown in FIG. 6. The current subtracter 812 is made up of a PMOS transistor 8121 and a trimming NMOS transistor 8122.

The trimming NMOS transistor 8122 conducts the same operation as that of the trimming NMOS transistor 8118 of the current comparator 811. The drain of the trimming NMOS transistor 8122 is connected to the PMOS transistor 8121. The determination voltage Vo is also connected to a node between the trimming NMOS transistor 8122 and the PMOS transistor 8121 to conduct the subtraction of currents. In this example, when it is assumed that the drain current of the trimming NMOS transistor 8122 is Ic, and the current value of the determination voltage is Ic−Ilim, the drain current of the PMOS transistor 8121 becomes Ic−(Ic−Ilim)=Ilim. On the other hand, when the current value of the determination voltage is 0, the drain current of the PMOS transistor 8121 becomes Ic−(0)=Ic.

The current comparator 811 and the current subtracter 812 are associated with each other to provide a limit function, and also to make it possible to realize the VCO 8 which conducts the trimming operation.

Subsequently, a description will be given of the automatic trimming operation by means of the calibration circuit 64 of the frequency divider 6, that is, a method of trimming the frequency sensitivity of the voltage controlled oscillator according to the trimming signal in the automatic adjustment phase locked loop circuit with reference to FIGS. 11 to 13.

Figure 12A:
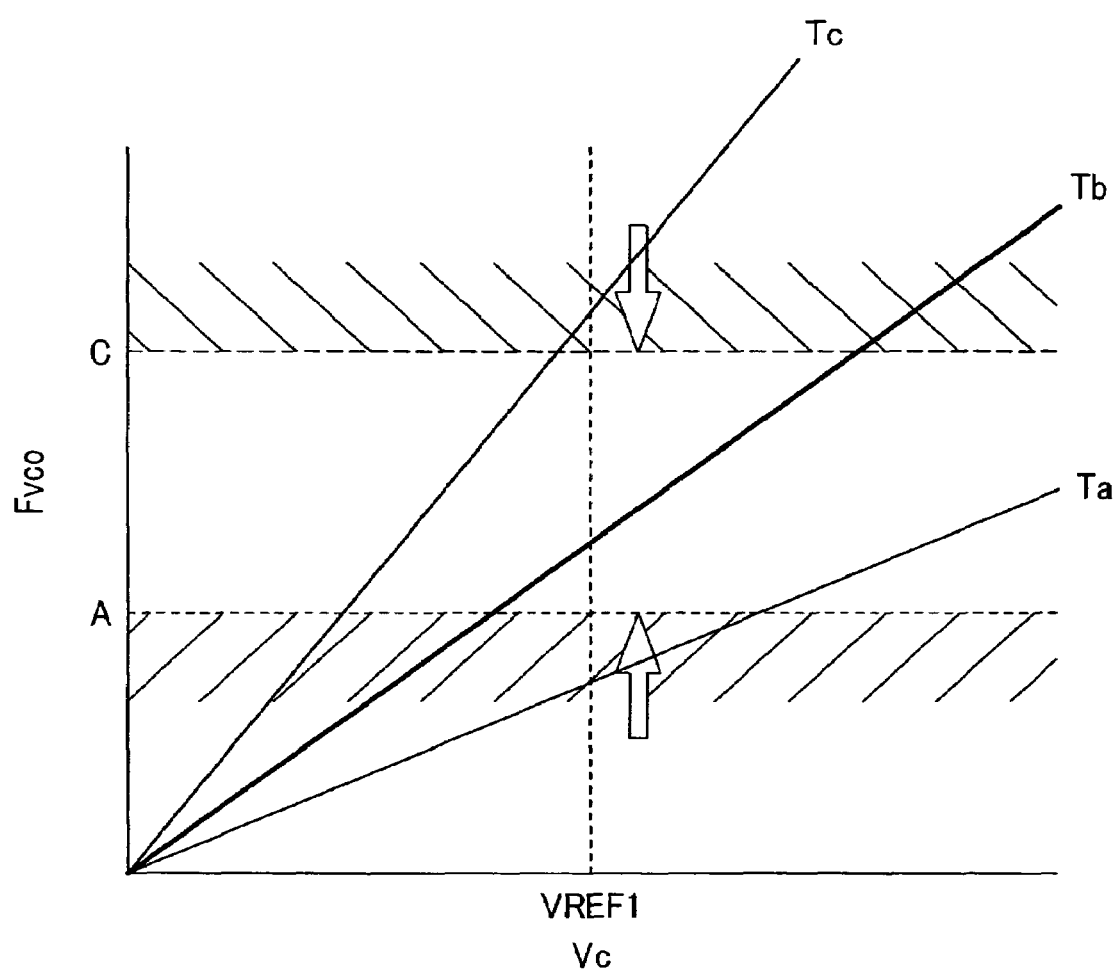
FIG. 12A is a diagram for explaining a method of trimming the frequency sensitivity of the voltage controlled oscillator according to a trimming signal in the automatic adjustment phase locked loop circuit shown in FIG. 1.

First, FIG. 12A shows an example of a relationship of the output signal (Fvco) of the voltage controlled oscillator, the trimming signal T, and the first reference voltage (VREF1). A lower limit value A is set taking the noise into account, and an upper limit value C is set taking a settling time into account. The trimming signal T is so set as to satisfy a sensitivity Tb within an upper and lower allowable range (A-C) by the first reference voltage.

In this case, the frequency sensitivity of the output signal that is outputted with respect to the control voltage may be set to the sensitivity Tb within the upper and lower allowable range (A-C), from a state in which the frequency sensitivity of the output signal that is outputted by the voltage controlled oscillator with respect to the control voltage is low, for example, the setting work is sequentially advanced from Ta toward the higher side of the sensitivity. Alternatively, the frequency sensitivity may be sequentially set to Tb from a state in which the sensitivity is high, for example, Tc.

In this example, in the voltage controlled oscillator, the frequency sensitivity of the output signal that is outputted with respect to the control voltage is set from a lower sensitivity side according to the trimming signal. Then, the upper limit frequency of the output signal is set with respect to the set sensitivity according to the limit signal.

Then, a description will be given of the sequence of the operation of the automatic adjustment phase locked loop circuit shown in FIG. 1 with reference to a trimming flow shown in FIG. 11. When the calibration starts, the select signal S becomes 1, and the frequency divider 6 outputs no feedback signal. Also, the trimming signal T and the limit signal L are reset as T=0 and L=X, respectively (S100).

Figure 12B:
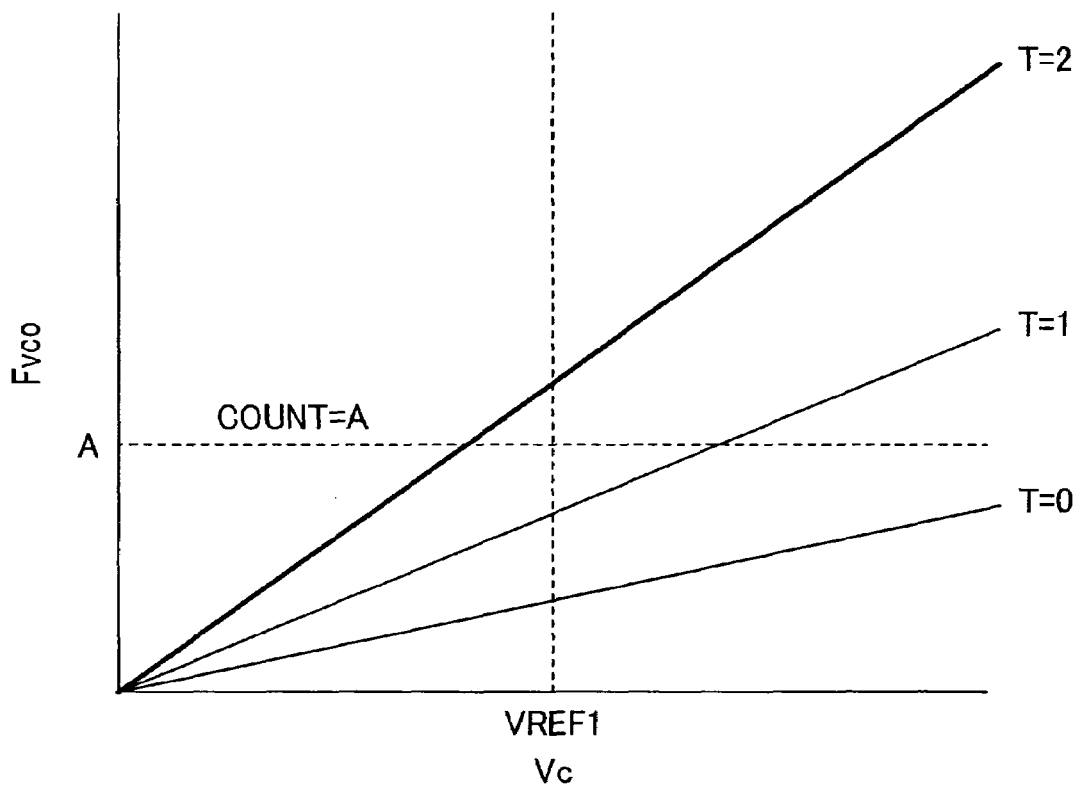
FIG. 12B is a diagram for explaining the method of trimming the frequency sensitivity of the voltage controlled oscillator according to the trimming signal in the automatic adjustment phase locked loop circuit shown in FIG. 1.

FIG. 12B shows an example of a relationship of the output signal (Fvco) of the voltage controlled oscillator, the trimming signal T, and the first reference voltage (VREF1). The trimming signal T=0 is a state in which the frequency sensitivity of the output signal that is outputted with respect to the control voltage is lowest.

In this state, the counter (CNT) 62 starts to count the output signals within the count interval (S101).

The calibration circuit (CAL) 64 to which the count result N has been inputted conducts determination (S102).

The state machine 641 of the calibration circuit (CAL) 64 determines that the count result N is lower than a given value A, the state machine 641 updates the trimming signal T, that is, outputs T=T+1, and again counts the output signals. The state machine 641 updates the trimming signal until the count result N is equal to or higher than the given value A, in other words, until the trimming signal T satisfies a given sensitive characteristic at the first reference voltage (VREF1) (S103).

The trimming signal T is inputted to the voltage-to-current converter circuit 81 of the voltage controlled oscillator 8. That is, in the circuit of the selector of the trimming NMOS transistor shown in FIG. 9, the control voltage Vc is inputted to the gate of the NMOS transistor 5112, and also inputted to the NMOS transistors 5113 and 5114 through the selector 5111. The trimming signal T becomes a select signal of the selector 5111, and in the embodiment shown in FIG. 8, all of the selectors turn off at the time of T=0, and do not select the NMOS transistors 5113 and 5114. In the case where the trimming signal T is updated in the step S103, the NMOS transistor 5113 is selected at the time of T=1, and the NMOS transistor 5114 is not selected. At the time of T=2, the NMOS transistor 5114 is selected, and the NMOS transistor 5113 is not selected. At the time of T=3, both of the NMOS transistors 5113 and 5114 are selected.

After the state machine 641 updates the trimming signal so that the output signal of the VCO 8 is set to the given sensitivity of the frequency characteristic, the frequency divider 6 updates the select signal as S=2. In other words, after the state machine 641 updates the trimming signal T so that the count result N is set to be equal to or higher than the given value A corresponding to Count=A shown in FIG. 12, the state machine 643 updates the select signal as S=2 (S104).

In this situation, the state machine 641 fixes the trimming signal T to a value T obtained at the time of satisfying the condition of count=A, and then holds this value in a memory.

Subsequently, a description will be given of a method of trimming the upper limit frequency of the voltage controlled oscillator according to the limit signal in the automatic adjustment phase locked loop circuit.

The counter 62 starts to count the output signals within the count interval in a state where the trimming signal T is fixed as described above (S105).

The calibration circuit 64 to which the count result has been inputted conducts the determination (S106).

Figure 13A:
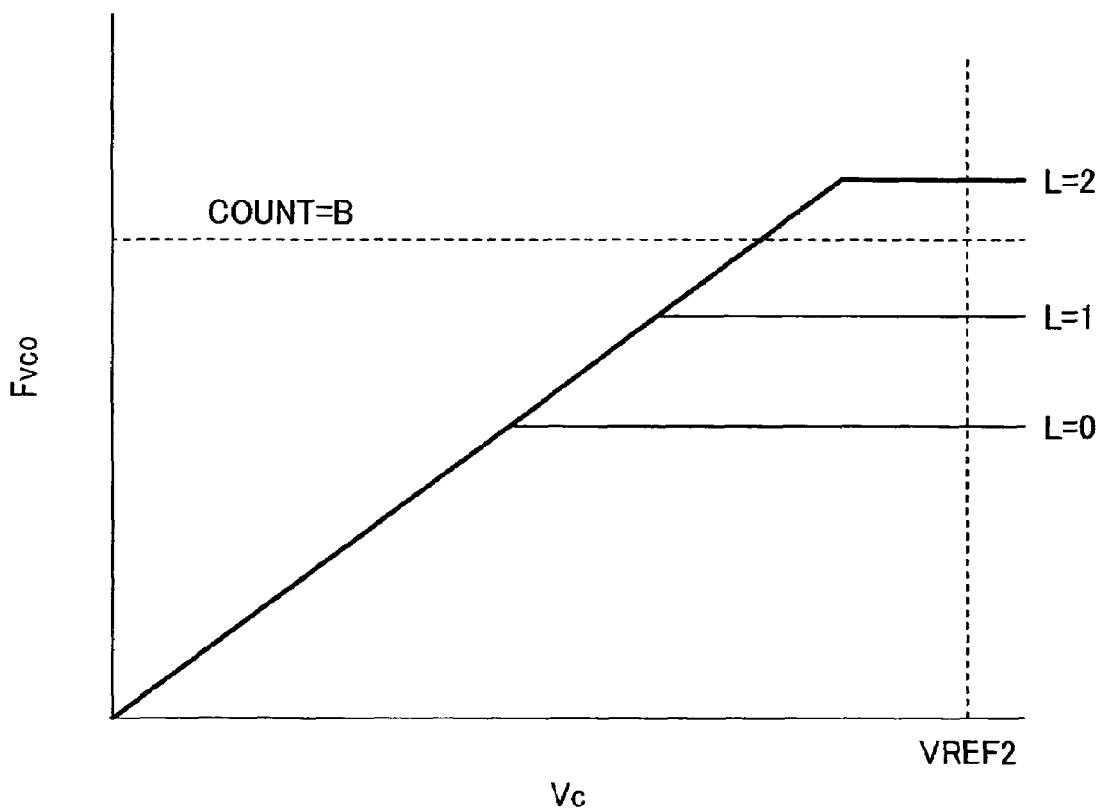
FIG. 13A is a diagram for explaining a method of trimming the upper limit frequency of the voltage controlled oscillator according to a limit signal in the automatic adjustment phase locked loop circuit shown in FIG. 1.

FIG. 13A shows an example of a relationship of the output signal (Fvco) of the VCO 8, the limit signal L, and the second reference voltage (VREF2).

When the state machine 642 determines that the count result N is lower than a given value B, the state machine 642 updates the limit signal, outputs L=L+1 (S107), and again counts the output signals. The state machine 642 updates the trimming signal until the count result N in the second reference voltage (VREF2) becomes equal to or higher than the given value B.

After the state machine 642 updates the trimming signal so that the count result N is set to be equal to or higher than the given value B, for example, at the time of L=2, the state machine 643 updates the select signal as S=0 (S108).

In this situation, the calibration circuit 64 sets the trimming signal and the limit signal (L=2) to values obtained when the count value of the output signal is equal to or higher than a given value through the above operation, and holds those value in the memory. Then, the counter 62 terminates the counting operation.

Thereafter, the calibration circuit 64 outputs the feedback signal, and sets the PLL loop to the closed loop. In this state, the PLL is shifted to the convergence period.

It is necessary that L=2 is set to be smaller than the operation limit where the frequency divider does not malfunction, and it is necessary that the count result slightly exceeds the given value B.

Figure 13B:
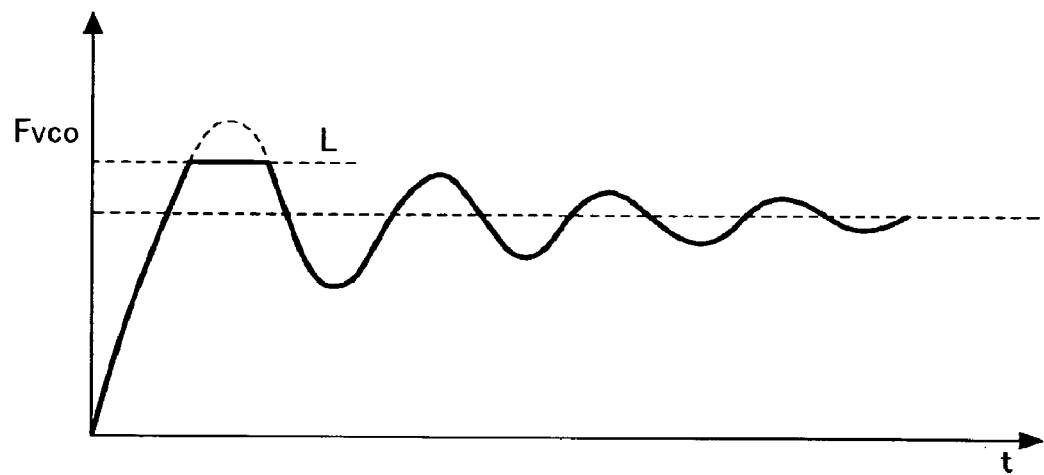
FIG. 13B is a diagram showing an example of the frequency characteristic in the automatic adjustment phase locked loop circuit (PLL) which has been trimmed according to the first embodiment.

FIG. 13B shows an example of the frequency characteristic in the automatic adjustment phase locked loop circuit (PLL) that is trimmed on the basis of this embodiment.

According to this embodiment, even if a remarkable process variation or a characteristic variation due to the environmental variation occurs in the fine process, the PLL always sets the upper limit frequency to L due to the calibration. As a result, the oscillating frequency of the PLL is not higher than the highest operating speed of the frequency divider. This prevents an event from occurring, in which the PLL is not locked because the frequency divider does not operate properly.

Also, the sensitivity of the frequency characteristic and the upper limit frequency in the PLL can beset, individually. For that reason, for example, after the sensitivity of the frequency characteristic is set taking the noise of the PLL and the lockup time into account, a given upper limit frequency is set with respect to the sensitivity of the frequency characteristic, thereby making it possible to provide a PLL that satisfies a desired characteristic with respect to a wide frequency range of from a lower frequency to a higher frequency.

Figure 11:
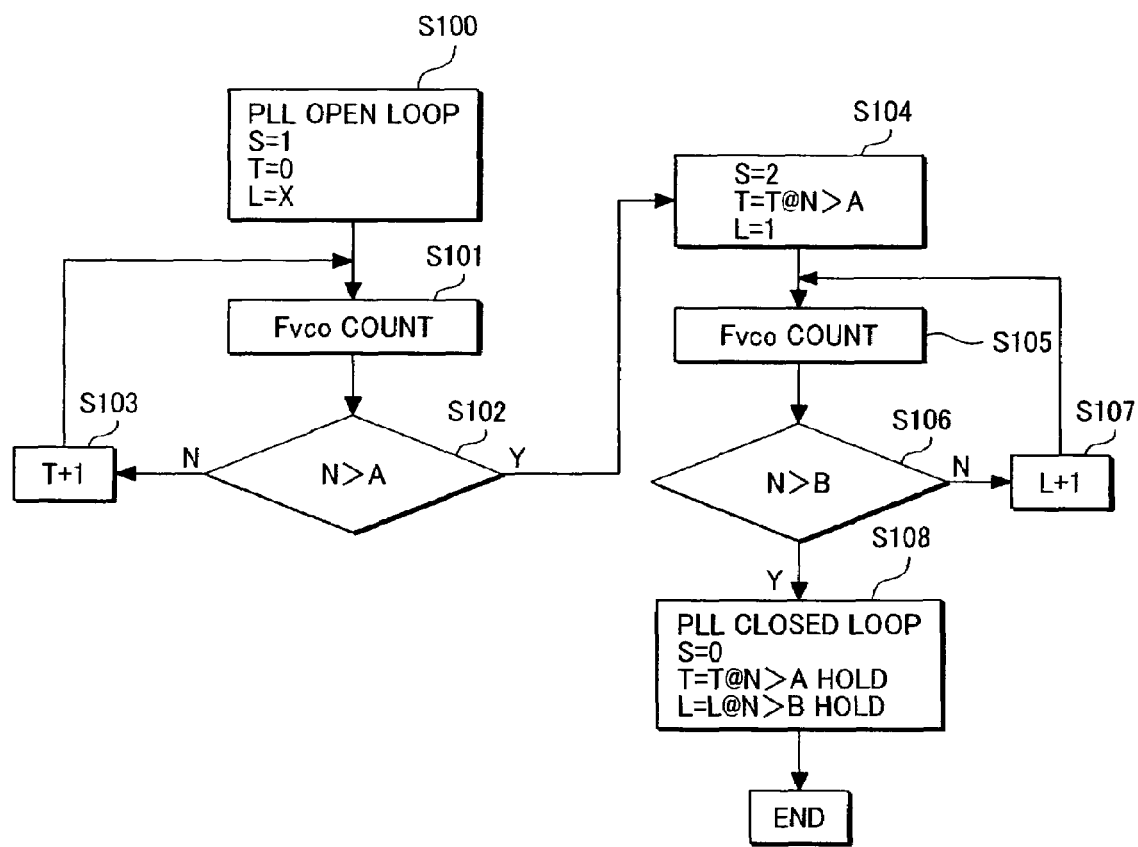
FIG. 11 is a trimming flowchart for explaining the operation sequence of the automatic adjustment phase locked loop circuit shown in FIG. 1.

The order of setting the sensitivity of the frequency characteristic of the VCO and the upper limit frequency is not limited to the example shown in FIG. 11. The order may be reversed so that the sensitivity of the frequency characteristic is determined after the upper limit frequency of the VCO is set.

As described above, according to this embodiment, it is possible to mass-produce and inexpensively provide a phase locked loop circuit which automatically adjusts the sensitivity of the frequency characteristic and the upper limit frequency of the VCO, and which satisfies a desired characteristic with respect to signals which are in a wide frequency range of from a low frequency to a high frequency even if there occurs a remarkable process variation in a fine process or a variation in the characteristic due to the environmental variation since the VCO sets the upper limit frequency to a value that is lower than the highest operating frequency of the logic circuit.

In this embodiment, the specific structure of the frequency divider and the VCO can be variously modified as will be described as an example below.

First Modified Example

Figure 14:
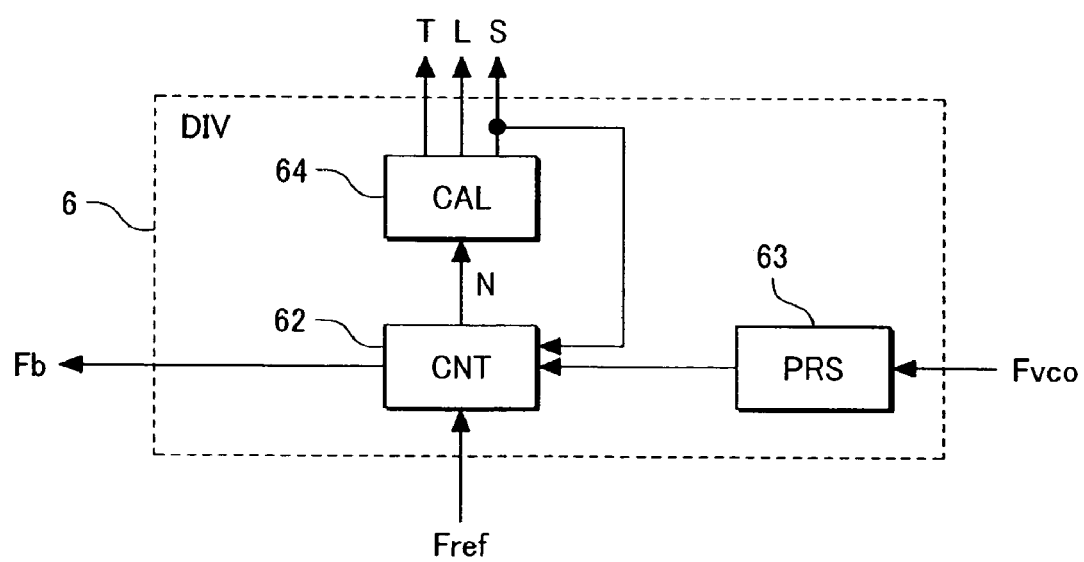
FIG. 14 is a block diagram for explaining a second structural example of the frequency divider that is used in the automatic adjustment phase locked loop circuit shown in FIG. 1.

As a modified example of the first embodiment, FIG. 14 shows a second structural example of the frequency divider 6. The second frequency divider 6 includes a prescaler 63 that inputs an output signal of the VCO 8 and outputs the frequency division result, a counter 62 that inputs the frequency division result of the prescaler 63, the reference signal, and the select signal, and outputs the feedback signal and the count result (N), and a calibration circuit 64 that inputs the count result and outputs the select signal, the trimming signal, and the limit signal according to the count result.

The operation of the second frequency divider 6 is identical with that of the first frequency divider 6. The second frequency divider has a structure used in order to input the signal to the counter 62 after the frequency has been lowered by the prescaler 63 that is a high speed frequency divider when the highest operating speed of the counter 62 is lower than the output signal frequency of the VCO 8.

Second Modified Example

Figure 15:
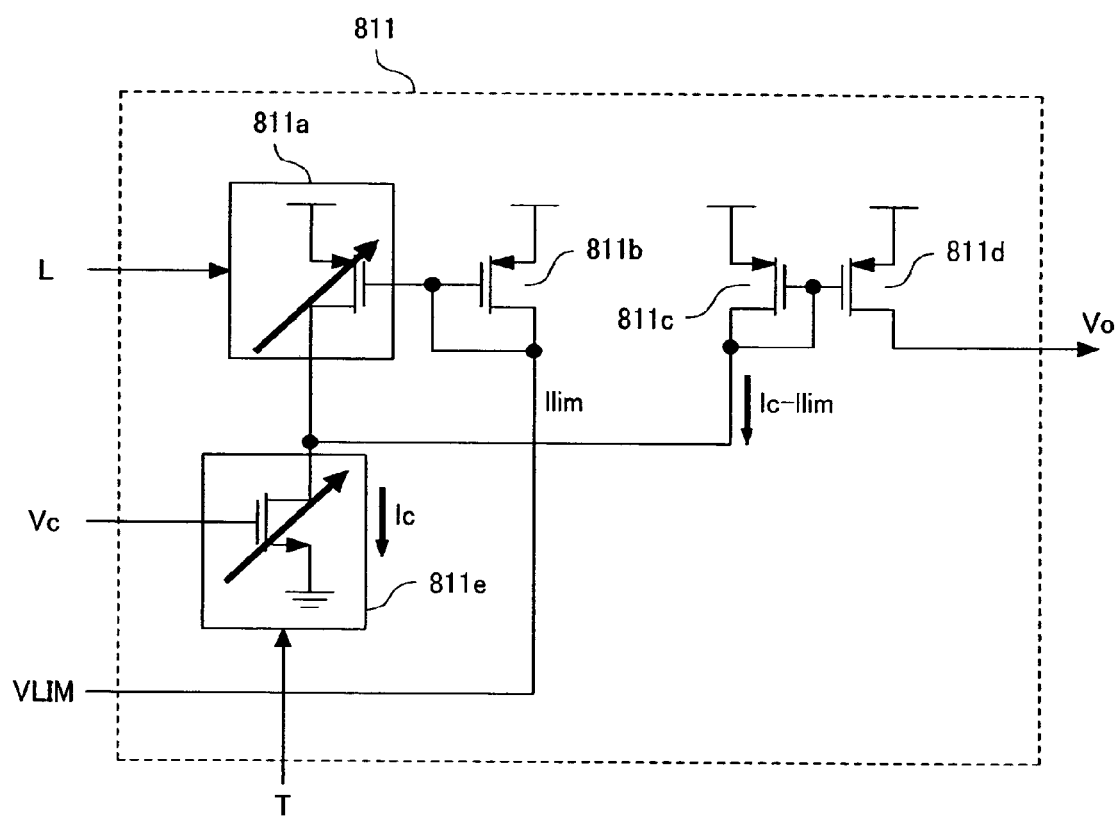
FIG. 15 is a circuit diagram for explaining a second structural example of a current comparator that is used in the voltage-to-current converter circuit shown in FIG. 6.

Another modified example of the current comparator according to the first embodiment will be described with reference to FIGS. 15 to 17. FIG. 15 shows a second structural example of the current comparator 811. The second structural example of the current comparator 811 includes a trimming PMOS transistor 811a, PMOS transistors 811b to 811d, and a trimming NMOS transistor 811e.

Figure 16:
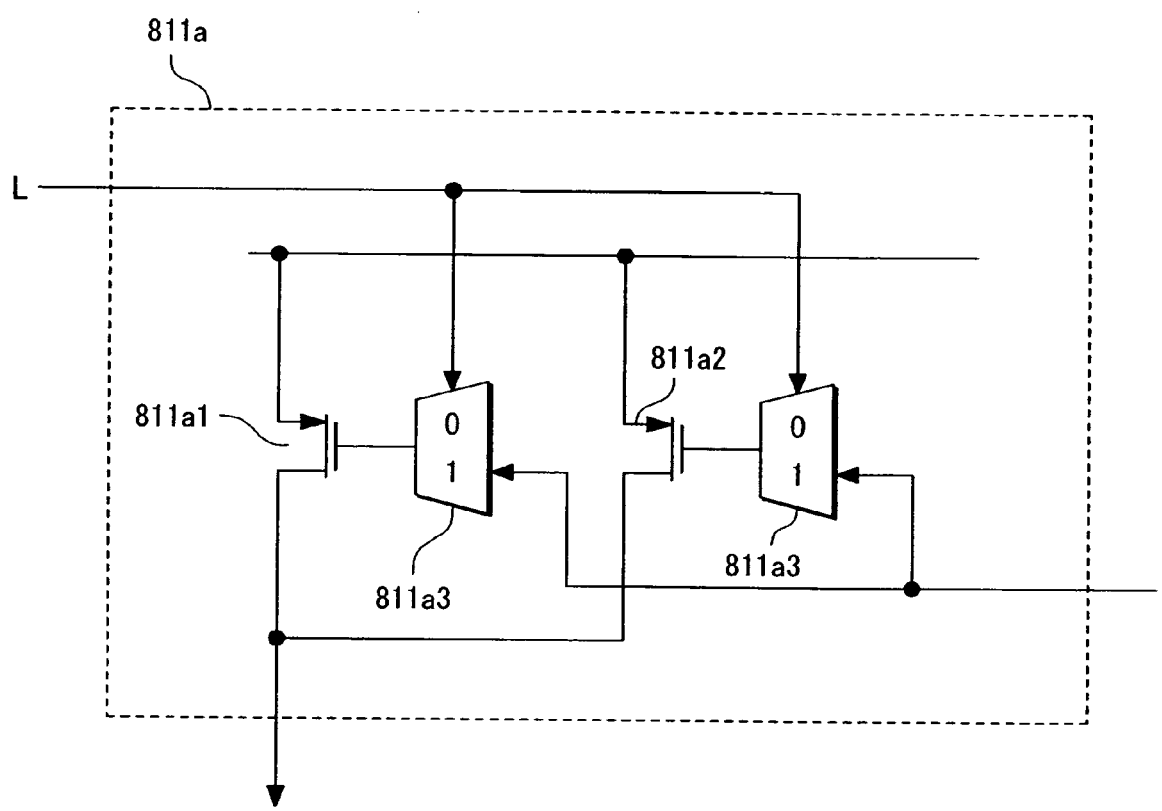
FIG. 16 is a circuit diagram for explaining a structural example of a trimming PMOS transistor that is used in the second current comparator shown in FIG. 15.

FIG. 16 is a structural example of the trimming PMOS transistor. The trimming PMOS transistor is made up of a PMOS transistor 811a1, 811a2, and a selector 811a3.

An input signal is inputted to the PMOS transistors 811a1 and 811a2 through the selector 811a3. The limit signal L is a select signal of the selector 811a3, and in the embodiment of FIG. 15, all of the selectors become off at the time of L=0, and the PMOS transistors 811a1 and 811a2 are not selected. At the time of L=1, the PMOS transistor 811a1 is selected, and the PMOS transistor 811a2 is not selected. At the time of L=2, the PMOS transistor 811a2 is selected, and the PMOS transistor 811a1 is not selected. At the time of L=3, both of the PMOS transistors 811a1 and 811a2 are selected.

Figure 17:
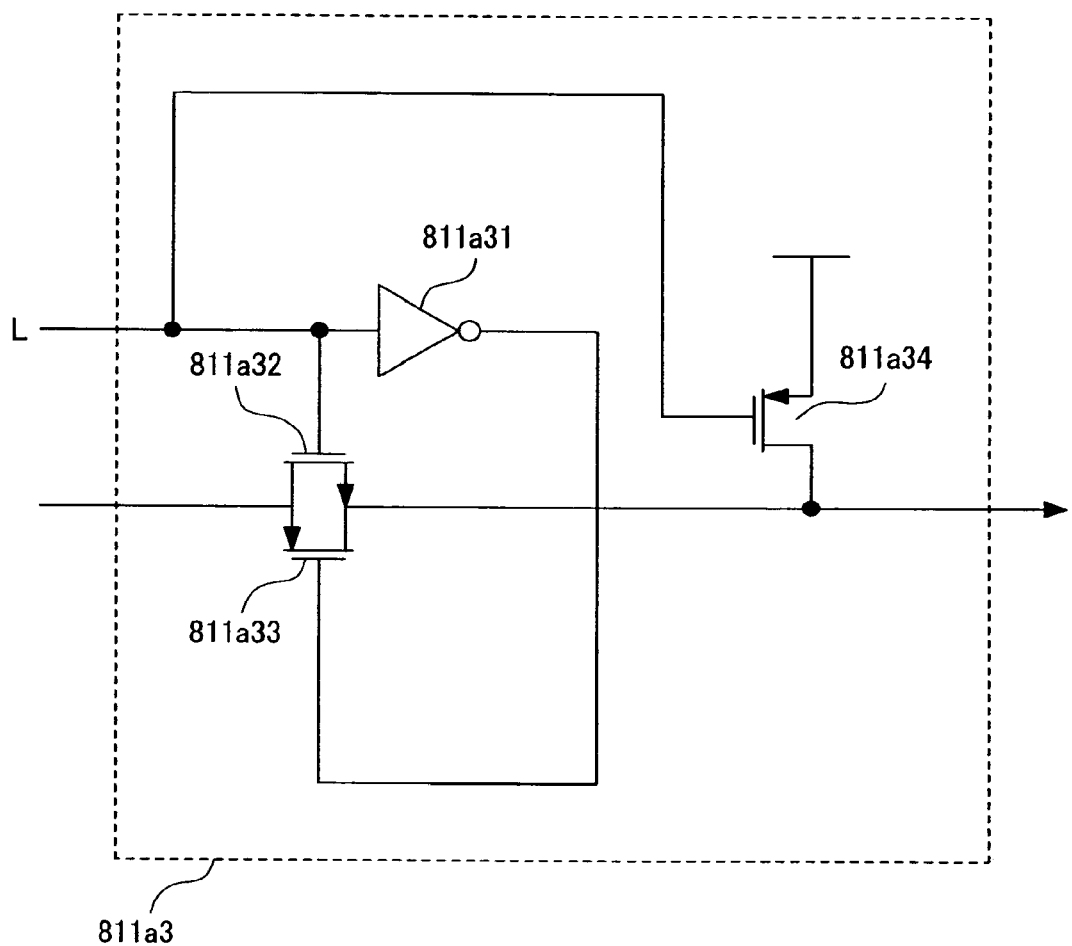
FIG. 17 is a circuit diagram for explaining a structural example of a selector that is used in the trimming PMOS transistor shown in FIG. 16.

FIG. 17 shows a structural example of the selector 811a3 for realizing the above operation. The selector 811a3 is made up of an inverter 811a31, an NMOS transistor 811a32, and PMOS transistors 811a32, 811a33. The selector 811a3 is formed of a switch, which outputs the input signal when the limit signal L is high and selects a supply voltage when the limit signal L is low.

The trimming NMOS transistor 811e conducts the same operation as that of the trimming NMOS transistor 8118 of the first current comparator 811.

The base voltage VLIM is inputted to the drain of the PMOS transistor 811b as the current Ilim. The PMOS transistor 811b and the trimming PMOS transistor 811a form a current mirror, and the drain current of the PMOS transistor 811b increases a mirror ratio times to produce the drain current of the trimming PMOS transistor 811a. In this example, the limit signal L changes the mirror ratio to change the drain current of the trimming PMOS transistor 811a. The subtraction of current is conducted at a node between the drain of the trimming PMOS transistor 811a and the drain of the trimming NMOS transistor 811e.

When the drain current of the trimming NMOS transistor 811e is smaller than the drain current of the trimming PMOS transistor 811a, the PMOS transistor 811c turns off, and the PMOS transistor 811d also turns off.

On the other hand, when the drain current of the trimming NMOS transistor 811e is larger than the drain current of the trimming PMOS transistor 811a, a differential current between the drain current of the trimming NMOS transistor 811e and the drain current of the trimming PMOS transistor 811a flows in the PMOS transistor 811c. The PMOS transistors 811c and 811d form a current mirror at the mirror ratio of 1:1, and the differential current flows in the drain of the PMOS transistor 811d, and is outputted as the determination voltage Vo.

Third Modified Example

Another modified example of the voltage-to-current converter circuit according to the first embodiment will be described with reference to FIGS. 18 to 20. The second voltage-to-current converter circuit 81 is made up of a current comparator 813 that inputs the control voltage, the trimming signal, the limit signal, and the base voltage to output a conversion voltage and the determination voltage, and a current subtracter 814 that inputs the determination voltage and the conversion voltage to output the control signal.

Subsequently, the operation of the second voltage-to-current converter circuit 81 will be described.

In the basic operation of the current comparator 811, the current comparator 811 compares the control voltage with the base voltage, and outputs Vo=Vc−VLIM when Vc>VLIM, and Vo=0 when Vc<VLIM.

The trimming signal allows the value of the control voltage Vc during the comparing operation to be adjusted. On the other hand, the limit signal allows the base voltage VLIM during the comparing operation to be adjusted.

Figure 19:
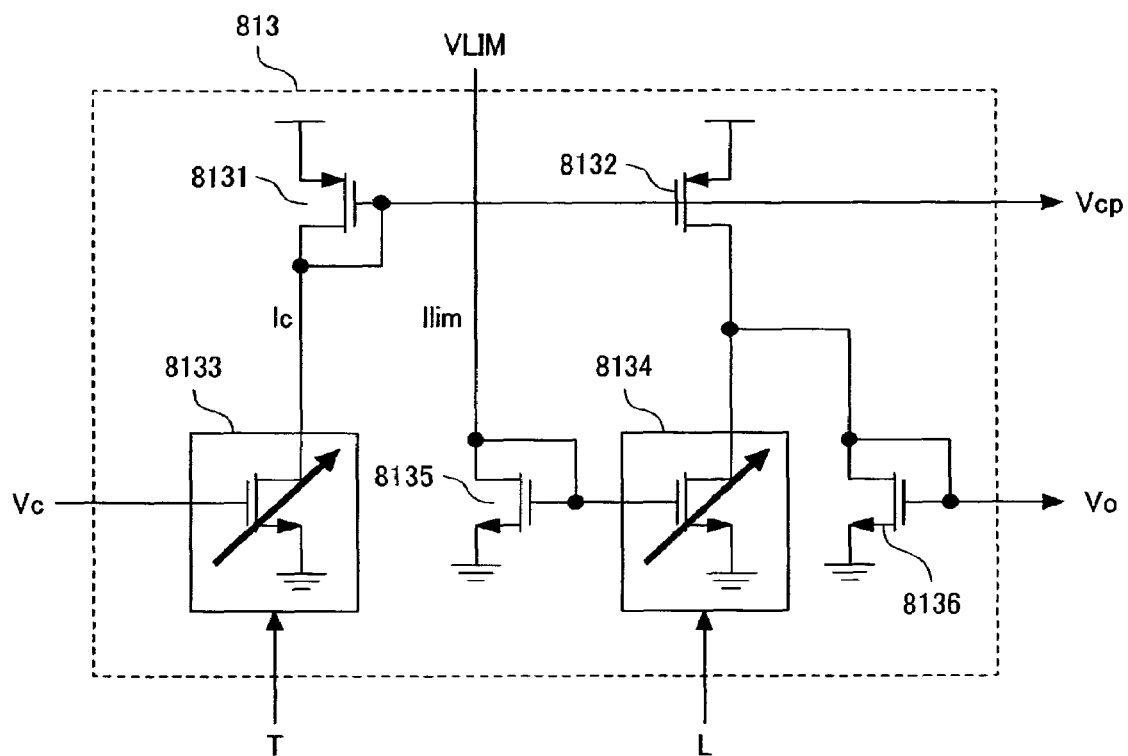
FIG. 19 is a circuit diagram for explaining a structural example of a current comparator that is used in the second voltage-to-current converter circuit shown in FIG. 18.

FIG. 19 shows a structural example of the current comparator 813. The current comparator 813 is made up of PMOS transistors 8131 to 8132, NMOS transistors 8135 to 8136, and trimming NMOS transistors 8133 to 8134.

The control voltage Vc is inputted to the gate of the trimming NMOS transistor 8133.

The trimming NMOS transistor 8133 conducts the same operation as that of the trimming NMOS transistor 8118 in the current comparator 811. The PMOS transistors 8131 and 8132 form a current mirror, and transmits the Ic to the drain of the PMOS transistor 8132. The base voltage VLIM is inputted to the drain of the NMOS transistor 8135 as the current Ilim. The NMOS transistor 8135 and the trimming NMOS transistor 8134 form a current mirror, and the drain current of the NMOS transistor 8135 increases a mirror ratio times to produce the drain current of the trimming NMOS transistor 8134. In this example, the limit signal L changes the mirror ratio to change the drain current of the trimming NMOS transistor 8134. The subtraction of current is conducted at a node between the drain of the PMOS transistor 8132 and the drain of the trimming NMOS transistor 8134.

When the drain current of the PMOS transistor 8132 is smaller than the drain current of the trimming NMOS transistor 8134, all of the drain current of the PMOS transistor 8132 flows in the drain of the trimming NMOS transistor 8134, but the drain current does not flow in the NMOS transistor 8136. Hence, the NMOS transistor 8136 turns off.

On the other hand, when the drain current of the PMOS transistor 8132 is larger than the drain current of the trimming NMOS transistor 8134, the drain current of the PMOS transistor 8132 flows in the drain of the trimming NMOS transistor 8134, and a differential current between the drain current of the PMOS transistor 8132 and the drain current of the trimming NMOS transistor 8134 flows in the NMOS transistor 8136, and is outputted as the determination voltage Vo.

Also, the drain voltage of the PMOS transistor 8131 is outputted as a conversion voltage Vcp.

Figure 18:
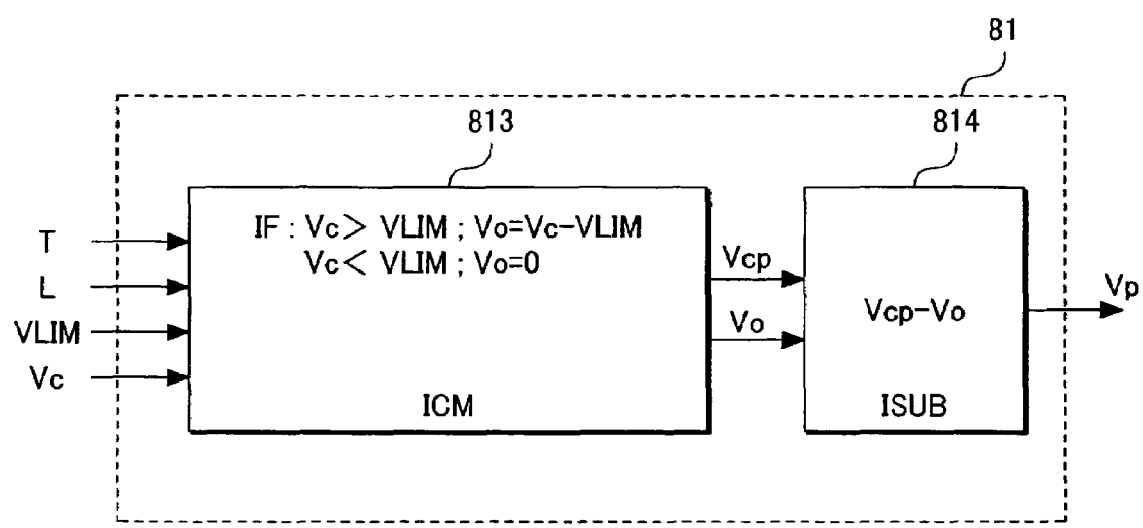
FIG. 18 is a block diagram for explaining a second structural example of a voltage-to-current converter circuit that is used in the voltage controlled oscillator shown in FIG. 4.
Figure 20:
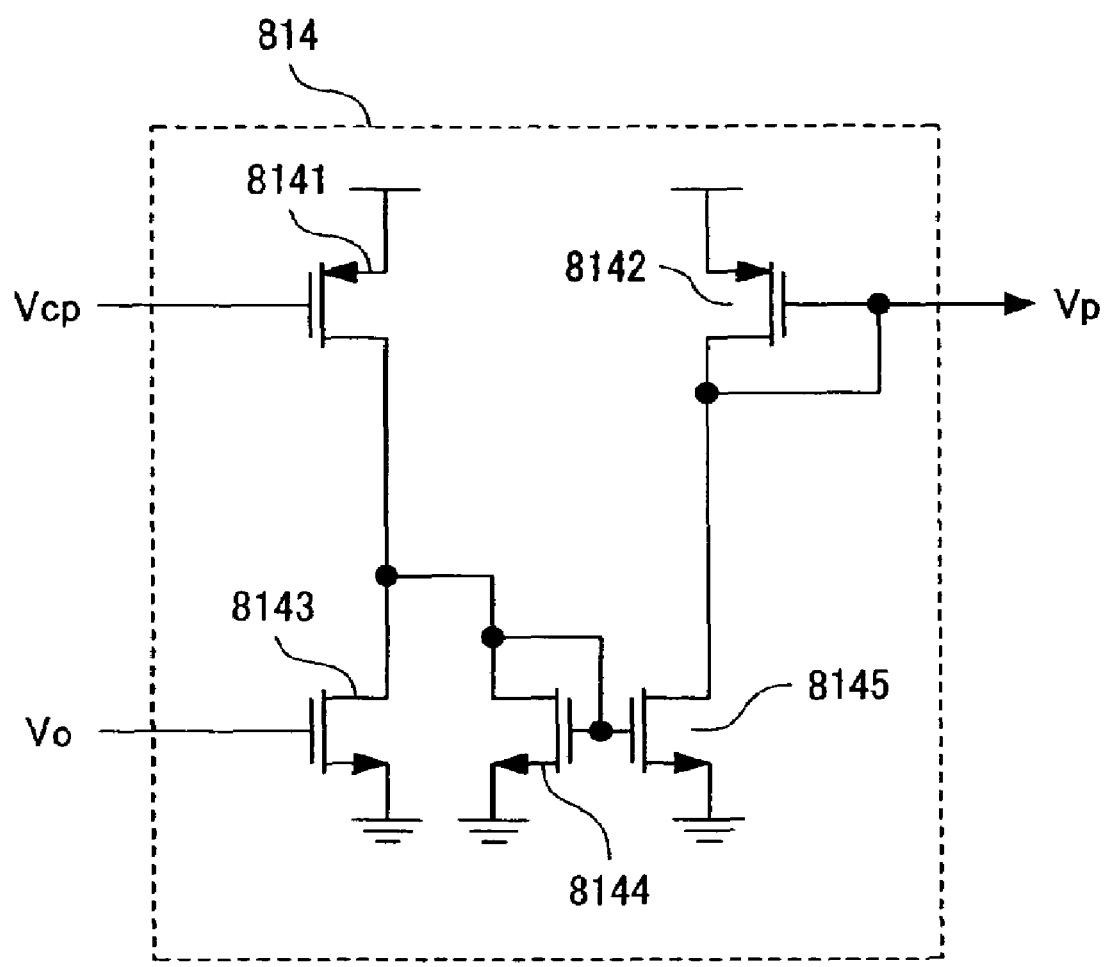
FIG. 20 is a circuit diagram for explaining a structural example of a current subtracter that is used in the second voltage-to-current converter circuit shown in FIG. 18.

FIG. 20 shows a structural example of the current subtracter 814 that is used in the second structural example of the voltage-to-current converter circuit 81 shown in FIG. 18. The current subtracter 814 is made up of PMOS transistors 8141, 8142, and NMOS transistors 8143, 8144, and 8145.

The determination voltage Vo is inputted to the gate of the NMOS transistor 8143. The conversion voltage Vcp is inputted to the gate of the PMOS transistor 8141. The drain of the NMOS transistor 8143 is connected with the PMOS transistor 8141. The subtraction of current is conducted at a node between the drain of the NMOS transistor 8143 and the PMOS transistor 8141. In this example, when it is assumed that the drain current of the NMOS transistor 8143 is Ic, and the drain current of the PMOS transistor 8141 is Ic−Ilim, the drain current of the NMOS transistor 8144 becomes Ic−(Ic−Ilim)=Ilim. On the other hand, when the determination voltage Vo is 0, the drain current of the NMOS transistor 8144 becomes Ic−(0)=Ic.

The current comparator 813 and the current subtracter 814 are associated with each other to provide a limit function, and also to make it possible to realize the VCO 8 which conducts the trimming operation.

Fourth Modified Example

Figure 21:
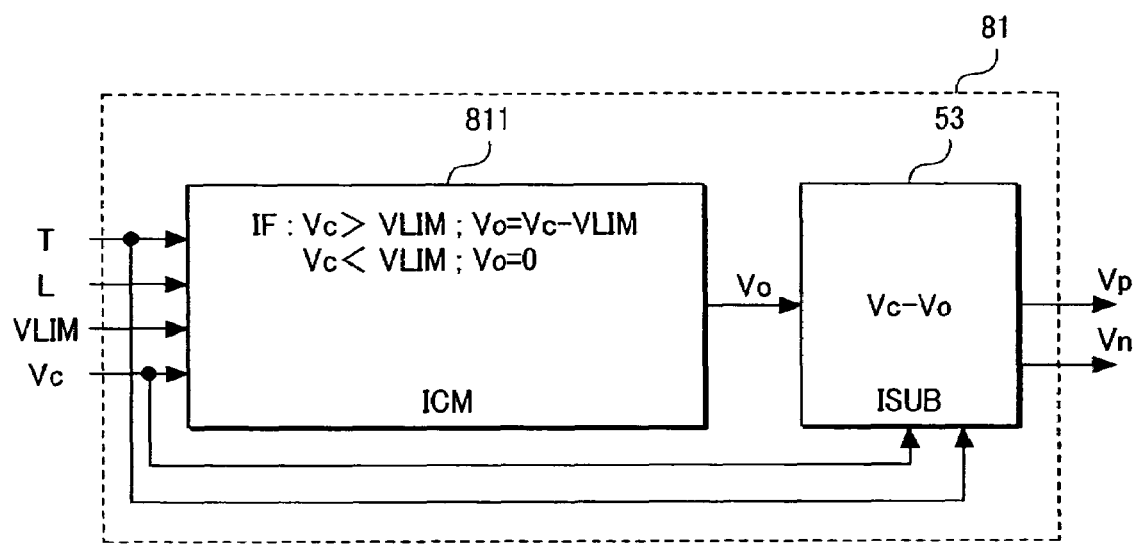
FIG. 21 is a block diagram for explaining a third structural example of the voltage-to-current converter circuit that is used in the voltage controlled oscillator shown in FIG. 4.

Another modified example of the voltage-to-current converter circuit according to the first embodiment will be described with reference to FIGS. 21 to 22. FIG. 21 shows a third structural example of the voltage-to-current converter circuit 81. The third voltage-to-current converter circuit 81 includes a current comparator 811 that inputs the control voltage, the trimming signal, the limit signal, and the base voltage to output the determination voltage, and a current subtracter 53 that inputs the determination voltage, the control voltage, and the trimming signal to output a control signal (Vp, Vn).

Figure 22:
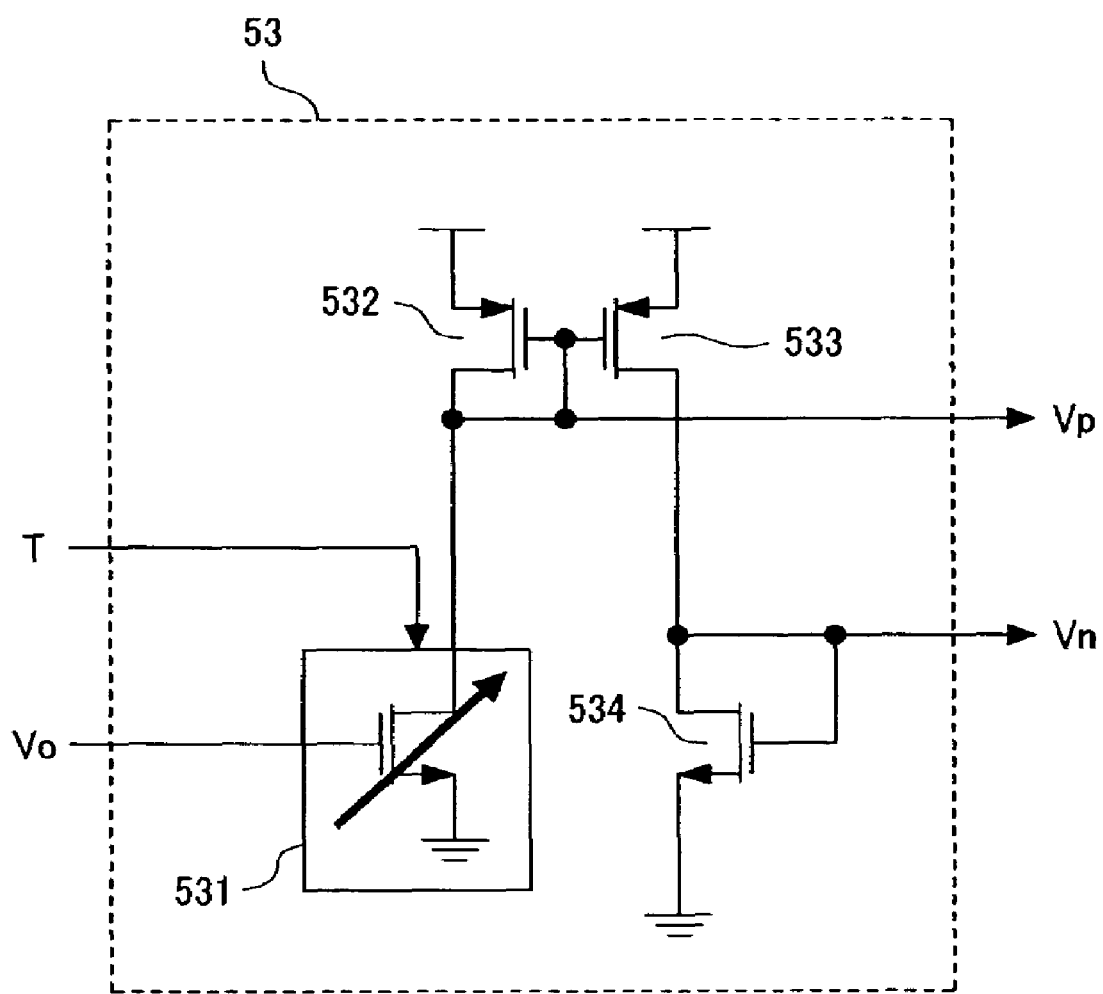
FIG. 22 is a circuit diagram for explaining a structural example of a current subtracter that is used in the third voltage-to-current converter circuit shown in FIG. 21.

FIG. 22 shows a structural example of the current subtracter 53 that is used in the third voltage-to-current converter circuit 81 shown in FIG. 21. The current subtracter 53 has a PMOS transistor 533 in order to output the same voltage as the control voltage Vp from the NMOS transistor 534 as the control voltage Vn in the current subtracter 812 shown in FIG. 10. The operation is identical with that of the current subtracter 812.

Fifth Modified Example

Figure 23:
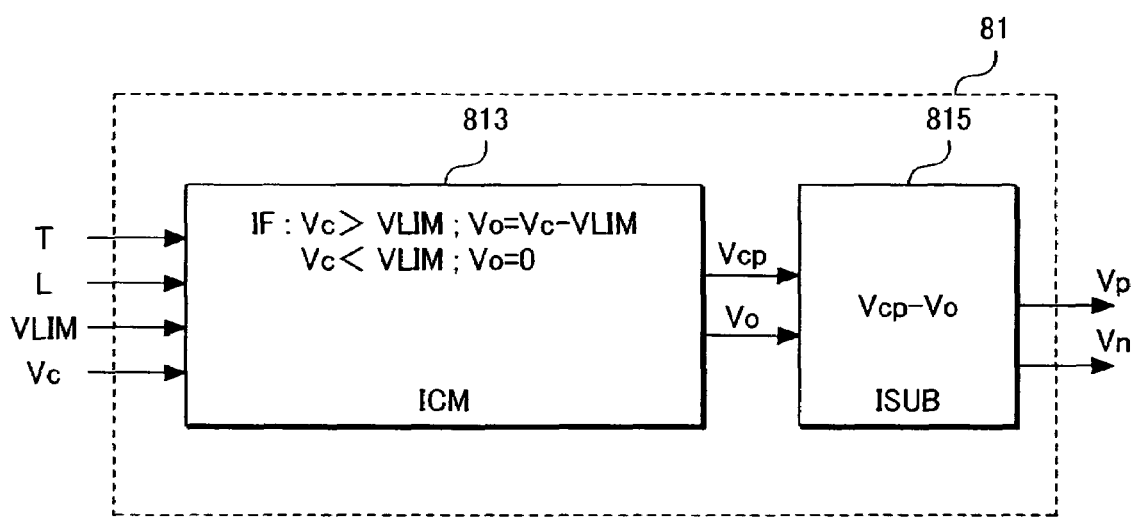
FIG. 23 is a block diagram for explaining a fourth structural example of the voltage-to-current converter circuit that is used in the voltage controlled oscillator shown in FIG. 4.

Another modified example of the first embodiment will be described with reference to FIGS. 23 and 24. FIG. 23 shows a fourth structural example of the voltage-to-current converter circuit 81. The fourth voltage-to-current converter circuit 81 is made up of a current comparator 813 that inputs the control voltage, the trimming signal, the limit signal, and the base voltage to output the conversion voltage and the determination voltage, and a current subtracter 815 that inputs the determination voltage and the conversion voltage to output the control signal (Vp, Vn).

Figure 24:
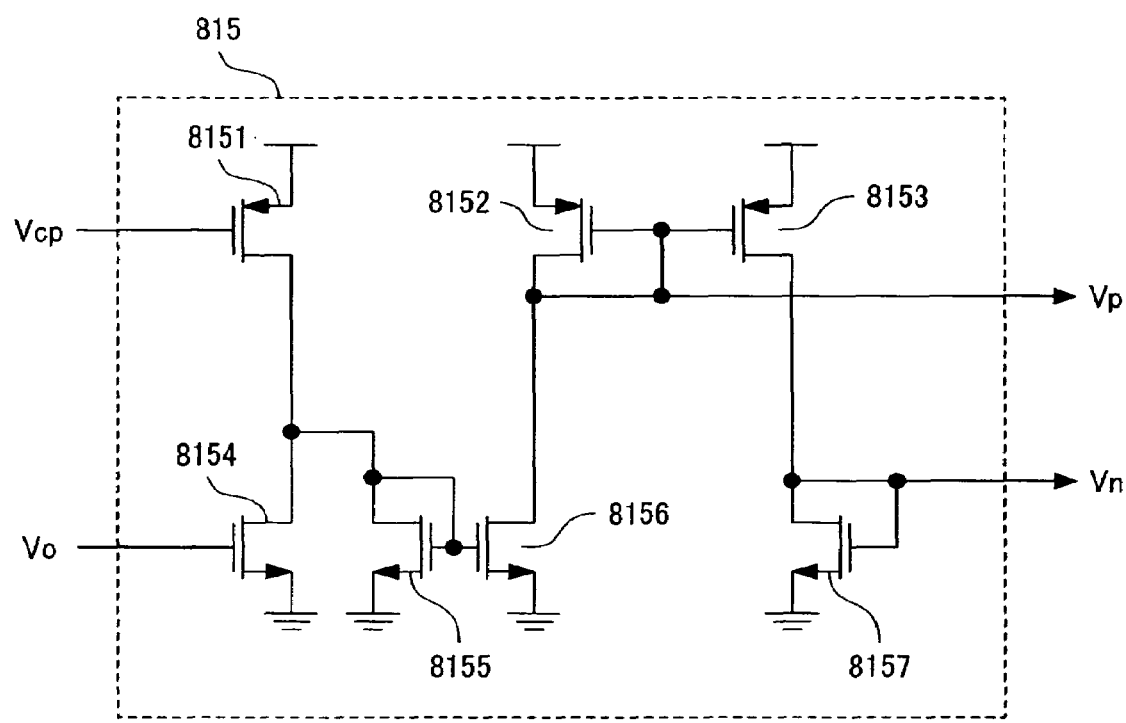
FIG. 24 is a circuit diagram for explaining a structural example of a current subtracter that is used in the voltage-to-current converter circuit shown in FIG. 23.

FIG. 24 shows a structural example of the current subtracter 815 that is used in the fourth voltage-to-current converter circuit 81 shown in FIG. 23. The current subtracter 815 has a PMOS transistor 8153 in order to output the same voltage as the control voltage Vn from the NMOS transistor 8157 as the control voltage Vn in the current subtracter 814 shown in FIG. 20. The operation is identical with that of the current subtracter 814.

Second Embodiment

Subsequently, a description will be given in more detail of a second embodiment of the present invention with reference to FIGS. 25 to 32.

Figure 25:
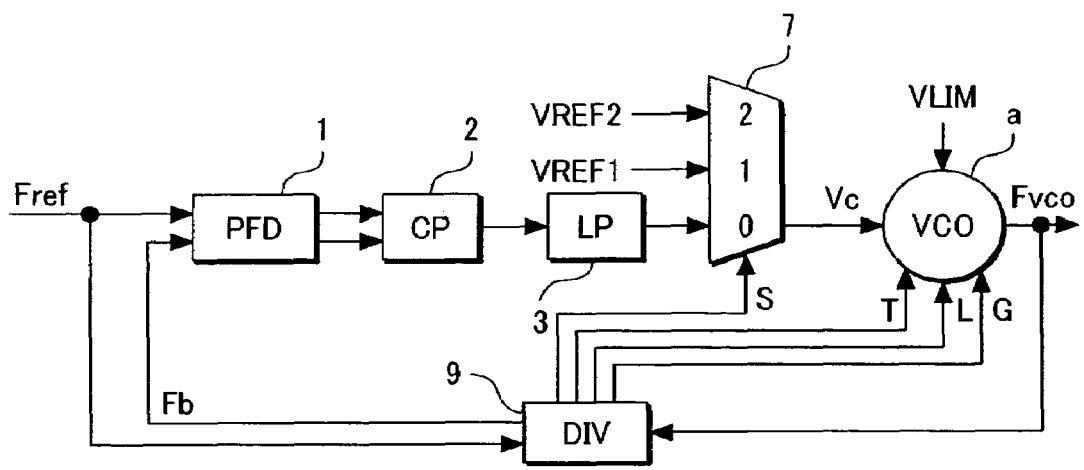
FIG. 25 is a block diagram for explaining an automatic adjustment phase locked loop circuit according to a second embodiment of the present invention.

First, a description will be given of a phase locked loop circuit (PLL) according to an embodiment of the present invention. FIG. 25 shows the structure of the PLL according to this embodiment.

The PLL according to this embodiment comprises:

a phase frequency comparator 1 that inputs a reference signal (Fref) and a feedback signal (Fb) to output a phase comparison signal;

a charge pump 2 that inputs the phase comparison signal to output a pulse signal;

a loop filter 3 that converts the pulse signal to a DC signal;

a selector 7 that selects the DC signal, a first reference voltage (VREF1), and a second reference voltage (VREF2) according to a select signal (S) to output a control voltage (Vc);

a voltage controlled oscillator (VCO)-a that inputs the control voltage, a base voltage (VLIM), a trimming signal (T), a limit signal (L), and a gain signal (G), changes the frequency of an output signal (Fvco) according to the control voltage so as to limit the upper limit frequency of the output signal, and so as to change the frequency sensitivity of the output signal that is outputted with respect to the control voltage according to the trimming signal, the upper limit frequency of the output signal according to the limit signal, and the upper limit frequency limit characteristic according to the gain signal; and a frequency divider 9 that inputs the output signal and the reference signal, divides the output signal, outputs the feedback signal, and outputs the select signal, the trimming signal, the limit signal, and the gain signal from the output signal.

Figure 26:
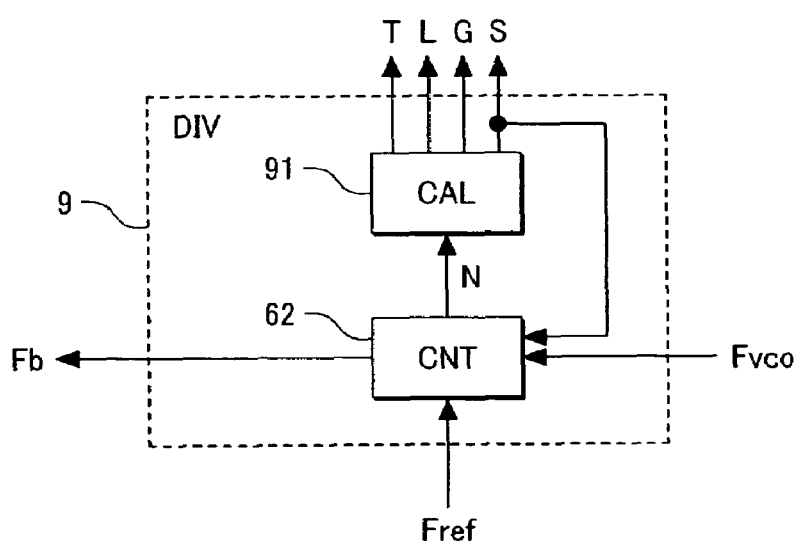
FIG. 26 is a block diagram for explaining a first structural example of a frequency divider that is used in the automatic adjustment phase locked loop circuit shown in FIG. 25.

FIG. 26 shows a structural example of the frequency divider 9. The frequency divider 9 is made up of a counter (frequency division unit) 62 that inputs the output signal of the VCO-a, the reference signal, and the select signal to output the feedback signal and the count result (N), and a calibration circuit (calibration unit) 91 that inputs the count result to output the select signal, the trimming signal, the limit signal, and the gain signal from the count result.

The PLL of this embodiment takes two operating states consisting of a calibration period during which the frequency characteristic of the VCO-a is adjusted, and a PLL convergence period during which the converging operation of the normal PLL is conducted after the VCO-a has been adjusted.

First, the calibration period will be described. In the calibration period, the determination is repeated until the output signal of the VCO-a satisfies a given frequency, and the trimming signal, the limit signal, and the gain signal are updated. The operation will be described in more detail.

When the calibration starts, the select signal S becomes 1, the frequency divider 9 does not output the feedback signal, and the selector 7 selects the first reference voltage so that the PLL loop becomes an open loop. Also, the selector 7 resets the trimming signal, the limit signal, and the gain signal so that the trimming signal T becomes 0, the limit signal L becomes X, and the gain signal G becomes X, respectively. In this situation, the frequency divider 9 starts to determine the frequency of the output signal.

When the frequency divider 9 determines that the frequency of the output signal is lower than the given frequency, the frequency divider 9 updates the trimming signal, and again determines the frequency of the output signal as T=1.

The frequency divider 9 updates the trimming signal until the frequency of the output signal becomes equal to or higher than the given frequency.

After the frequency divider 9 updates the trimming signal, and sets the output signal to a given frequency or higher, the frequency divider 9 sets the trimming signal to a value obtained when the frequency of the output signal becomes equal to or higher than the given frequency through the above operation, and resets the limit signal to L=0. In this state, the frequency divider 9 starts to determine the frequency of the output signal.

When the frequency divider 9 determines that the frequency of the output signal is lower than the given frequency, the frequency divider 9 updates the limit signal, and again determines the frequency of the output signal as L=1. The frequency divider 9 updates the limit signal until the frequency of the output signal becomes equal to or higher than the given frequency.

After the frequency divider 9 updates the limit signal, and sets the output signal to the given frequency or higher, the frequency divider 9 stores the count value of this time as N1. Also, the frequency divider 9 updates the select signal as S=2.

In this situation, the selector 7 selects the second reference voltage. In addition, the frequency divider 9 sets the trimming signal to a value obtained at the time where the frequency of the output signal becomes equal to or higher than the given frequency through the above operation. Then, the frequency divider 9 sets the limit signal to a value obtained at the time where the frequency of the output signal becomes equal to or higher than the given frequency through the above operation. The feedback signal is not outputted. In this state, the frequency divider 9 starts to determine the frequency of the output signal.

When the frequency divider 9 determines that the frequency of the output signal is lower than the given frequency, the frequency divider 9 updates the limit signal, and again determines the frequency of the output signal as L=L+1. The frequency divider 9 updates the limit signal until the frequency of the output signal becomes equal to or higher than the given frequency.

After the frequency divider 9 updates the limit signal, and sets the output signal to the given frequency or higher, the frequency divider 9 compares a count value N2 of this time with the stored count value N1. When the comparison result is N2<N1, the frequency divider 9 updates the gain signal as G=X−1. The frequency divider 9 updates the gain signal until the comparison becomes N2>N1. The frequency divider 9 resets the select signal as S=0 when the comparison result is N2>N1.

In this situation, the selector 7 selects the loop filter, and the frequency divider 9 sets the trimming signal, the limit signal, and the gain signal to values obtained when the frequency of the output signal becomes equal to or higher than the given frequency through the above operation, outputs the feedback signal, and sets the PLL loop to the closed loop. In this state, the PLL is shifted to the convergence period.

Subsequently, the structure and operation of the VCO-a that realizes the above operation will be described.

Figure 27:
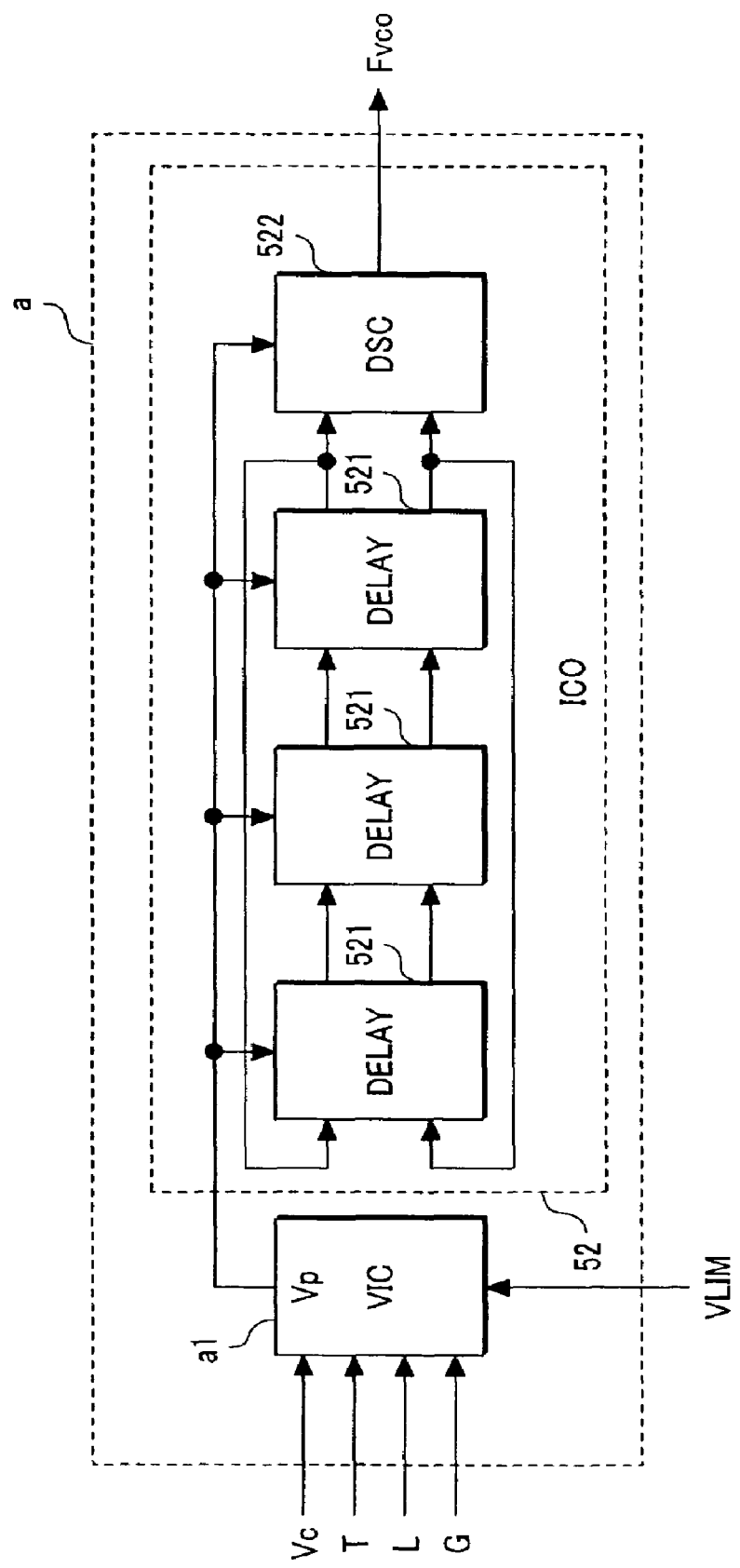
FIG. 27 is a block diagram for explaining a first structural example of a voltage controlled oscillator that is used in the automatic adjustment phase locked loop circuit shown in FIG. 25.

FIG. 27 shows a first structural example of the VCO-a. The VCO-a is made up of a voltage-to-current converter circuit a1 that inputs the control voltage, the trimming signal, the limit signal, and the base voltage to output the control signal, and a current controlled oscillator (ICO) 52 that adjusts the delay amount according to the control signal to control the frequency of the output signal. The ICO 52 is made up of a ring oscillator having plural delay circuits 521 connected in the form of a ring. Each of the delay circuits 521 is capable of adjusting the delay amount according to the control signal. The ICO 52 has a differential single converter 522 connected to the output of the ring oscillator. The differential signal converter 522 converts a differential signal to a single signal. The delay circuits 521 may be structured, for example, by the circuit shown in FIG. 5.

Figure 28:
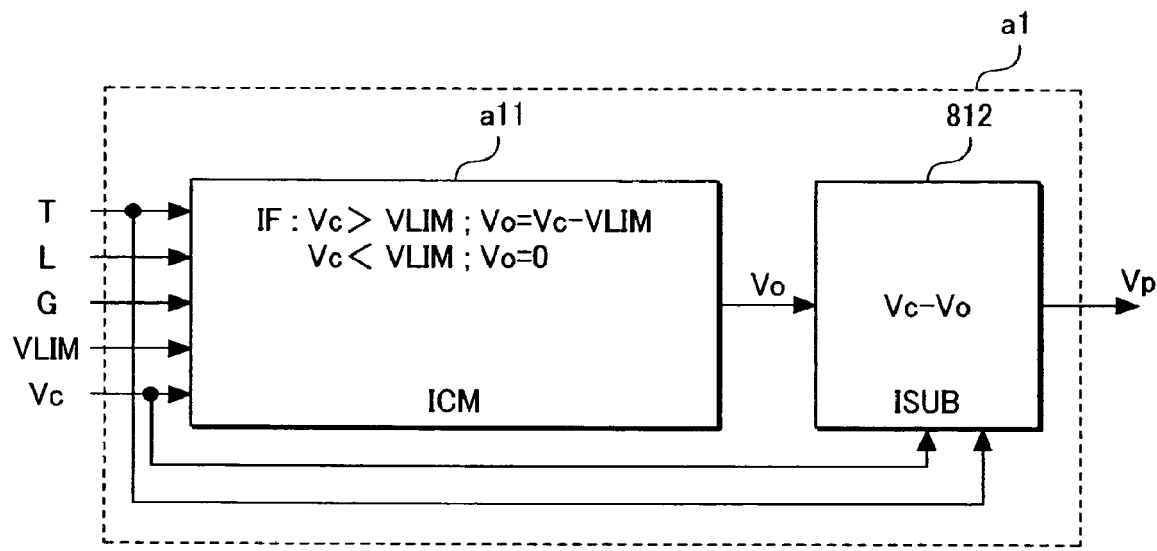
FIG. 28 is a block diagram for explaining a first structural example of a voltage-to-current converter circuit that is used in the voltage controlled oscillator shown in FIG. 27.

FIG. 28 shows a first structural example of the voltage-to-current converter circuit a1. The voltage-to-current converter circuit a1 includes a current comparator a11 that inputs the control voltage, the trimming signal, the limit signal, and the base voltage to output the determination voltage, and a current subtracter 812 that inputs the determination voltage, the control voltage, and the trimming signal to output the control signal.

Hereinafter, the operation of the voltage-to-current converter circuit a1 will be described.

In the basic operation of the current comparator a11, the current comparator a11 compares the control voltage with the base voltage, and outputs Vo=Vc−VLIM when Vc>VLIM, and Vo=0 when Vc<VLIM.

The trimming signal allows the value of the control voltage Vc during the comparing operation to be adjusted. The limit signal allows the value of the base voltage VLIM during the comparing operation to be adjusted. The gain signal allows the characteristic of the determination voltage Vo to be adjusted.

Figure 29:
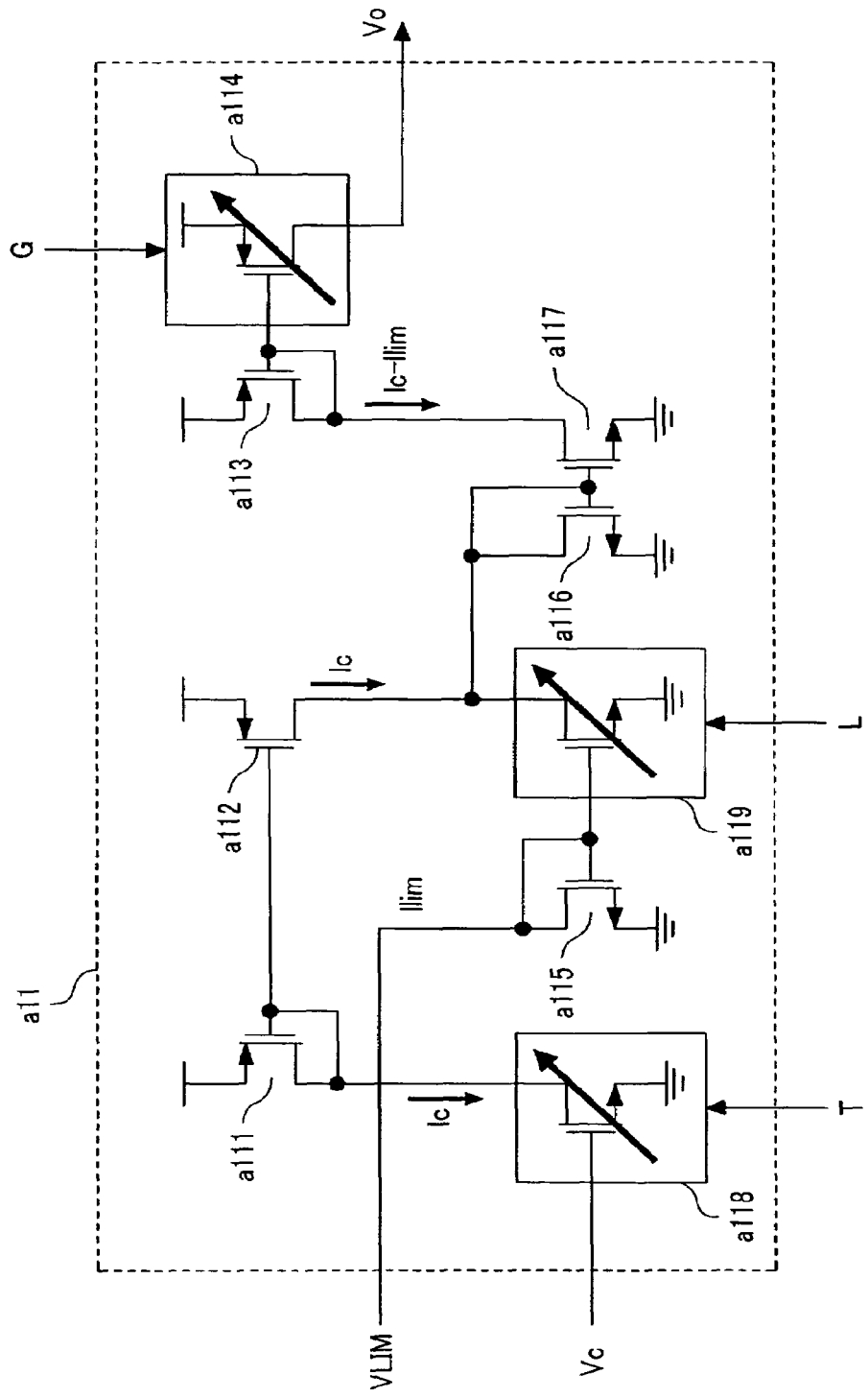
FIG. 29 is a circuit diagram for explaining a first structural example of a current comparator that is used in the first voltage-to-current converter circuit shown in FIG. 28.

FIG. 29 shows a first structural example of the current comparator a11. The current comparator a11 is made up of PMOS transistors a111 to a113, a trimming PMOS transistor a114, NMOS transistors a115 to a117, and trimming NMOS transistors a118 to a119.

The control voltage Vc is inputted to the gate of the trimming NMOS transistor a118.

The trimming NMOS transistor a118 shown in FIG. 29 converts the inputted control voltage Vc to a current and outputs the converted current so as to change the conversion value according to the magnitude of the trimming signal T.

In the first structural example of the current comparator a11 shown in FIG. 29, the control voltage Vc is inputted to the trimming NMOS transistor a118 to generate the current Ic. In this example, it is possible to adjust the magnitude of the Ic according to the trimming signal T. The PMOS transistors a111 and a112 form a current mirror, and transmits the Ic to the drain of the PMOS transistor a112. The base voltage VLIM is inputted to the drain of the NMOS transistor a115 as the current Ilim. The NMOS transistor a115 and the trimming NMOS transistor a119 form a current mirror, and the drain current of the NMOS transistor a115 increases a mirror ratio times to produce the drain current of the trimming NMOS transistor a119. In this example, the limit signal L changes the mirror ratio to change the drain current of the trimming NMOS transistor a119. The subtraction of current is conducted at a node between the drain of the PMOS transistor a112 and the drain of the trimming NMOS transistor a119.

When the drain current of the PMOS transistor a112 is smaller than the drain current of the trimming NMOS transistor a119, a11 of the drain current of the PMOS transistor a112 flows in the drain of the trimming NMOS transistor a119, but the drain current does not flow in the NMOS transistor a116. Hence, the NMOS transistor a116 turns off, and the NMOS transistor a117, the PMOS transistor a113, and the trimming PMOS transistor a114 also turn off.

On the other hand, when the drain current of the PMOS transistor a112 is larger than the drain current of the trimming NMOS transistor a119, the drain current of the PMOS transistor a112 flows in the drain of the trimming NMOS transistor a119, and a differential current between the drain current of the PMOS transistor a112 and the drain current of the trimming NMOS transistor a119 flows in the NMOS transistor a116. The NMOS transistors a116 and a117 form a current mirror at the mirror ratio of 1:1, and the differential current flows in the drain of the NMOS transistor a117. The PMOS transistor a113 and the trimming PMOS transistor a114 form a current mirror, and the drain current of the PMOS transistor a113 increases a mirror ratio times to produce the drain current of the trimming PMOS transistor a114. In this example, the gain signal G changes the mirror ratio to change the drain current of the trimming PMOS transistor a114.

The drain current of the trimming PMOS transistor a114 is outputted as the determination voltage Vo.

Figure 31A:
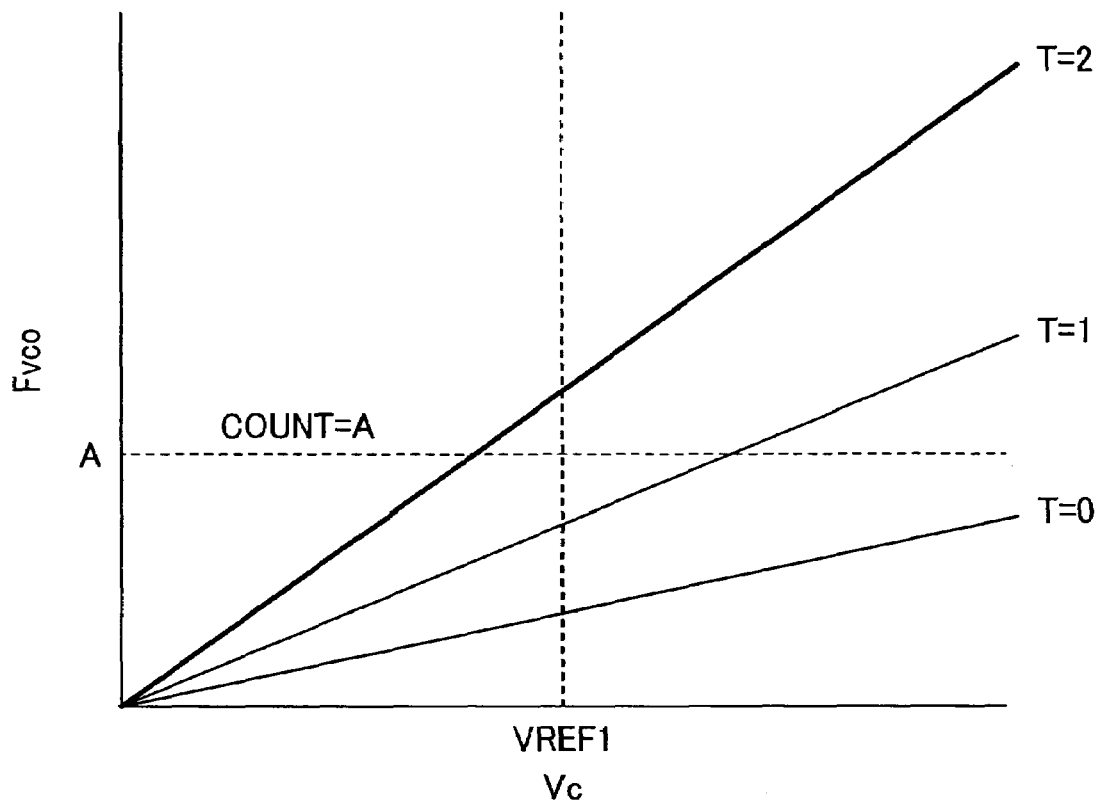
FIG. 31A is a diagram for explaining a method of trimming the frequency sensitivity of the voltage controlled oscillator according to a trimming signal in the automatic adjustment phase locked loop circuit shown in FIG. 25.
Figure 31B:
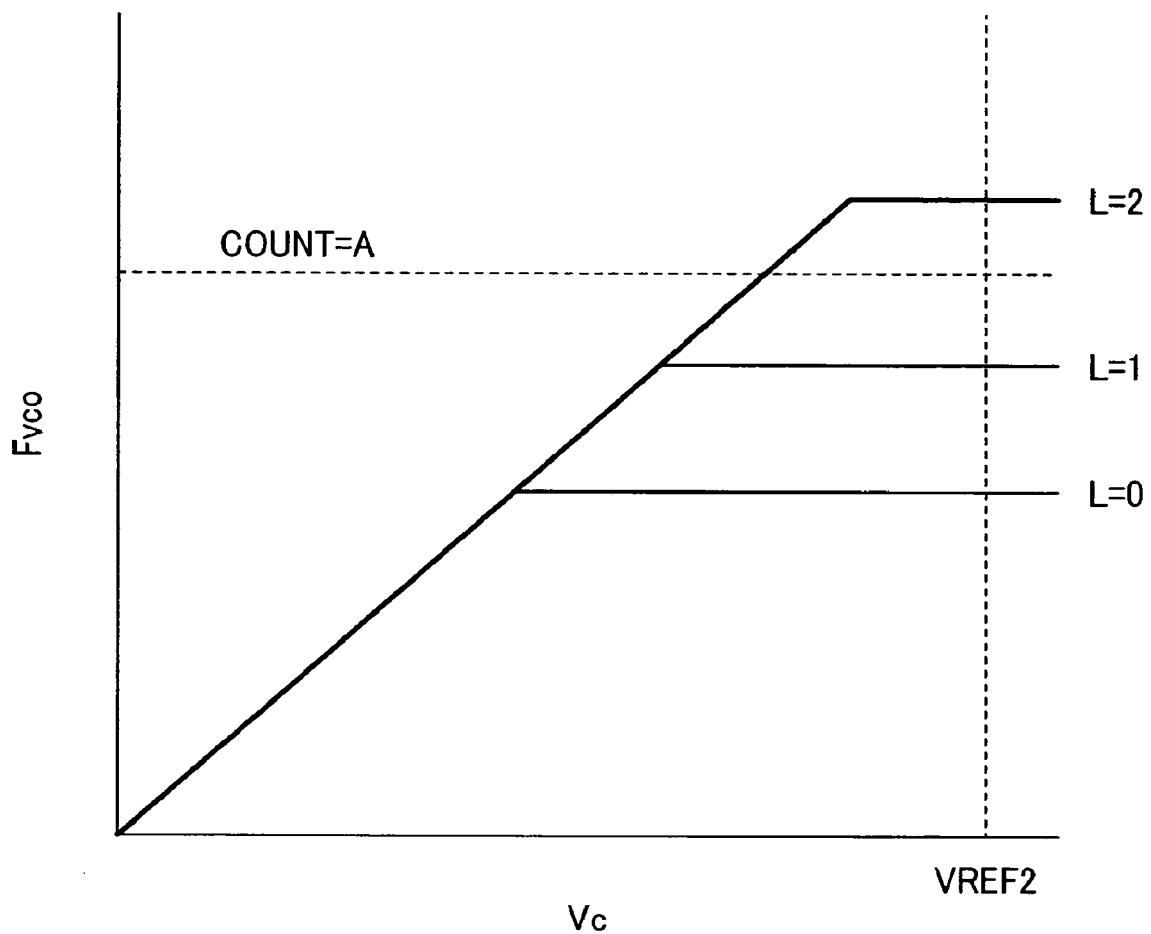
FIG. 31B is a diagram for explaining a method of trimming the upper limit frequency of the voltage controlled oscillator according to a limit signal in the automatic adjustment phase locked loop circuit shown in FIG. 25.
Figure 32:
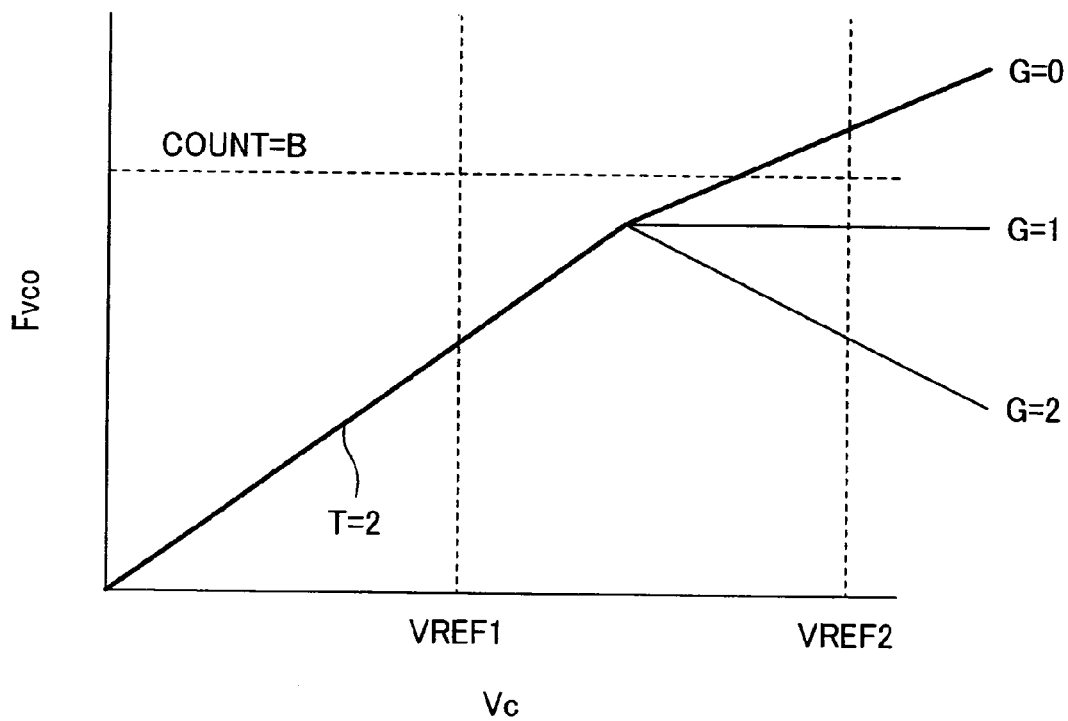
FIG. 32 is a diagram for explaining a method of trimming the gain of the voltage controlled oscillator according to a limit signal in the automatic adjustment phase locked loop circuit shown in FIG. 25.

Subsequently, the operation of the second embodiment will be described in more detail with reference to FIGS. 30 to 32.

Figure 30:
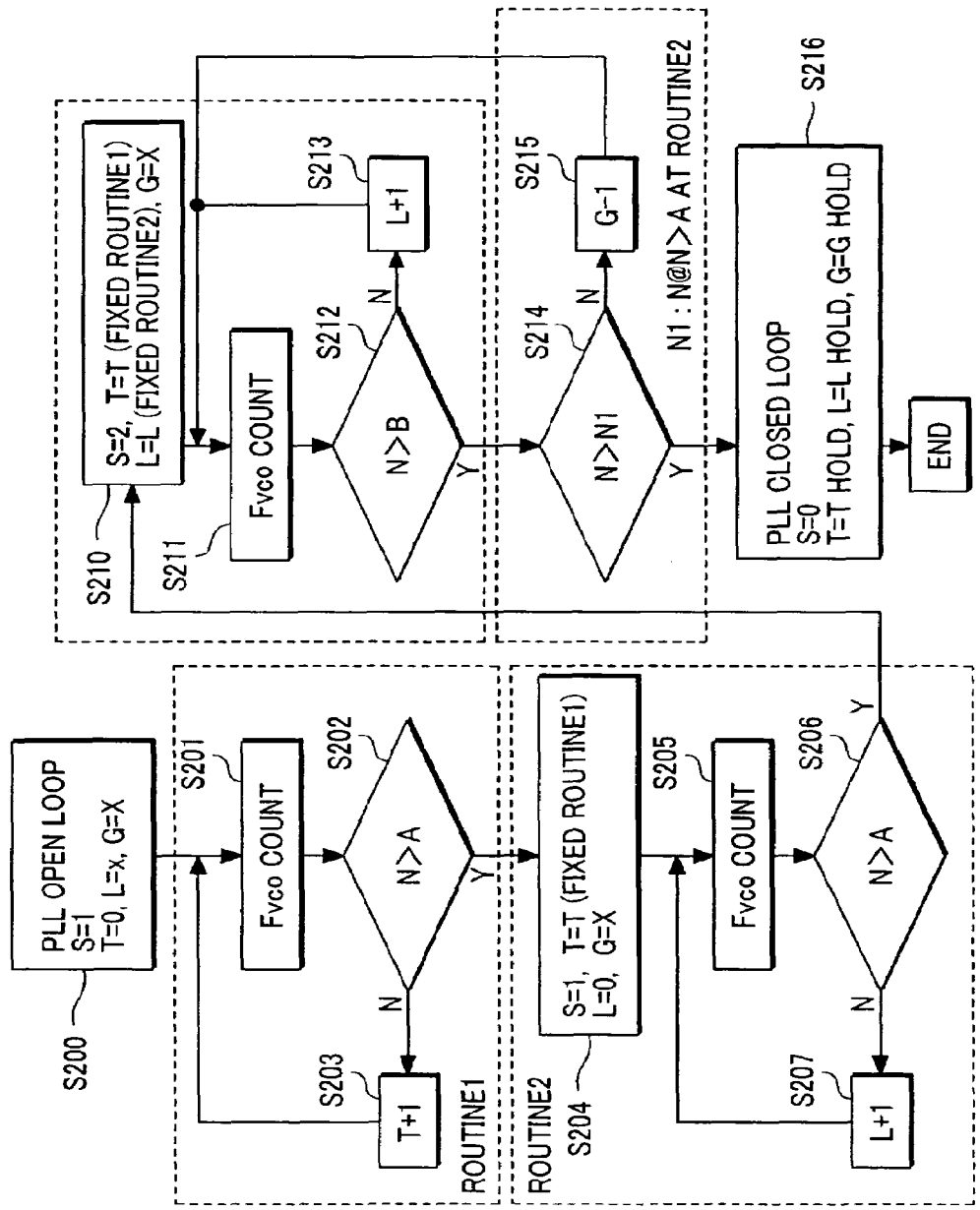
FIG. 30 is a trimming flowchart for explaining the operation sequence of the automatic adjustment phase locked loop circuit shown in FIG. 25.

FIG. 30 shows a sequence for explaining the operation of the frequency divider 6.

When the calibration starts, the select signal S becomes 1, and the frequency divider 9 does not output the feedback signal. Also, the frequency divider 9 resets the trimming signal, the limit signal, and the gain signal as T=0, L=X, and G=X, respectively (S200). In this state, the counter 62 starts to count the output signals within the count interval (S201).

The calibration circuit 91 to which the count result has been inputted conducts the determination (S202). In other words, as shown in FIG. 31A, the calibration circuit 91 determines whether the output frequency of the VCO-a corresponding to the trimming signal T exceeds the given value A in the first reference voltage (VREF1), or not.

When the calibration circuit 91 determines that the count result N is lower than the given value A, the calibration circuit 91 updates the trimming signal, outputs T=T+1 (S203), and again counts the output signals. The calibration circuit 91 updates the trimming signal until the count result N becomes equal to or higher than the given value A (S201 to S203).

After the calibration circuit 91 updates the trimming signal, and sets the count result N to the given value A or higher, the frequency divider 9 sets the trimming signal to a value obtained when the frequency of the output signal becomes equal to or higher than the given frequency through the above operation, and holds the set value in the memory (S204). Then, the frequency divider resets the reset signal to L=0. In this state, the frequency divider 9 starts to determine the frequency of the output signal (S205).

When the calibration circuit 91 determines that the count result N is lower than the given value A (S206), the calibration circuit 91 then updates the limit signal, and again determines the frequency of the output signal as L=1 (S207). The calibration circuit 91 updates the limit signal until the frequency of the output signal becomes equal to or higher than the given value A (S205 to S207). In other words, as shown in FIG. 31B, the calibration circuit 91 determines whether the output frequency of the VCOa corresponding to the limit signal L exceeds the given value A in the second reference voltage (VREF2), or not.

After the calibration circuit 91 updates the limit signal, and sets the output signal to the given frequency or higher, the calibration circuit 91 stores the count value of this time as N1. Also, the frequency divider 9 updates the select signal as S=2. In this situation, the frequency divider 9 sets the trimming signal to a value (T) obtained at the time where the frequency of the output signal becomes equal to or higher than the given frequency through the above operation. Then, the frequency divider 9 sets the limit signal to a value (L) obtained at the time where the frequency of the output signal becomes equal to or higher than the given frequency through the above operation. The frequency divider 9 resets the gain signal to G=X, and the feedback signal is not outputted (S210).

In this state, the frequency divider 9 starts to determine the frequency of the output signal (S211). That is, as shown in FIG. 32, the gain signal determines whether the output frequency of the VCO-a corresponding to G exceeds the given value B in the second reference voltage (VREF2), or not.

When the calibration circuit 91 determines that the count result N is lower than the given value B, the calibration circuit 91 updates the limit signal, and again determines the frequency of the output signal as L=L+1. The frequency divider 9 updates the limit signal until the frequency of the output signal becomes equal to or higher than the given value B (S211 to S213).

After the calibration circuit 91 updates the limit signal, and sets the output signal to the given value B or higher, the calibration circuit 91 then compares a count value N2 of this time with the stored count value N1 (S214). When the comparison result is N2<N1, the calibration circuit 91 updates the gain signal as G=X−1 (S215). The frequency divider 9 updates the gain signal until the comparison becomes N2>N1. The frequency divider 9 resets the select signal as S=0 when the comparison result is N2>N1 (S216).

In this situation, the selector 7 selects the loop filter, and the frequency divider 6 sets the trimming signal, the limit signal, and the gain signal to values obtained when the frequency of the output signal becomes equal to or higher than the given frequency through the above operation, outputs the feedback signal, and sets the PLL loop to the closed loop. In this state, the PLL is shifted to the convergence period.

According to this embodiment, it is possible to mass-produce and inexpensively provide a phase locked loop circuit which automatically adjusts the sensitivity of the frequency and the upper limit frequency of the VCO, and which satisfies a desired characteristic with respect to signals which are in a wide frequency range of from a low frequency to a high frequency even if there occurs a remarkable process variation in a fine process or a variation in the characteristic due to the environmental variation since the VCO sets the upper limit frequency to a value that is lower than the highest operating frequency of the logic circuit.

Sixth Modified Example

Figure 33:
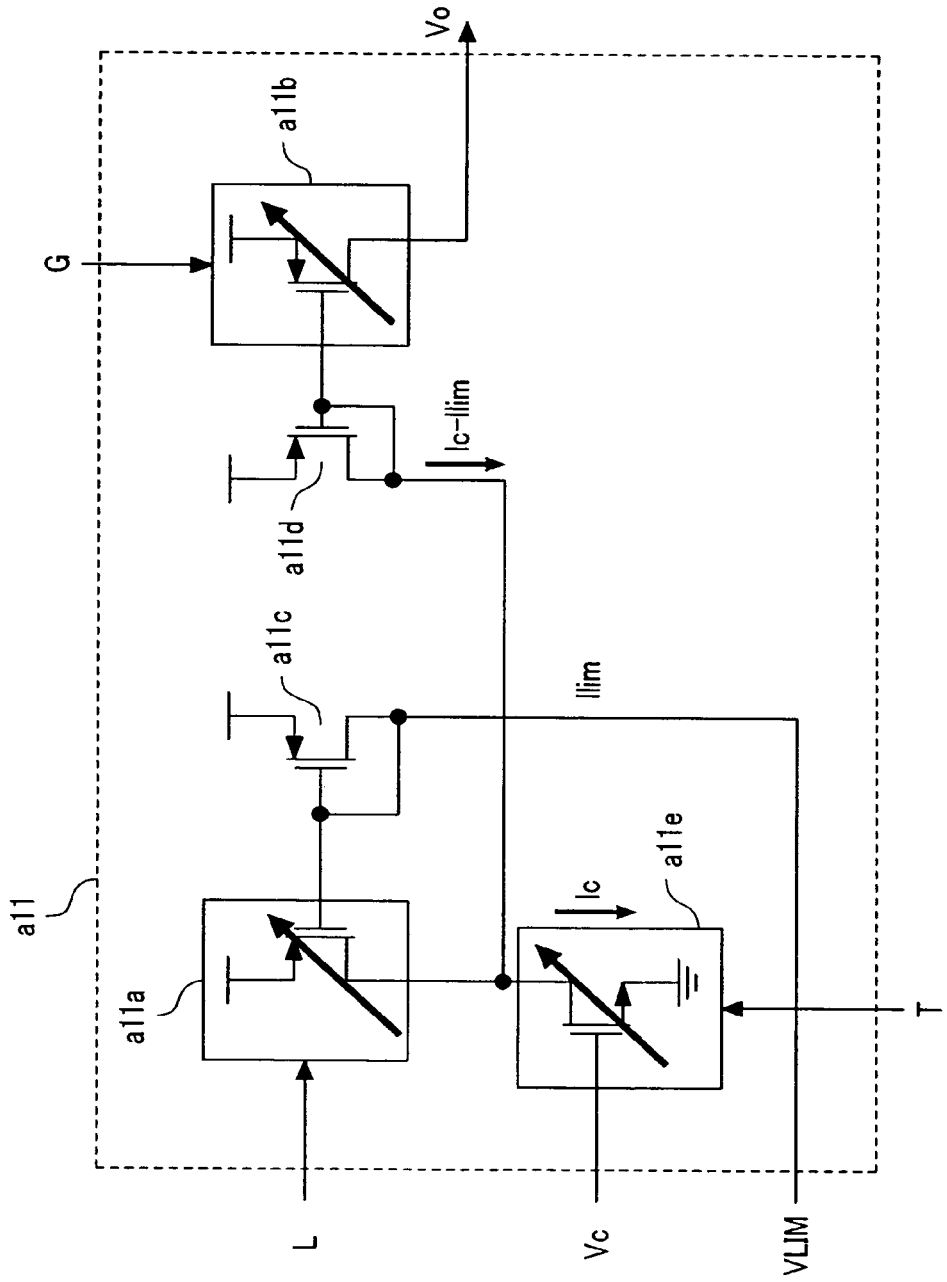
FIG. 33 is a circuit diagram for explaining a second structural example of a current comparator that is used in the first voltage-to-current converter circuit shown in FIG. 29.

As a modified example of the second embodiment, FIG. 33 shows a second structural example of the current comparator a11. The second structural example of the current comparator a11 is made up of trimming PMOS transistors a11a, a11b, PMOS transistors a11c to a11d, and a trimming NMOS transistor a11e.

The trimming NMOS transistor a11e conducts the same operation as that of the trimming NMOS transistor 8118 of the first current comparator 811.

The base voltage VLIM is inputted to the drain of the PMOS transistor a11c as the current Ilim. The PMOS transistor a11c and the trimming PMOS transistor a11a form a current mirror, and the drain current of the PMOS transistor a11c increases a mirror ratio times to produce the drain current of the trimming PMOS transistor a11a. In this example, the limit signal L changes the mirror ratio to change the drain current of the trimming PMOS transistor a11a. The subtraction of current is conducted at a node between the drain of the trimming PMOS transistor a11a and the drain of the trimming NMOS transistor a11e.

When the drain current of the trimming NMOS transistor a11e is smaller than the drain current of the trimming PMOS transistor a11a, the PMOS transistor a11d turns off, and the trimming PMOS transistor a11b also turns off.

On the other hand, when the drain current of the trimming NMOS transistor a11e is larger than the drain current of the trimming PMOS transistor a11a, a difference current between the drain current of the trimming NMOS transistor a11e and the drain current of the trimming PMOS transistor a11a flows in the PMOS transistor a11d. The PMOS transistors a11d and the trimming PMOS transistor a11b form a current mirror, and the drain current of the PMOS transistor a11d increases a mirror ratio times to produce the drain current of the trimming PMOS transistor a11b. In this example, the gain signal G changes the mirror ratio to change the drain current of the trimming PMOS transistor a11b.

The drain current of the trimming PMOS transistor a11b is outputted as the determination voltage Vo.

The current subtracter 812 has the same structure as that described above, thereby making it possible to provide the limit function and to realize the VCOa that performs the above trimming operation. When the upper limit frequency characteristic can be adjusted by the gain signal, it is possible to prevent the unstable lock operation where there are two PLL lock points from being conducted because the negative limit characteristic is obtained due to the process variation.

Seventh Modified Example

Figure 34:
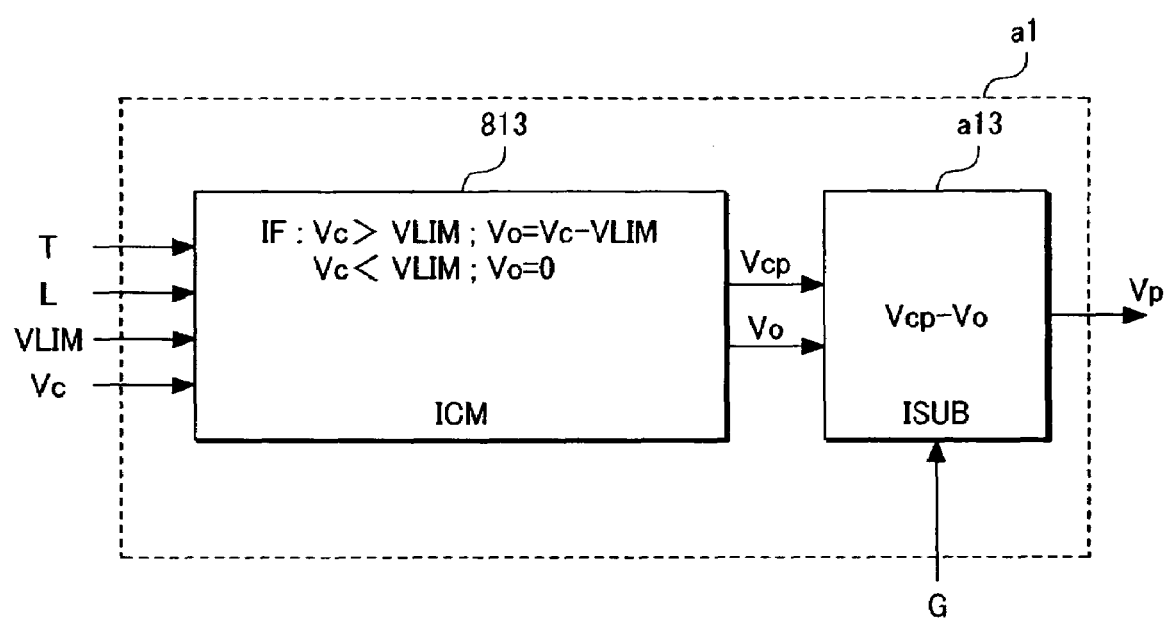
FIG. 34 is a block diagram for explaining a second structural example of a voltage-to-current converter circuit that is used in the voltage controlled oscillator shown in FIG. 27.
Figure 35:
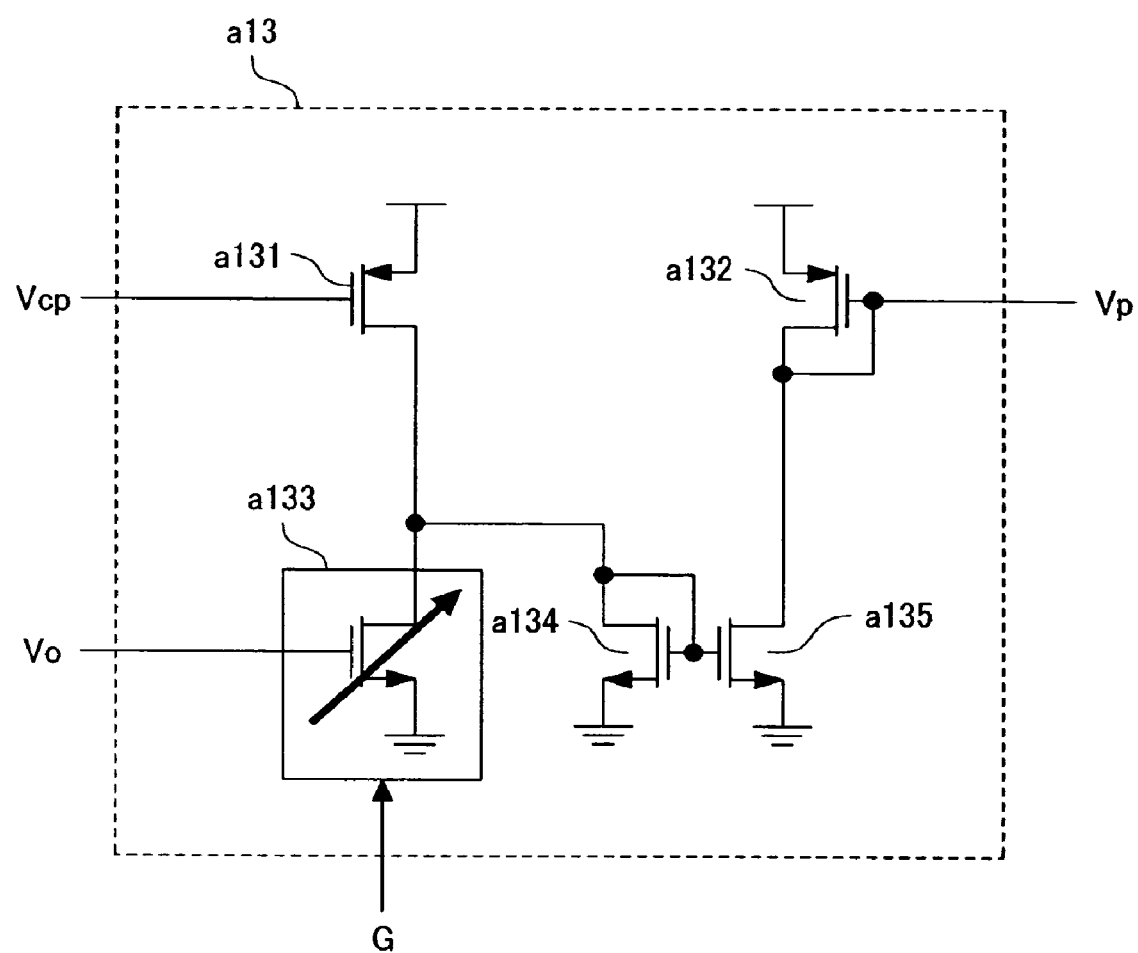
FIG. 35 is a circuit diagram for explaining a structural example of a current subtracter that is used in the voltage-to-current converter circuit shown in FIG. 34.

A modified example of the second embodiment is shown in FIGS. 34 and 35.

FIG. 34 shows a second structural example of the voltage-to-current converter circuit a1. The second voltage-to-current converter circuit a1 includes a current comparator 813 that inputs the control voltage, the trimming signal, the limit signal, and the base voltage to output the conversion voltage and the determination voltage, and a current subtracter a13 that inputs the gain signal, the determination voltage, and the conversion voltage to output the control signal.

The operation of the second voltage-to-current converter circuit a1 is identical with the first voltage-to-current converter circuit a1, and therefore will be omitted from description.

FIG. 35 shows a structural example of the current subtracter a13 that is used in the second voltage-to-current converter circuit a1 shown in FIG. 34.

The current subtracter a13 is made up of PMOS transistors a131, a132, a trimming NMOS transistor a133, and NMOS transistors a134, a135.

The determination voltage Vo is inputted to the gate of the trimming NMOS transistor a133. The conversion voltage Vcp is inputted to the gate of the PMOS transistor a131. The drain of the trimming NMOS transistor a133 is connected with the PMOS transistor a131. The subtraction of current is conducted at a node between the drain of the trimming NMOS transistor a133 and the drain of the PMOS transistor a131. In this example, when it is assumed that the drain current of the NMOS transistor a133 is Ic, and the drain current of the PMOS transistor a131 is Ic−Ilim, the drain current of the NMOS transistor a134 becomes Ic−(Ic−Ilim)=Ilim. On the other hand, when the determination voltage Vo is 0, the drain current of the NMOS transistor a134 becomes Ic−(0)=Ic.

The drain current of the trimming NMOS transistor a133 can be adjusted by the gain signal.

The current subtracter a13 makes it possible to provide the limit function and also to realize the VCOa that performs the above trimming operation. When the upper limit frequency characteristic can be adjusted by the gain signal, it is possible to prevent the unstable lock operation where there are two PLL lock points from being conducted because the negative limit characteristic is obtained due to the process variation.

Eighth Modified Example

Figure 36:
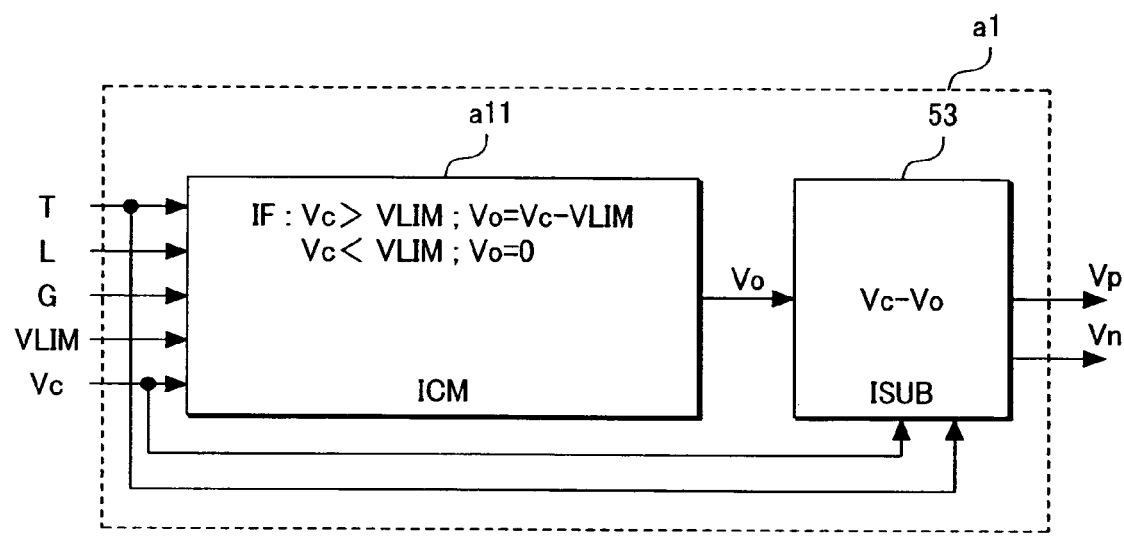
FIG. 36 is a block diagram for explaining a third structural example of a voltage-to-current converter circuit that is used in the voltage controlled oscillator shown in FIG. 27.

As a modified example of the second embodiment, FIG. 36 shows a third structural example of the voltage-to-current converter circuit a1. The third voltage-to-current converter circuit a1 includes a current comparator a11 that inputs the control voltage, the trimming signal, the limit signal, the gain signal, and the base voltage to output the determination voltage, and a current subtracter 53 that inputs the determination voltage, the control voltage, and the trimming signal to output the control signal (Vp, Vn).

Ninth Modified Example

Figure 37:
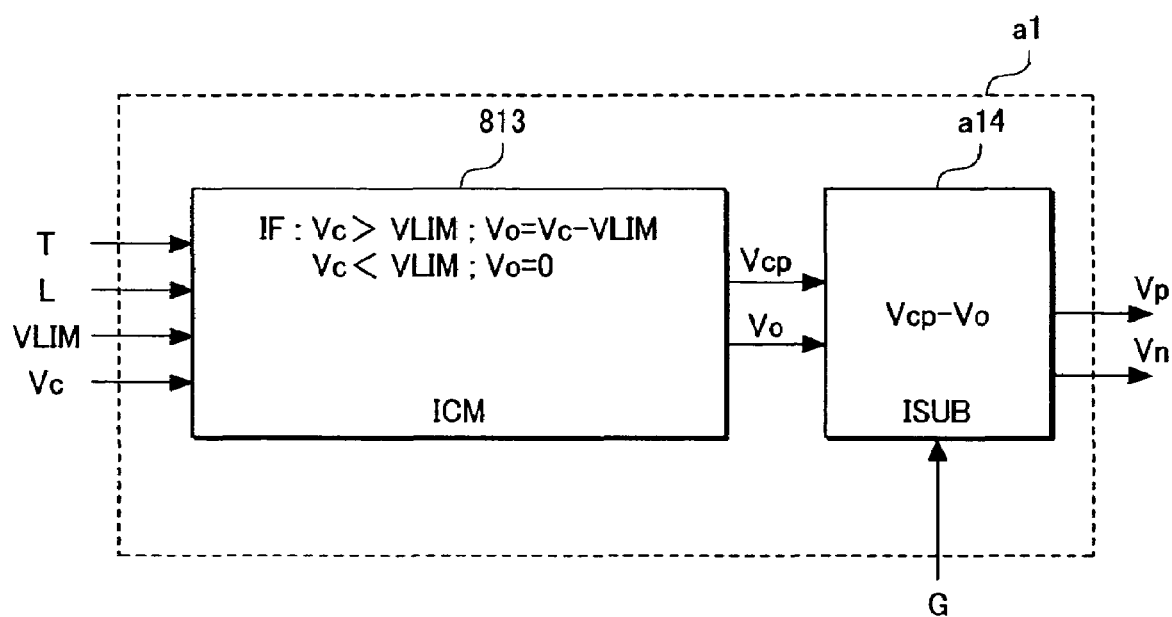
FIG. 37 is a block diagram for explaining a fourth structural example of a voltage-to-current converter circuit that is used in the voltage controlled oscillator shown in FIG. 27.

A modified example of the second embodiment will be described with reference to FIGS. 37 and 38. FIG. 37 shows a fourth structural example of the voltage-to-current converter circuit a1. The fourth voltage-to-current converter circuit a1 includes a current comparator 813 that inputs the control voltage, the trimming signal, the limit signal, and the base voltage to output the conversion voltage and the determination voltage, and a current subtracter a14 that inputs the gain signal, the determination voltage, and the conversion voltage to output the control signal (Vp, Vn).

Figure 38:
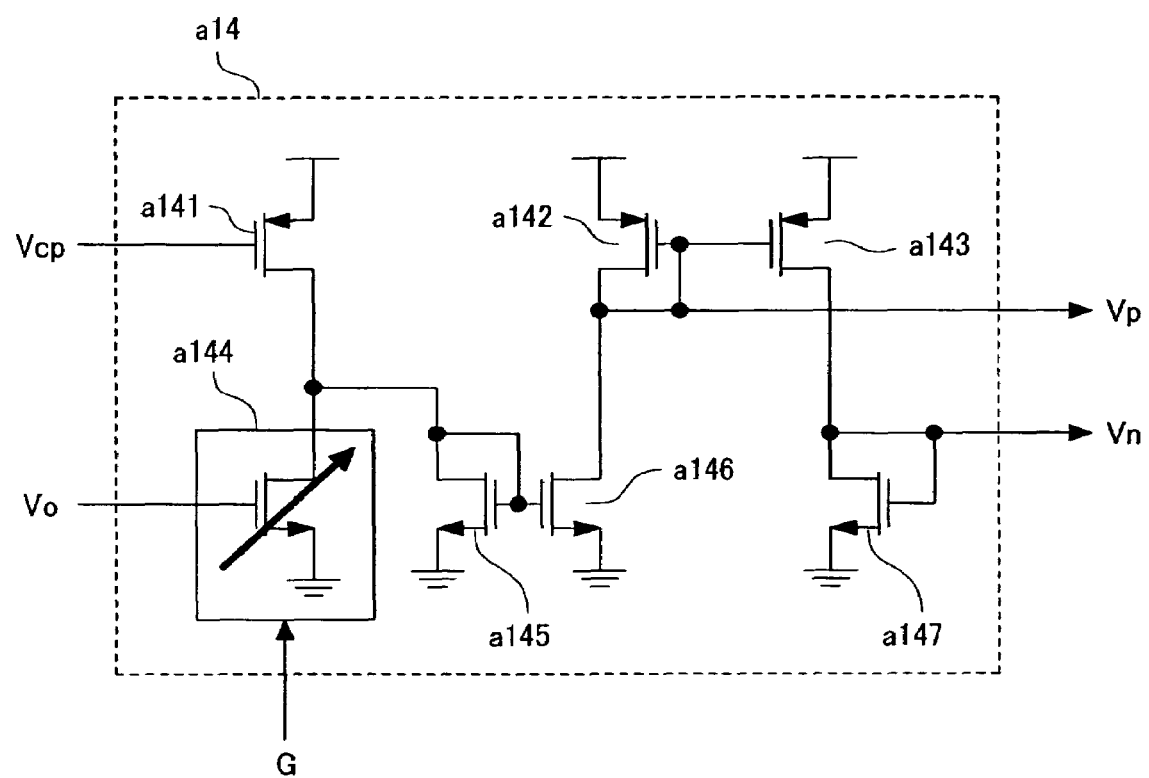
FIG. 38 is a circuit diagram for explaining a structural example of a current subtracter that is used in the voltage-to-current converter circuit shown in FIG. 37.

FIG. 38 shows a circuit diagram of the current subtracter a14. The current subtracter a15 includes a PMOS transistor a143 in order to output the same voltage as the control voltage Vp from the NMOS transistor a147 as the control voltage Vn in the current subtracter a13 shown in FIG. 35. The operation is identical with that of the current subtracter a13.

Tenth Modified Example

Figure 39:
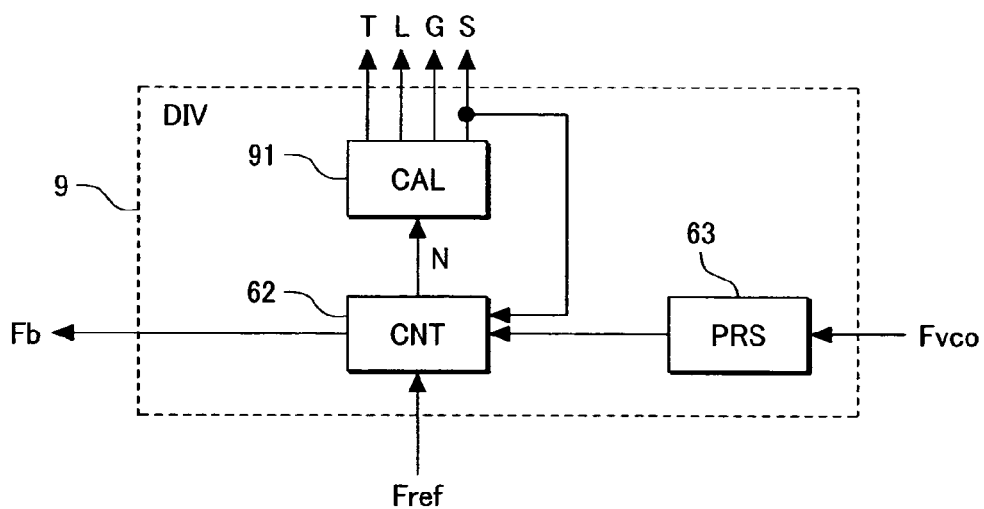
FIG. 39 is a block diagram for explaining a second structural example of a frequency divider that is used in the automatic adjustment phase locked loop circuit shown in FIG. 25.

FIG. 39 shows a second structural example of the frequency divider 9 as a modified example of the second embodiment. The second frequency divider 9 includes a prescaler 63 that inputs the output signal of the VCOa to output the frequency division result, a counter 62 that inputs the frequency division result of the prescaler 63, the reference signal, and the select signal to output the feedback signal and the count result (N), and a calibration circuit 91 that inputs the count result to output the select signal from the count result, the trimming signal, the limit signal, and the gain signal.

The operation of the second frequency divider 6 is identical with that of the first frequency divider 9. The second frequency divider has a structure used in order to input a signal to the counter 62 after the frequency has been lowered by the prescaler 63 that is a high speed frequency divider when the highest operating speed of the counter 62 is lower than the output signal frequency of the VCOa.

Third Embodiment

Subsequently, a description will be given in more detail of a phase locked loop circuit (PLL) according to a third embodiment of the present invention with reference to FIG. 40. This embodiment is characterized in that the frequency division unit (DIV) and the calibration unit (CAL) are disposed as different members.

Figure 40:
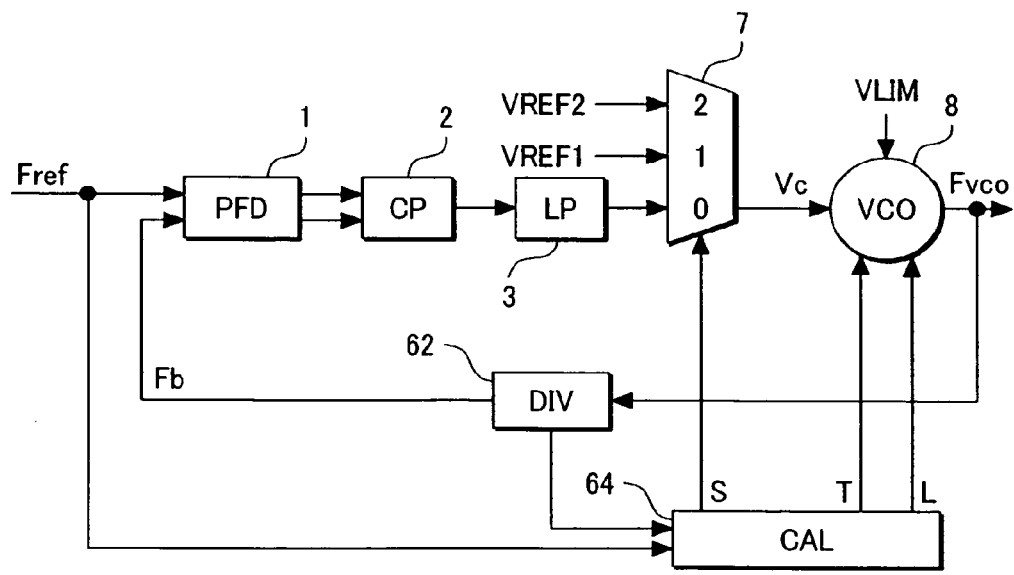
FIG. 40 is a block diagram for explaining an automatic adjustment phase locked loop circuit according to a third embodiment of the present invention.

FIG. 40 is a diagram showing the structure of the PLL according to this embodiment.

The PLL according to this embodiment comprises:

a phase frequency comparator 1 that inputs a reference signal (Fref) and a feedback signal (Fb) to output a phase comparison signal;

a charge pump 2 that inputs the phase comparison signal to output a pulse signal;

a loop filter 3 that converts the pulse signal to a DC signal;

a selector 7 that selects the DC signal, a first reference voltage (VREF1), and a second reference voltage (VREF2) according to a select signal (S) to output a control voltage (Vc);

a voltage controlled oscillator (VCO) 8 that inputs the control voltage, a base voltage (VLIM), a trimming signal (T), and a limit signal (L), and changes the frequency of an output signal (Fvco) according to the control voltage so as to limit the upper limit frequency of the output signal, and so as to change the frequency sensitivity of the output signal that is outputted with respect to the control voltage according to the trimming signal, the upper limit frequency of the output signal according to the limit signal; and a frequency divider (counter), that is, a frequency division unit (DIV) 62 that inputs the output signal and the reference signal, divides the output signal, and outputs the feedback signal and the count result; and a calibration circuit, that is, a calibration unit (CAL) 64 that outputs the select signal, the trimming signal, and the limit signal from the count result.

According to this embodiment, it is possible to mass-produce and inexpensively provide a phase locked loop circuit which automatically adjusts the sensitivity of the frequency and the upper limit frequency of the VCO, and which satisfies a desired characteristic with respect to signals which are in a wide frequency range of from a low frequency to a high frequency even if there occurs a remarkable process variation in a fine process or a variation in the characteristic due to the environmental variation since the VCO sets the upper limit frequency to a value that is lower than the highest operating frequency of the logic circuit.

The operation of the PLL according to this embodiment is identical with that of the PLL shown in the first embodiment.

In particular, in this embodiment, since the calibration circuits 64 are disposed, individually, the frequency divider (counter) 62 that is a higher speed logic unit, and a calibration circuit 64 that is a lower speed logic unit can be formed by separate members within the LSI, it is possible to constitute the PLL flexible from the viewpoint of the layout.

Fourth Embodiment

Figure 41:
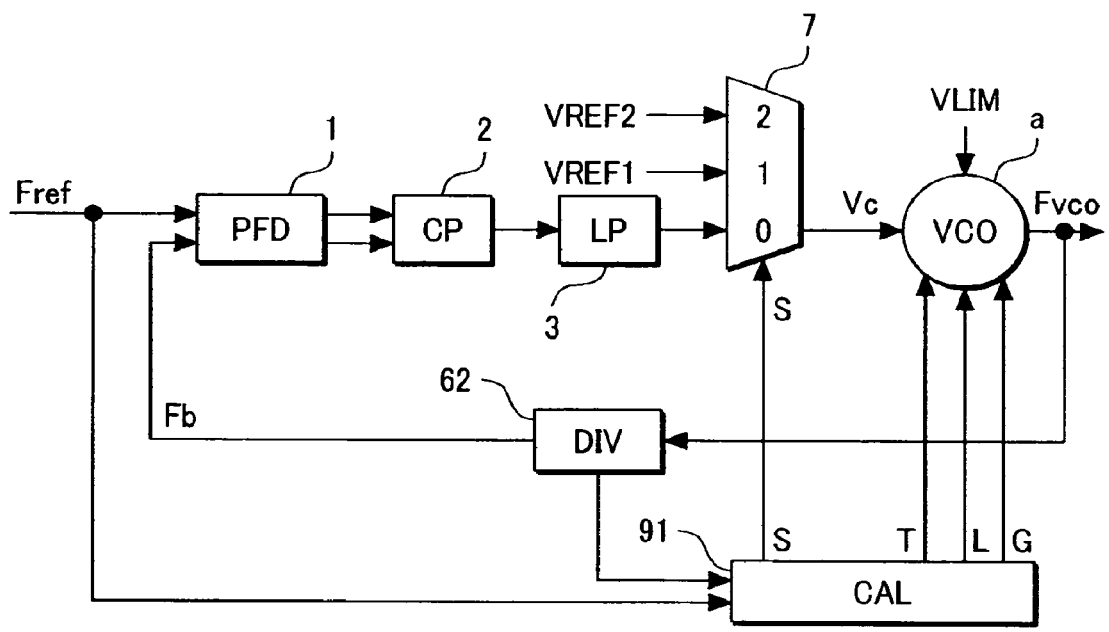
FIG. 41 is a block diagram for explaining an automatic adjustment phase locked loop circuit according to a fourth embodiment of the present invention.

A description will be given in more detail of a phase locked loop circuit (PLL) according to a fourth embodiment of the present invention with reference to FIG. 41. FIG. 41 is a diagram showing the structure of the PLL according to this embodiment.

The PLL according to this embodiment comprises:

a phase frequency comparator 1 that inputs a reference signal (Fref) and a feedback signal (Fb) to output a phase comparison signal;

a charge pump 2 that inputs the phase comparison signal to output a pulse signal;

a loop filter 3 that converts the pulse signal to a DC signal;

a selector 7 that selects the DC signal, a first reference voltage (VREF1), and a second reference voltage (VREF2) according to a select signal (S) to output a control voltage (Vc);

a voltage controlled oscillator (VCO)-a that inputs the control voltage, a base voltage (VLIM), a trimming signal (T), a limit signal (L), and a gain signal (G), and changes the frequency of an output signal (Fvco) according to the control voltage so as to limit the upper limit frequency of the output signal, and so as to change the frequency sensitivity of the output signal that is outputted with respect to the control voltage according to the trimming signal, the upper limit frequency of the output signal according to the limit signal, and the upper limit frequency limit characteristic according to the gain signal; and a frequency divider (counter) 62 that inputs the output signal and the reference signal, divides the output signal, and outputs the feedback signal and the count result; and a calibration circuit 91 that outputs the select signal, the trimming signal, the limit signal, and the gain signal from the count result.

The operation of the PLL according to this embodiment is identical with the PLL shown in the first embodiment.

According to this embodiment, it is possible to inexpensively mass-produce a phase locked loop circuit which automatically adjusts the sensitivity of the frequency and the upper limit frequency of the VCO, and which satisfies a desired characteristic with respect to signals which are in a wide frequency range of from a low frequency to a high frequency even if there occurs a remarkable process variation in a fine process or a variation in the characteristic due to the environmental variation since the VCO sets the upper limit frequency to a value that is lower than the highest operating frequency of the logic circuit.

In particular, in this embodiment, since the calibration circuits 64 are disposed, individually, the frequency divider (counter) 62 that is a higher speed logic unit, and a calibration circuit 61 that is a lower speed logic unit can be formed by separate members within the LSI, it is possible to constitute the PLL flexible from the viewpoint of the layout.

Fifth Embodiment

Figure 42:
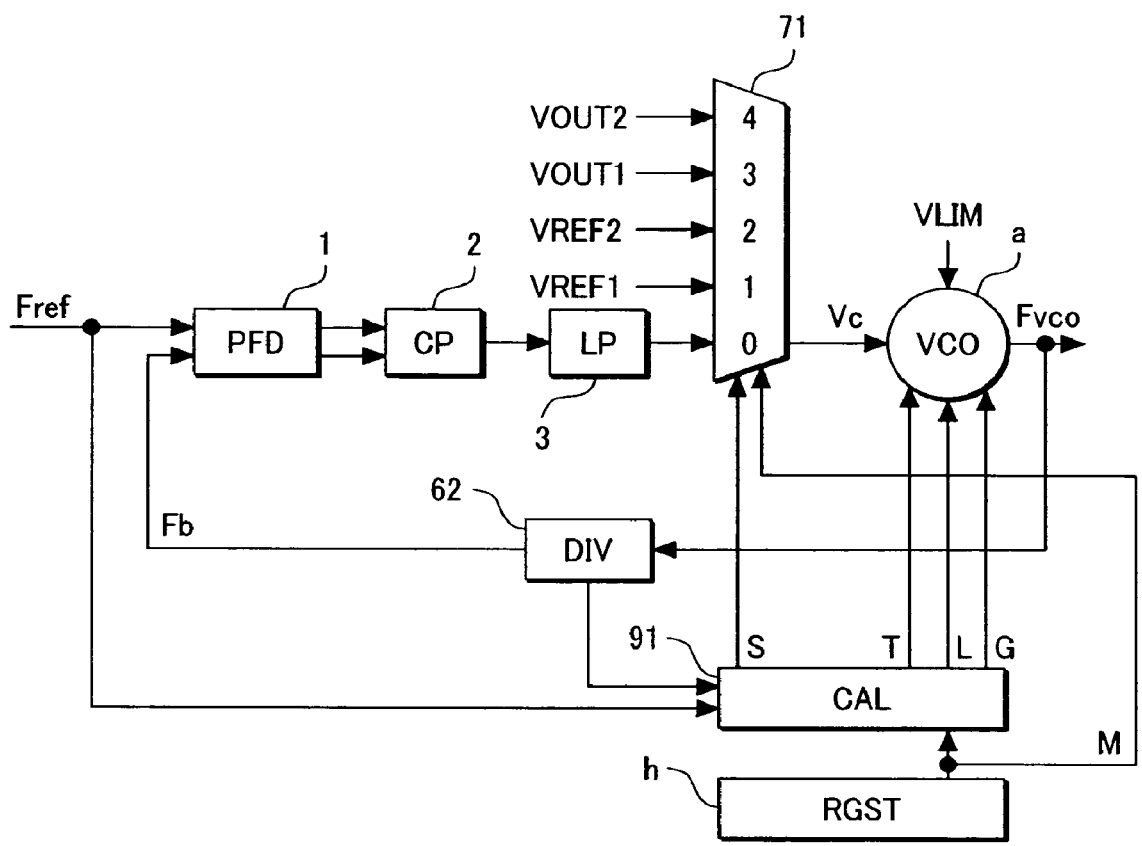
FIG. 42 is a block diagram for explaining an automatic adjustment phase locked loop circuit according to a fifth embodiment of the present invention.

A description will be given in more detail of a phase locked loop circuit (PLL) according to a fifth embodiment of the present invention with reference to FIG. 42. FIG. 42 is a diagram showing the structure of the PLL according to this embodiment.

The PLL according to this embodiment comprises:

a phase frequency comparator 1 that inputs a reference signal (Fref) and a feedback signal (Fb) to output a phase comparison signal;

a charge pump 2 that inputs the phase comparison signal to output a pulse signal;

a loop filter 3 that converts the pulse signal to a DC signal;

a selector 71 that selects the DC signal, a first reference voltage (VREF1), a second reference voltage (VREF2), an external voltage 1, and an external voltage 2 according to a select signal (S) to output a control voltage (Vc);

a voltage controlled oscillator (VCO)-a that inputs the control voltage, a base voltage (VLIM), a trimming signal (T), a limit signal (L), and a gain signal (G), changes the frequency of an output signal (Fvco) according to the control voltage so as to limit the upper limit frequency of the output signal, and so as to change the frequency sensitivity of the output signal that is outputted with respect to the control voltage according to the trimming signal, the upper limit frequency of the output signal according to the limit signal, and the upper limit frequency limit characteristic according to the gain signal; and a frequency divider (DIV) 62 that inputs the output signal and the reference signal, divides the output signal, and outputs the feedback signal and the count result;

a calibration circuit (CAL) 91 that outputs the select signal, the trimming signal, the limit signal, and the gain signal from the count result; and a register (RGST) h that outputs a mode select signal (M) that selects the modes of the manual trimming and the automatic trimming from the external of the LSI to the calibration circuit 91 and the selector 71.

The operation of the PLL according to this embodiment is identical with the PLL shown in the second embodiment.

According to this embodiment, it is possible to inexpensively mass-produce a phase locked loop circuit which automatically adjusts the sensitivity of the frequency and the upper limit frequency of the VCO, and which satisfies a desired characteristic with respect to signals which are in a wide frequency range of from a low frequency to a high frequency even if there occurs a remarkable process variation in a fine process or a variation in the characteristic due to the environmental variation since the VCO sets the upper limit frequency to a value that is lower than the highest operating frequency of the logic circuit.

In particular, this embodiment is characterized in that the mode select signal is inputted from the external, and the manual trimming and the automatic trimming are so selected as to adjust the PLL.

Sixth Embodiment

Subsequently, a description will be given in more detail of a phase locked loop circuit (PLL) according to a sixth embodiment of the present invention with reference to FIG. 43.

Figure 43:
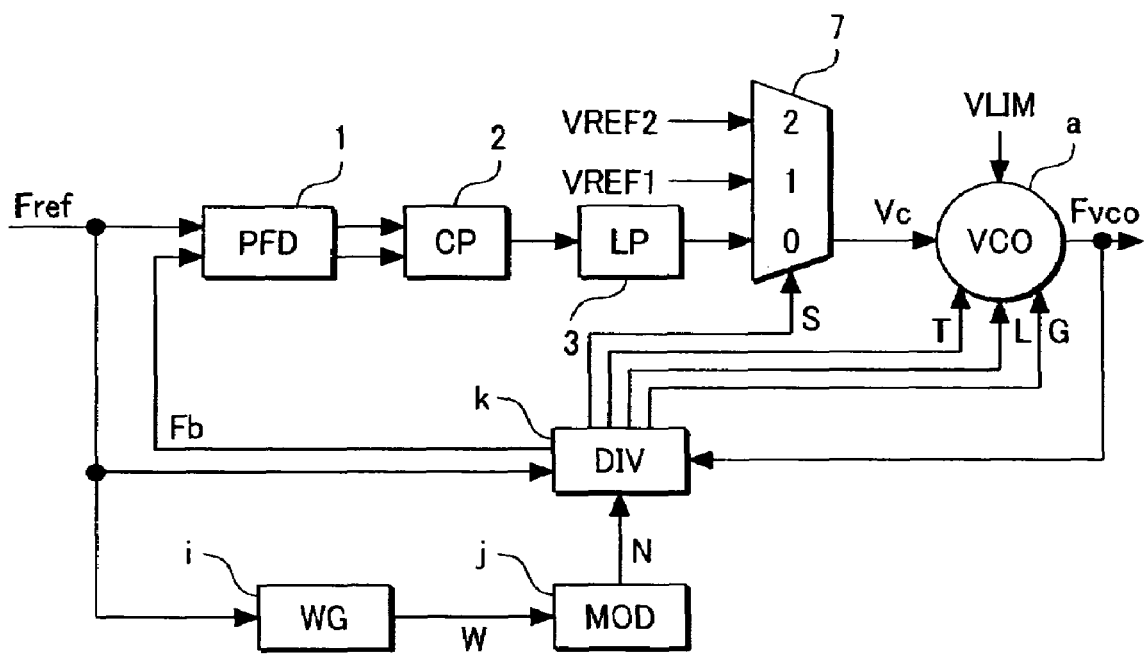
FIG. 43 is a block diagram for explaining an automatic adjustment phase locked loop circuit according to a sixth embodiment of the present invention.

FIG. 43 is a diagram showing the structure of the PLL according to this embodiment.

The PLL according to this embodiment comprises:

a phase frequency comparator 1 that inputs a reference signal (Fref) and a feedback signal (Fb) to output a phase comparison signal;

a charge pump 2 that inputs the phase comparison signal to output a pulse signal;

a loop filter 3 that converts the pulse signal to a DC signal;

a selector 7 that selects the DC signal, a first reference voltage (VREF1), and a second reference voltage (VREF2) according to a select signal (S) to output a control voltage (Vc);

a voltage controlled oscillator (VCO)-a that inputs the control voltage, a base voltage (VLIM), a trimming signal (T), a limit signal (L), and a gain signal (G), changes the frequency of an output signal (Fvco) according to the control voltage so as to limit the upper limit frequency of the output signal, and so as to change the frequency sensitivity of the output signal that is outputted with respect to the control voltage according to the trimming signal, the upper limit frequency of the output signal according to the limit signal, and the upper limit frequency limit characteristic according to the gain signal; and a frequency divider (DIV) k that inputs the output signal, the reference signal, and the number of frequency divisions (N), divides the output signal according to the inputted number of frequency divisions, outputs the feedback signal, and outputs the select signal, the trimming signal, the limit signal, and the gain signal from the output signal;

a waveform generating unit (WC) i that inputs the reference signal to output the frequency division number modulation signal (W); and a modulator (MOD) j that inputs the frequency division modulation signal (W) to output the frequency division number modulation signal (W) to the frequency divider k as the number of frequency divisions (N) that is a modulation signal.

The automatic trimming operation according to this embodiment is identical with the PLL shown in the second embodiment, and therefore its description will be omitted. According to this embodiment, it is possible to inexpensively mass-produce a phase locked loop circuit which automatically adjusts the sensitivity of the frequency and the upper limit frequency of the VCO, and which satisfies a desired characteristic with respect to signals which are in a wide frequency range of from a low frequency to a high frequency even if there occurs a remarkable process variation in a fine process or a variation in the characteristic due to the environmental variation since the VCO sets the upper limit frequency to a value that is lower than the highest operating frequency of the logic circuit.

In particular, this embodiment is characterized in that the waveform generating unit i, the modulator j, and the frequency divider k are disposed, thereby making it possible to realize the fractional PLL or the spectrum diffusion PLL.

Seventh Embodiment

Figure 44:
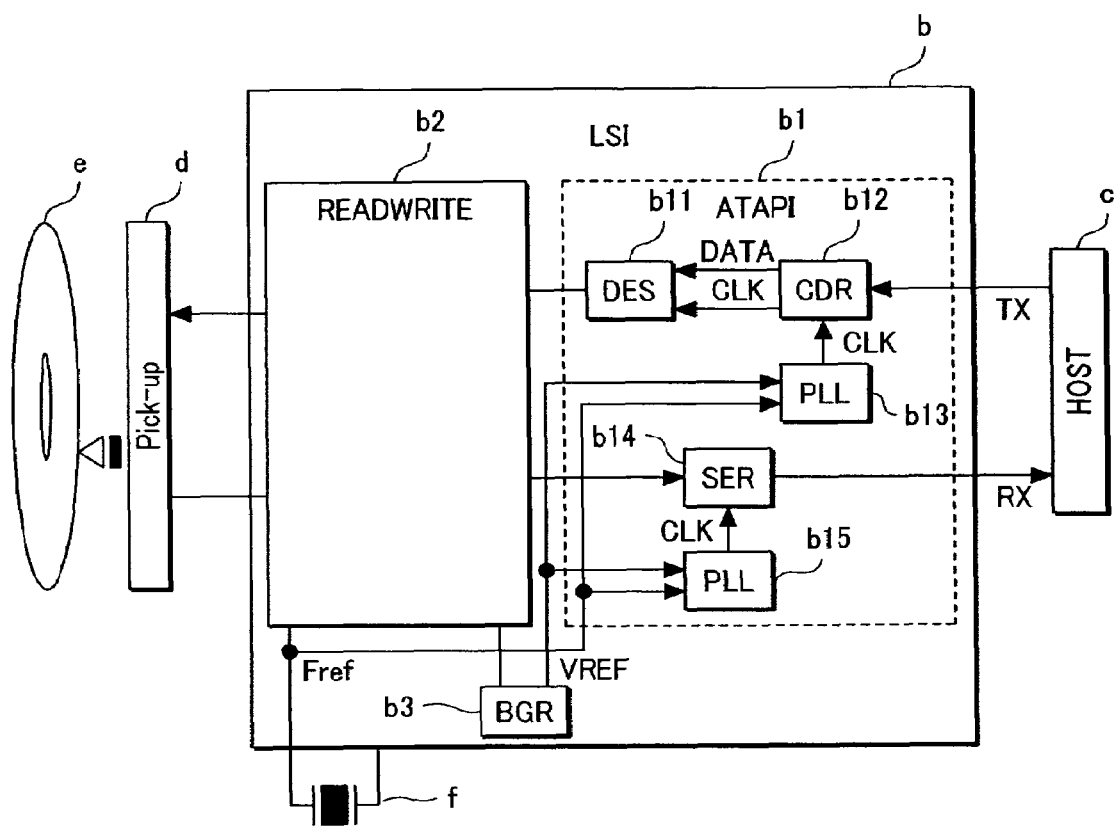
FIG. 44 is a block diagram for explaining an interface device using the automatic adjustment phase locked loop circuit according to an embodiment of the present invention.

FIG. 44 shows an interface device according to a seventh embodiment of the present invention. In this embodiment, the phase locked loop circuit shown in the first to sixth embodiments is used for the interface device. In other words, in this embodiment, the clock signal that is supplied to the serial to parallel conversion device is generated by using the phase locked loop circuit.

In general, as an interface for connecting a storage media such as an optical disk device or a hard disk device to a computer such as a personal computer, there is an ATA (advanced technology attachment) of the standards. With the use of the ATA, the diverse storage media are connected to the computer according to the same command or control software. In this embodiment, the optical disk device is applied as the storage media, and the optical disk device is connected to a host computer through the ATA (ATAPI).

In FIG. 44 the optical disk device, comprises:

an optical disk e;

an optical pickup d that irradiates the optical disk e with an optical beam to read and write data;

a signal processing device (READWRITE) b2 that processes write data and read data with respect to the optical pickup d;

an ATA interface device (ATAPI) b1 for inputting and outputting the data of the signal processing device b2 to a host computer (HOST) c;

a base voltage generator (BGR) b3 that applies a base voltage; and a crystal oscillator f that supplies a reference signal.

The signal processing unit b2 and the ATA interface device b1 can be structured by a semiconductor integrated circuit device, respectively.

Hereinafter, the ATA interface device b1 will be described.

A serializer b14 inputs transmit data from a signal processing device b2 and a clock (CLK) from a second PLL (b15) to output a transmit signal (RX) to a host computer c.

A clock data recovery (CDR) b1 that has received the transmit signal (TX) of the host computer c inputs the clock (CLK) from a first PLL (b13), generates reproduced data (DATA) and reproduced clock (CLK), and outputs the reproduced data and the reproduced clock to a deserializer (DES) b11. The deserializer b11 generates receive data from the reproduced data (DATA) and the reproduced clock (CLK), and outputs the generated received data to the signal processing device b2.

In this example, the first and second PLLs (b13) and (b15) can be formed of the PLL shown in the first to sixth embodiments. A reference signal is inputted from a crystal oscillator f, and a first reference voltage and a base voltage are applied from a base voltage generator b3. A second reference voltage may be applied from the base voltage generator b3, but it is optimum that a supply voltage is used for the second reference voltage.

According to this embodiment, even if there occurs a remarkable process variation in a fine process or a variation in the characteristic due to the environmental variation, the PLL within the interface device always sets the upper limit frequency to L through the calibration. This prevents an event from occurring, in which the PLL is not locked because the frequency divider does not operate properly.

Figure 45:
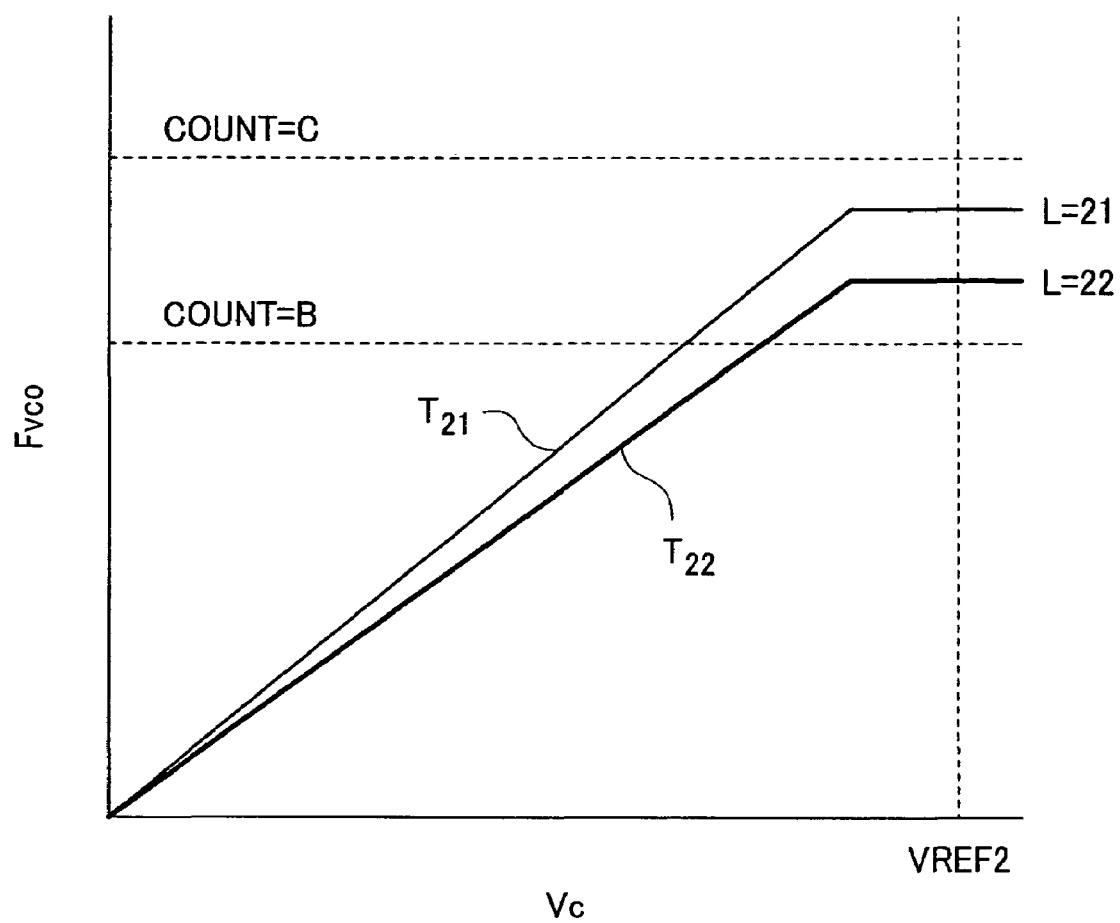
FIG. 45 is a diagram for explaining a method of trimming the voltage controlled oscillator according to a limit signal in the interface device shown in FIG. 44.

Also, both of the sensitivity of the frequency characteristic and the upper limit frequency of the first and second PLLs can be set, individually. For that reason, for example, as shown in FIG. 45, there can be provided an interface device that satisfies a desired characteristic with respect to a signal that is in a wide frequency range of from a lower frequency to a high frequency by setting given upper limit frequencies L21 and L22 with respect to the sensitivity of the frequency characteristics after the sensitivities T21 and T22 of the frequency characteristics are set considering the noises and the lockup time with respect to the first and second PLLs, individually.

As described above, according to this embodiment, it is possible to mass-produce and inexpensively provide an interface device which satisfies a desired characteristic with respect to signals which are in a wide frequency range of from a low frequency to a high frequency even if there occurs a remarkable process variation in a fine process or a variation in the characteristic due to the environmental variation.

In this embodiment, the optical disk device is disposed at the media side whereas the host computer is disposed at the host side. However, the present invention is not limited to the above combination. For example, the present invention is applicable to the combination in which the general storage media such as a hard disk device is disposed at the media side whereas a network server or a DVD (digital versatile disk) recorder is disposed at the media side.

Eighth Embodiment

Figure 46:
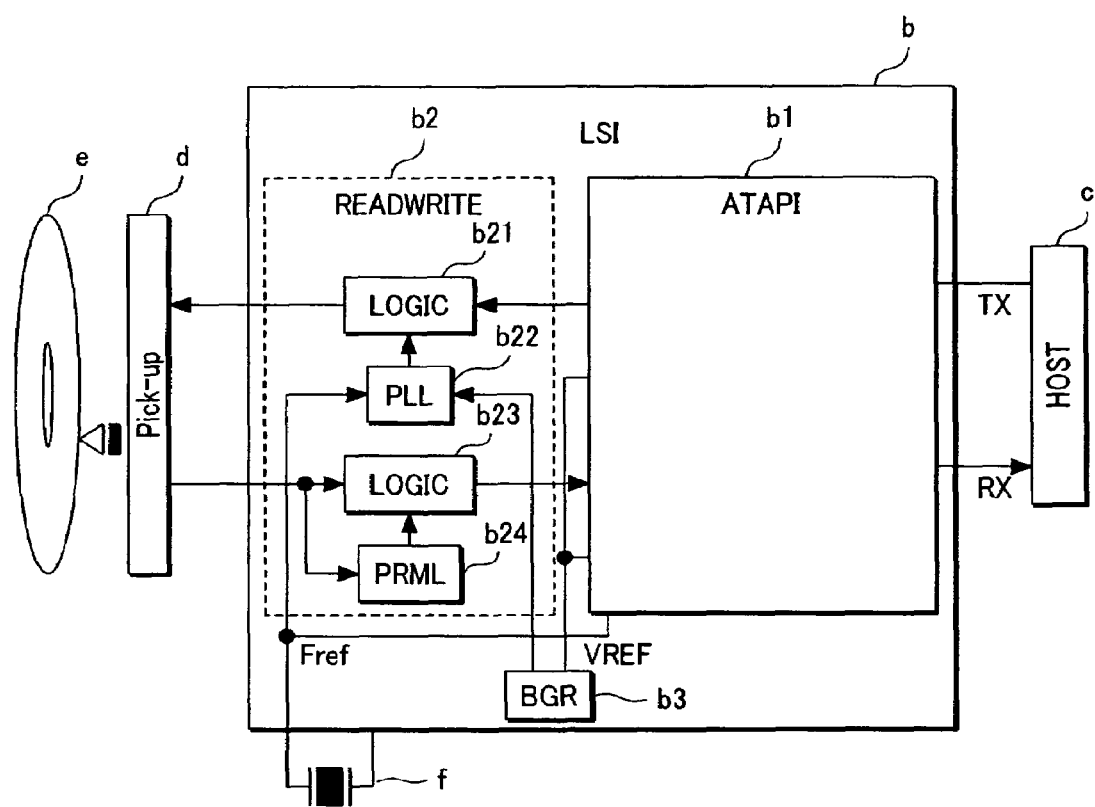
FIG. 46 is a block diagram for explaining a recording and reproduction device using the automatic adjustment phase locked loop circuit according to the present invention.

FIG. 46 shows a structural example of a recording and reproduction device according to an eighth embodiment of the present invention. In this embodiment, the phase locked loop circuit according to any one of the first to sixth embodiments is used for the recording and reproduction device. The recording and reproduction device according to this embodiment generates the clock signal that is supplied to the logic circuit by using the phase locked loop circuit according to any one of the first to sixth embodiments.

In general, as an interface for connecting a storage media such as an optical disk device or a hard disk device to a computer such as a personal computer, there is an ATA (advanced technology attachment) of the standards. With the use of the ATA, the diverse storage media are connected to the computer on the basis of the same command or control software. In this embodiment, the optical disk device is applied as the storage media, and the optical disk device is connected to a host computer through the ATA (ATAPI).

Referring to FIG. 46, the optical disk device is made up of an optical disk e, an optical pickup d that irradiates the optical disk e with an optical beam to read or write the data, a write logic circuit (LOGIC) b21 that processes the write data to the optical pickup d, a PLLb 22 that determines the write double speed, a write logic circuit (LOGIC) b23 that processes the read data, a signal processing circuit (PRML) that determines the read double speed, and an ATA interface device b1 for inputting and outputting the data of the signal processing device b2 with respect to the host computer (HOST) b1. The signal processing device b2 and the ATA interface device b1 can be structured by a semiconductor integrated circuit device, respectively.

Hereinafter, the signal processing device b2 will be described.

A signal that has been inputted from the interface device b1 is processed by the write logic circuit b21, and then outputted to the optical pickup d. In this situation, the PLL 22 generates the processing clock of the write logic circuit.

On the other hand, the read logic circuit that has inputted the read data that has been outputted from the optical pickup processes the signal to output the signal to the interface device b1. In this situation, the signal processing circuit b24 generates the processing clock of the read logic circuit.

In this example, the PLLb 22 can be formed of the PLL shown in any one of the first to sixth embodiments. The reference signal is inputted from the crystal oscillator f, and the first reference voltage and the base voltage are applied from the base voltage generator b3. The second reference voltage may be applied from the base voltage generator b3, but it is optimum that a supply voltage is used for the second reference voltage.

According to this embodiment, even if there occurs a remarkable process variation in a fine process or a variation in the characteristic due to the environmental variation, the PLL within the interface device always sets the upper limit frequency to L through the calibration. This prevents an event from occurring, in which the PLL is not locked because the frequency divider does not operate properly.

Also, the sensitivity of the frequency characteristic and the upper limit frequency of the PLL can be set, individually. For that reason, for example, there can be provided a recording and reproduction device that satisfies a desired characteristic with respect to a signal that is in a wide frequency range of from a lower frequency to a high frequency by setting a given upper limit frequency with respect to the sensitivity of the frequency characteristics after the sensitivity of the frequency characteristic is set taking the noise and the lockup time of the PLL into account.

As described above, according to this embodiment, it is possible to mass-produce and inexpensively provide a recording and reproduction device which automatically adjusts the sensitivity of the frequency and the upper limit frequency of the VCO of the PLL, and which satisfies a desired characteristic with respect to signals which are in a wide frequency range of from a low frequency to a high frequency even if there occurs a remarkable process variation in a fine process or a variation in the characteristic due to the environmental variation since the VCO sets the upper limit frequency to a value that is lower than the highest operating frequency of the logic circuit.

In this embodiment, the optical disk device is disposed at the media side whereas the host computer is disposed at the host side. However, the present invention is not limited to the above combination. For example, the present invention is applicable to the combination in which the general storage media such as a hard disk device is disposed at the media side whereas a network server or a DVD (Digital Versatile Disk) recorder is disposed at the media side.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A phase locked loop circuit comprising:
    a phase frequency comparator;
    a charge pump;
    a loop filter;
    a selector;
    a voltage controlled oscillator;
    a frequency divider; and
    an adjustment unit,
    wherein the phase frequency comparator compares a reference signal with a feedback signal that is outputted from the frequency divider to output a phase difference signal, and inputs the phase difference signal to the voltage controlled oscillator through the charge pump, the loop filter, and the selector as a control voltage to control a frequency and a phase of an output signal from the voltage controlled oscillator to given values,
    wherein the voltage controlled oscillator is capable of setting a frequency sensitivity of the output signal and an upper limit frequency of the output signal with respect to the control voltage to arbitrary values, and
    wherein the adjustment unit is capable of adjusting the frequency sensitivity and the upper limit frequency of the output signal of the voltage controlled oscillator according to an adjustment signal,
    wherein the selector is capable of selecting the control voltage, a first reference voltage, and a second reference voltage according to a select signal, and outputting the control voltage,
    wherein the voltage controlled oscillator is capable of inputting the control voltage, a base voltage, a trimming signal, a limit signal, and a gain signal, changing the frequency of the output signal according to the control voltage, limiting the upper limit frequency of the output signal, and changing the frequency sensitivity of the output signal that is outputted with respect to the control voltage according to the trimming signal, the upper limit frequency of the output signal according to the limit signal, and the upper limit frequency limit characteristic according to the gain signal, respectively, and
    wherein the frequency divider is integrated with the adjustment unit, has a controller that automatically adjusts the frequency sensitivity of the voltage controlled oscillator, the upper limit frequency of the output signal, and the upper limit frequency limit characteristic so as to satisfy a desired characteristic before the frequency and the phase of the output signal start the control, inputting the output signal and the reference signal, dividing the output signal, outputting the feedback signal, and outputting the select signal, the trimming signal, the limit signal, and the gain signal from the output signal.

2. The phase locked loop circuit according to claim 1,
    wherein the frequency divider is integrated with the adjustment unit,
    wherein the frequency divider is capable of inputting the output signal and the reference signal, dividing the output signal by a given number of frequency division, and outputting the feedback signal, and
    wherein the frequency divider comprises:
    a counter that counts the output signals for a given period of time to output a count result; and
    a calibration circuit that determines the count result that is outputted from the counter to output the select signal, the trimming signal, the limit signal, and the gain signal.

3. The phase locked loop circuit according to claim 1,
    wherein the voltage controlled oscillator comprises:
    a voltage-to-current converter that inputs the control voltage, the base voltage, the trimming signal, the limit signal, and the gain signal, and allows the output control signal to change according to the trimming signal, the limit signal, and the gain signal; and
    a current controlled oscillator that controls the frequency of the output signal according to the control signal.

4. The phase locked loop circuit according to claim 3,
    wherein the voltage-to-current converter circuit comprises:
    a current comparator that inputs the control voltage, the base voltage, the trimming signal, the limit signal, and the gain signal, compares the control voltage with the base voltage, and outputs a determination voltage; and
    a current subtracter that inputs the determination voltage, the control voltage, and the trimming signal, and outputs a subtraction result of the control voltage and the determination voltage as the control signal.

5. The phase locked loop circuit according to claim 3,
    wherein the voltage-to-current converter circuit comprises:
    a current comparator that inputs the control voltage, the base voltage, the trimming signal, the limit signal, and the gain signal, compares a conversion voltage obtained by converting the control voltage with the base voltage, and outputs a determination voltage; and
    a current subtracter that inputs the conversion voltage and the determination voltage, and outputs a subtraction result of the conversion voltage and the determination voltage as the control signal.

* * * * *